US012713584B2

(12) United States Patent
Lee et al.

(10) Patent No.: US 12,713,584 B2
(45) Date of Patent: Aug. 18, 2026

(54) SEMICONDUCTOR MEMORY DEVICE AND METHOD FOR FABRICATING THE SAME

(71) Applicant: SAMSUNG ELECTRONICS CO., LTD., Suwon-si (KR)

(72) Inventors: Ki Seok Lee, Seoul (KR); Keun Nam Kim, Seoul (KR); Seok Han Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 700 days.

(21) Appl. No.: 18/101,613

(22) Filed: Jan. 26, 2023

(65) Prior Publication Data

US 2023/0371243 A1 Nov. 16, 2023

(30) Foreign Application Priority Data

May 13, 2022 (KR) ........................ 10-2022-0058801

(51) Int. Cl.
*H10B 12/00* (2023.01)

(52) U.S. Cl.
CPC ........... *H10B 12/482* (2023.02); *H10B 12/05* (2023.02); *H10B 12/315* (2023.02); *H10B 12/488* (2023.02); *H10B 12/50* (2023.02)

(58) Field of Classification Search
CPC .... H10D 30/6728; H10B 12/30; H10B 12/02; H10B 12/482; H10B 12/05; H10B 12/315; H10B 12/488; H10B 12/50; H10B 12/09; G11C 8/14; G11C 11/4097
See application file for complete search history.

(56) References Cited

U.S. PATENT DOCUMENTS 11,171,140 B2 11/2021 Sukekawa
2014/0021428 A1 1/2014 Kakagawa et al.
2021/0343717 A1 11/2021 Inaba
(Continued)

FOREIGN PATENT DOCUMENTS

EP 3975258 A1 3/2022
EP 4138133 A1 2/2023
(Continued)

OTHER PUBLICATIONS

European Search Report issued Sep. 28, 2023 for corresponding European Patent Application EP 23 160 193.1.
(Continued)

*Primary Examiner* — Marlon T Fletcher
*Assistant Examiner* — Samuel Jonathan Smith
(74) *Attorney, Agent, or Firm* — Muir Patent Law, PLLC

(57) ABSTRACT

A semiconductor memory device includes a peripheral gate structure disposed on a substrate, a bit line disposed on the peripheral gate structure and extending in a first direction, a shielding structure disposed adjacent to the bit line on the peripheral gate structure and extending in the first direction, a first word line disposed on the bit line and the shielding structure and extending in a second direction, a second word line disposed on the bit line and the shielding structure, extending in the second direction, and spaced apart from the first word line in the first direction, first and second active patterns disposed on the bit line and disposed between the first and second word lines, and contact patterns connected to the first and second active patterns.

20 Claims, 103 Drawing Sheets

(56) References Cited

U.S. PATENT DOCUMENTS

| | | | | |
|---|---|---|---|---|
| 2021/0351087 A1 | 11/2021 | Yang et al. | | |
| 2022/0059694 A1* | 2/2022 | Luo | | H10B 12/315 |
| 2022/0102352 A1* | 3/2022 | Lee | | H10B 12/315 |

FOREIGN PATENT DOCUMENTS

| | | |
|---|---|---|
| KR | 10-2006-0114991 A | 11/2006 |
| KR | 10-2009-0124628 A | 12/2009 |
| KR | 10-2009-0126077 A | 12/2009 |
| KR | 10-2014-0046698 A | 4/2014 |
| KR | 10-2021-0012710 A | 2/2021 |
| KR | 10-2022-0043981 A | 4/2022 |

OTHER PUBLICATIONS

First Office Action issued Oct. 10, 2023 for corresponding European Patent Application EP 23 160 193.1.

* cited by examiner

BL SL BL SL BL SL BL SL BL

B A

GOX
WL1
113
AP1
AP2
113
WL2
GOX
GOX
WL1
113
AP1
113
WL2
GOX

D D
C C
B A

BL SL BL SL BL SL BL SL BL
BG
A B
WL2
GOX
WL1
AP1
115
D D
BG
AP2
WL2
GOX
GOX
C C
WL1
AP1
115
BG
AP2
WL2
GOX
A B
WL1
BG

SEMICONDUCTOR MEMORY DEVICE AND METHOD FOR FABRICATING THE SAME

CROSS-REFERENCE TO RELATED APPLICATION

This application claims priority from Korean Patent Application No. 10-2022-0058801, filed on May 13, 2022, in the Korean Intellectual Property Office, and all the benefits accruing therefrom under 35 U.S.C. 119, the contents of which in its entirety are herein incorporated by reference.

BACKGROUND

1. Field

The present disclosure relates to a semiconductor memory device and a method for fabricating the same, and more particularly, to a semiconductor memory device including a vertical channel transistor (VCT), and a method for fabricating the same.

2. Description of the Related Art

In order to meet high performance and a low price demanded by consumers, it has been required to increase a degree of integration of semiconductor memory devices. Since the degree of integration of the semiconductor memory device is an important factor in determining a price of a product, the semiconductor memory device is particularly required to have an increased degree of integration.

In a case of a two-dimensional or planar semiconductor memory device, a degree of integration of the semiconductor memory device is mainly determined by an area occupied by a unit memory cell, and thus, is greatly affected by a level of a fine pattern forming technology. However, since ultra-expensive equipment is required in order to make patterns fine, the degree of integration of the two-dimensional semiconductor memory device has increased, but is still restrictive. Accordingly, semiconductor memory devices including a vertical channel transistor in which a channel extends in a vertical direction have been proposed.

SUMMARY

According to an aspect of the present disclosure, there is provided a semiconductor memory device including a peripheral gate structure disposed on a substrate, a bit line disposed on the peripheral gate structure and extending in a first direction, a shielding structure disposed adjacent to the bit line on the peripheral gate structure and extending in the first direction, a first word line disposed on the bit line and the shielding structure and extending in a second direction, a second word line disposed on the bit line and the shielding structure, extending in the second direction, and spaced apart from the first word line in the first direction, first and second active patterns disposed on the bit line and disposed between the first and second word lines, and contact patterns connected to the first and second active patterns.

According to another aspect of the present disclosure, there is provided a semiconductor memory device including a peripheral gate structure disposed on a substrate, a bit line disposed on the peripheral gate structure and extending in a first direction, a shielding conductive pattern disposed adjacent to the bit line on the peripheral gate structure and extending in the first direction, an active pattern disposed on the bit line and including first and second sidewalls opposite to each other in the first direction and first and second surfaces opposite to each other in a vertical direction, the first surface of the active pattern being connected to the bit line, a word line disposed on the first sidewall of the active pattern and extending in a second direction, and a contact pattern disposed on the active pattern and connected to the second surface of the active pattern, wherein the bit line includes a long sidewall extending in the first direction and a short sidewall extending in the second direction, the shielding conductive pattern includes an extension portion extending along the long sidewall of the bit line and a connection portion extending along the short sidewall of the bit line, and in at least a portion of the connection portion of the shielding conductive pattern, a width of the shielding conductive pattern in the first direction increases as the shielding conductive pattern becomes distant from the substrate.

According to still another aspect of the present disclosure, there is provided a semiconductor memory device including a peripheral gate structure disposed on a substrate, bit lines disposed on the peripheral gate structure and extending in a first direction, a shielding conductive pattern disposed between the bit lines adjacent to each other in a second direction on the peripheral gate structure, first and second active patterns alternately disposed along the first direction on the bit line, back gate electrodes disposed on the bit line and the shielding conductive pattern and extending in the second direction between the first and second active patterns adjacent to each other, first word lines disposed adjacent to the first active patterns, respectively, and extending in the second direction, second word lines disposed adjacent to the second active patterns, respectively, and extending in the second direction, contact patterns connected to the first and second active patterns, respectively, and data storage patterns connected to the contact patterns, respectively, wherein the substrate includes a cell array region and a peripheral circuit region, and a portion of the peripheral gate structure is disposed on the cell array region of the substrate.

According to still another aspect of the present disclosure, there is provided a method for fabricating a semiconductor memory device including providing a first substrate including a semiconductor substrate, a buried insulating layer, and an active layer, forming a back gate electrode in the active layer, the back gate electrode extending in a first direction, forming first and second active patterns on the buried insulating layer on both sides of the back gate electrode by patterning the active layer, forming first and second word lines on the buried insulating layer on both sides of the back gate electrode, the first active pattern being disposed between the first word line and the back gate electrode and the second active pattern being disposed between the second word line and the back gate electrode, forming bit lines on the first and second active patterns, the bit lines extending in a second direction across the first and second word lines, forming a peripheral gate structure on a second substrate, bonding the first substrate and the second substrate to each other so that the bit lines and the peripheral gate structure face each other, exposing the first and second active patterns by removing the semiconductor substrate and the buried insulating layer of the first substrate, and forming contact patterns on the first and second active patterns.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
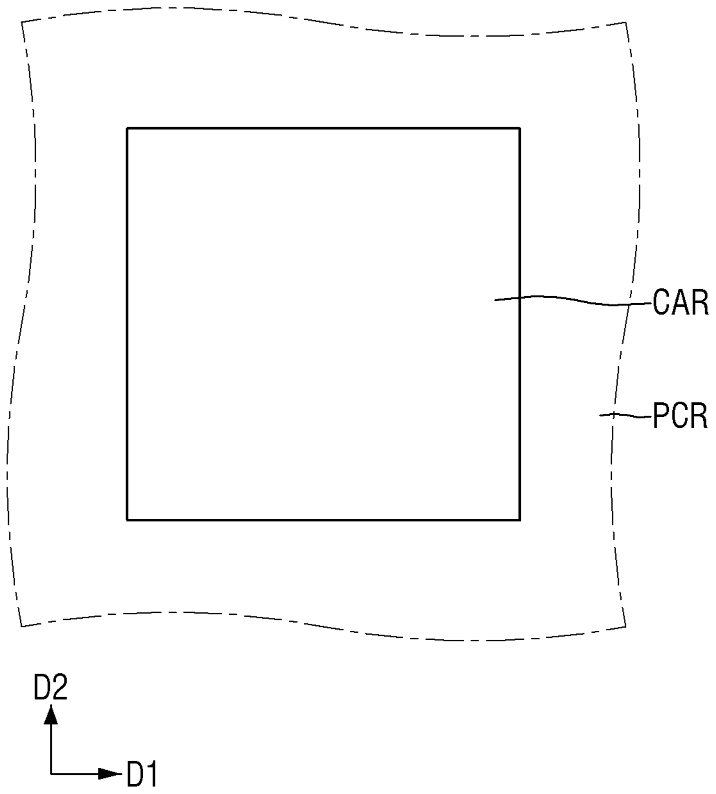
FIG. 1 is a schematic layout diagram of a semiconductor memory device according to some example embodiments.
Figure 2:
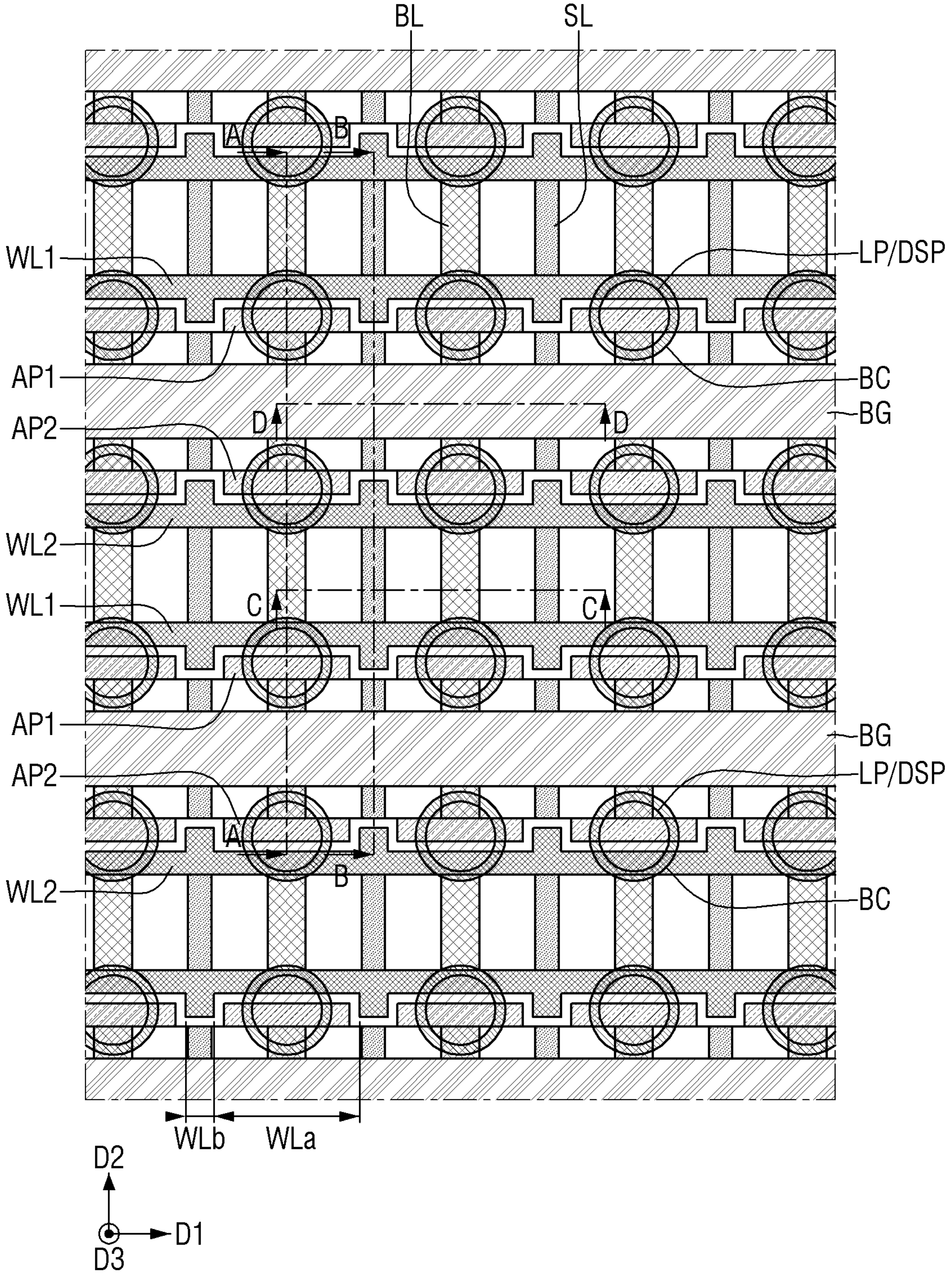
FIG. 2 is a plan view of a cell array region of FIG. 1.
Figure 3:
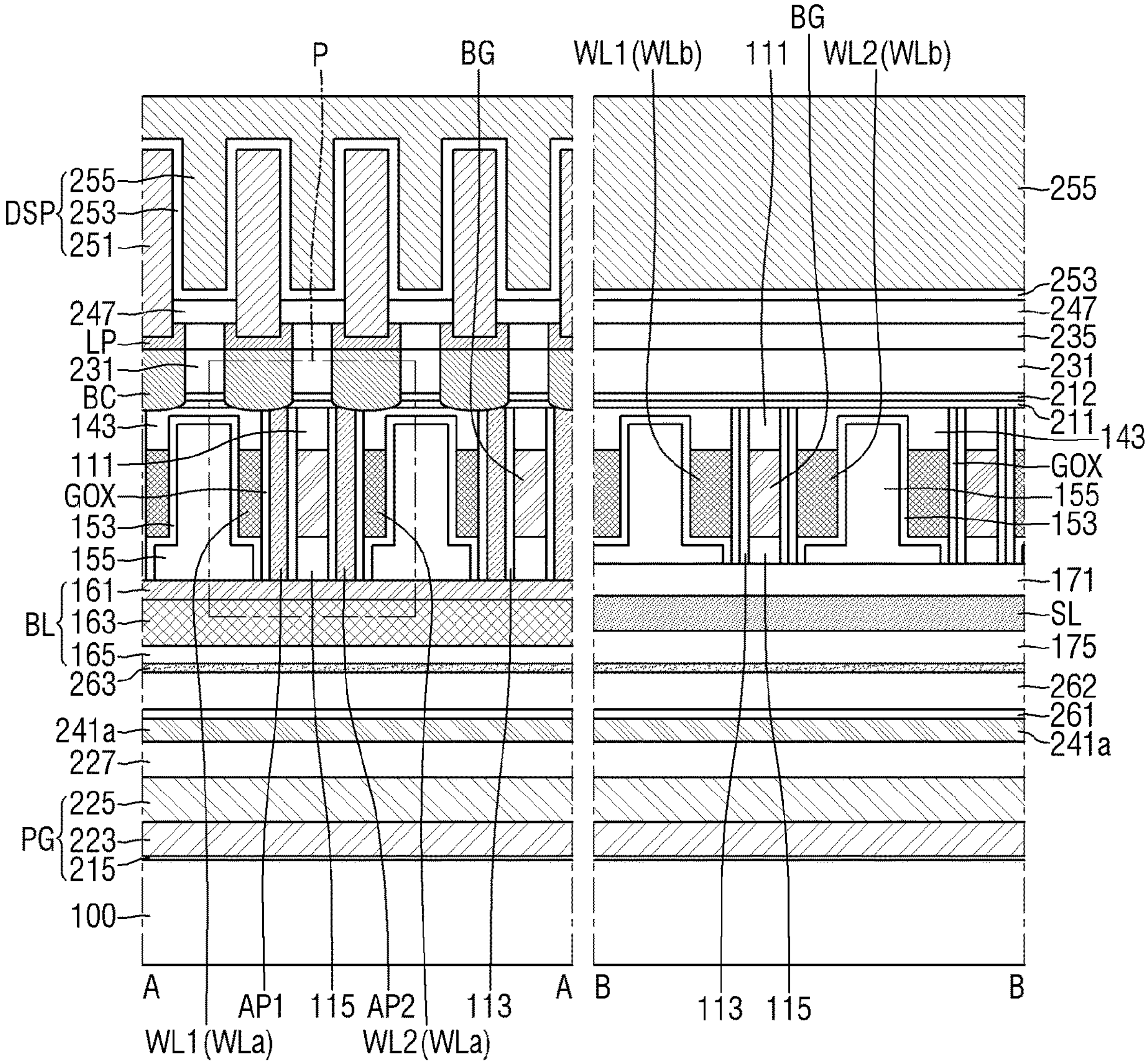
FIG. 3 is a cross-sectional view taken along line A-A and line B-B of FIG. 2.
Figure 4:
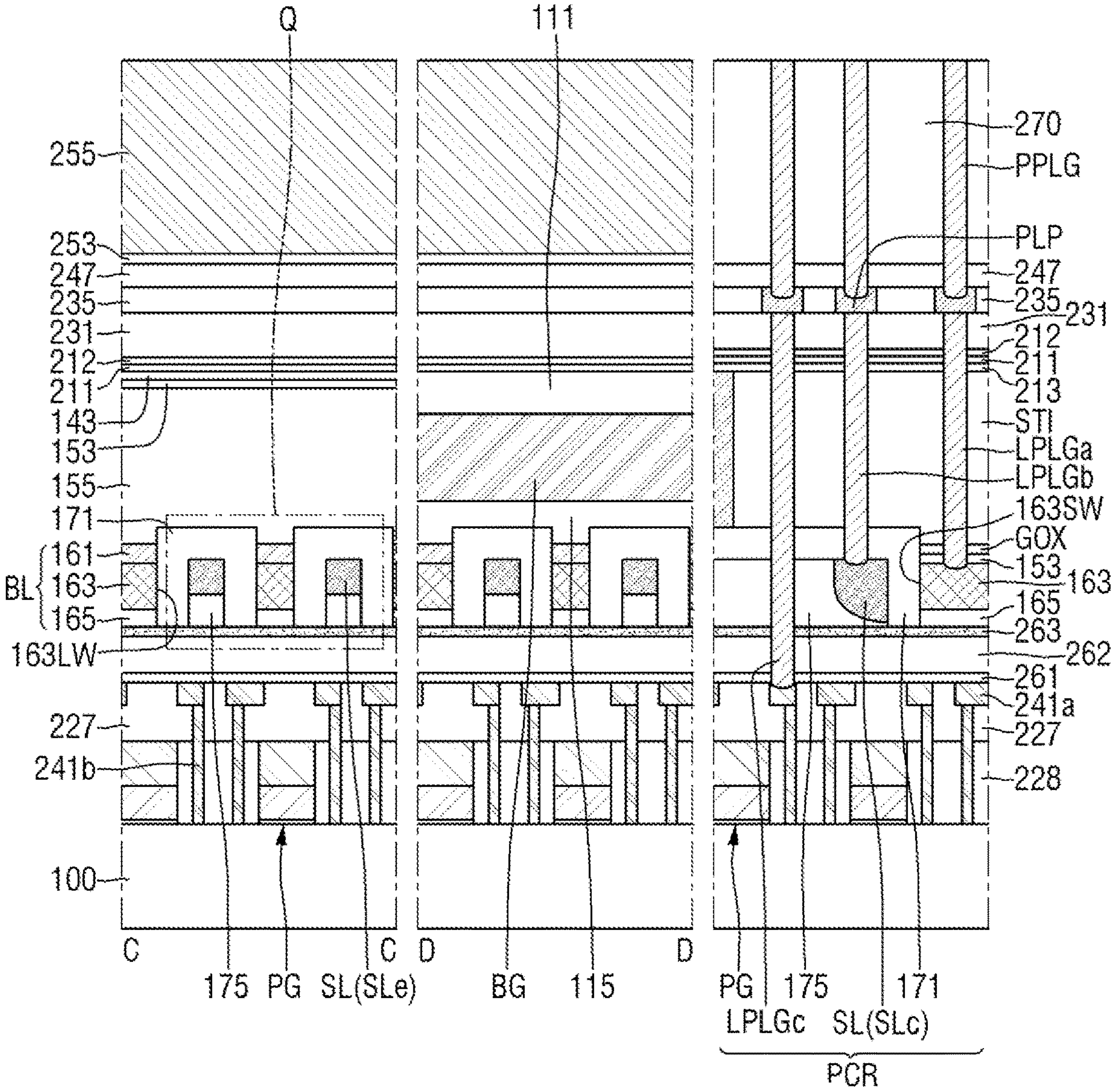
FIG. 4 is a cross-sectional view taken along line C-C and line D-D of FIG. 2.
Figure 26:
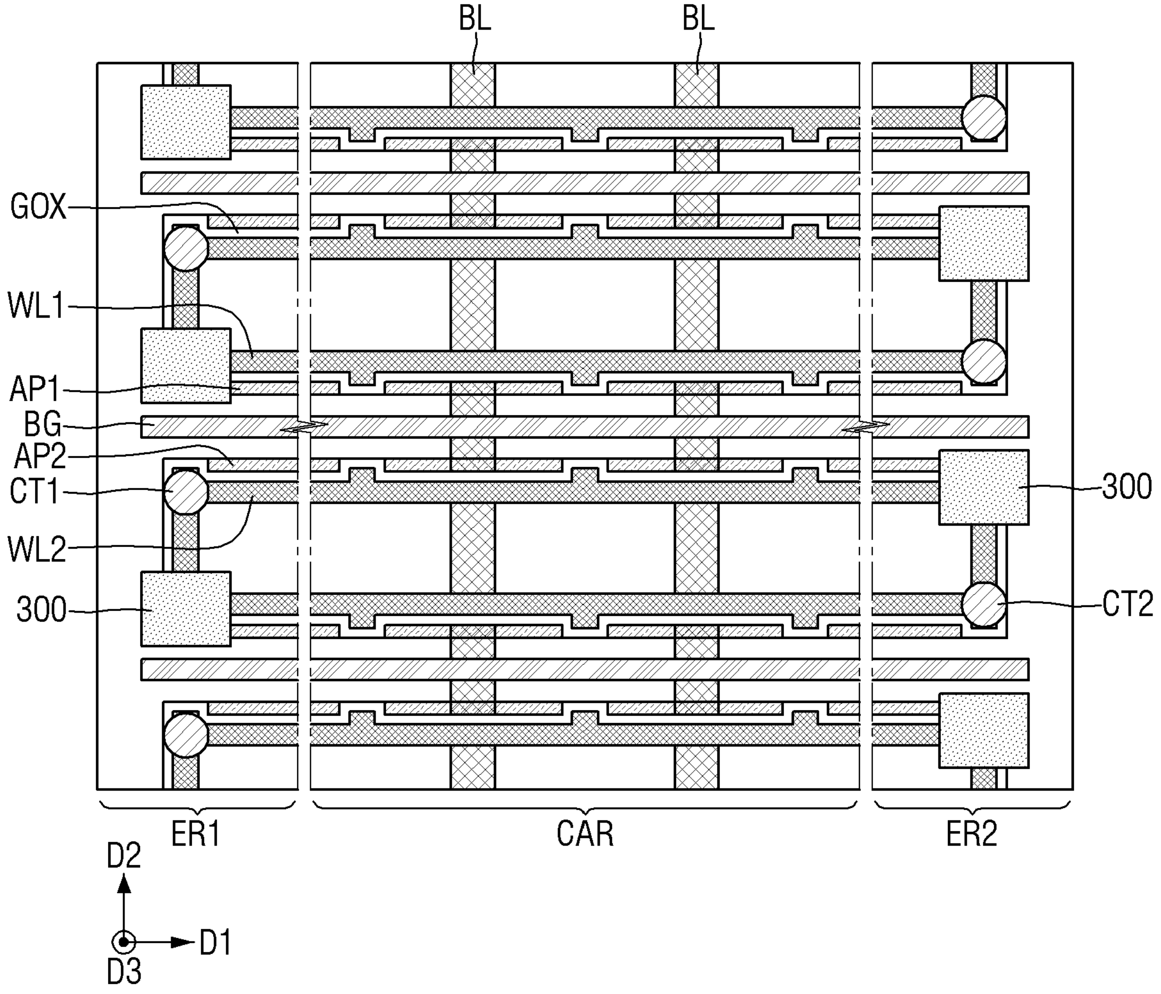
FIG. 26 is an illustrative view of a shape in which word lines of FIG. 2 are routed in a peripheral circuit region.
Figure 27:
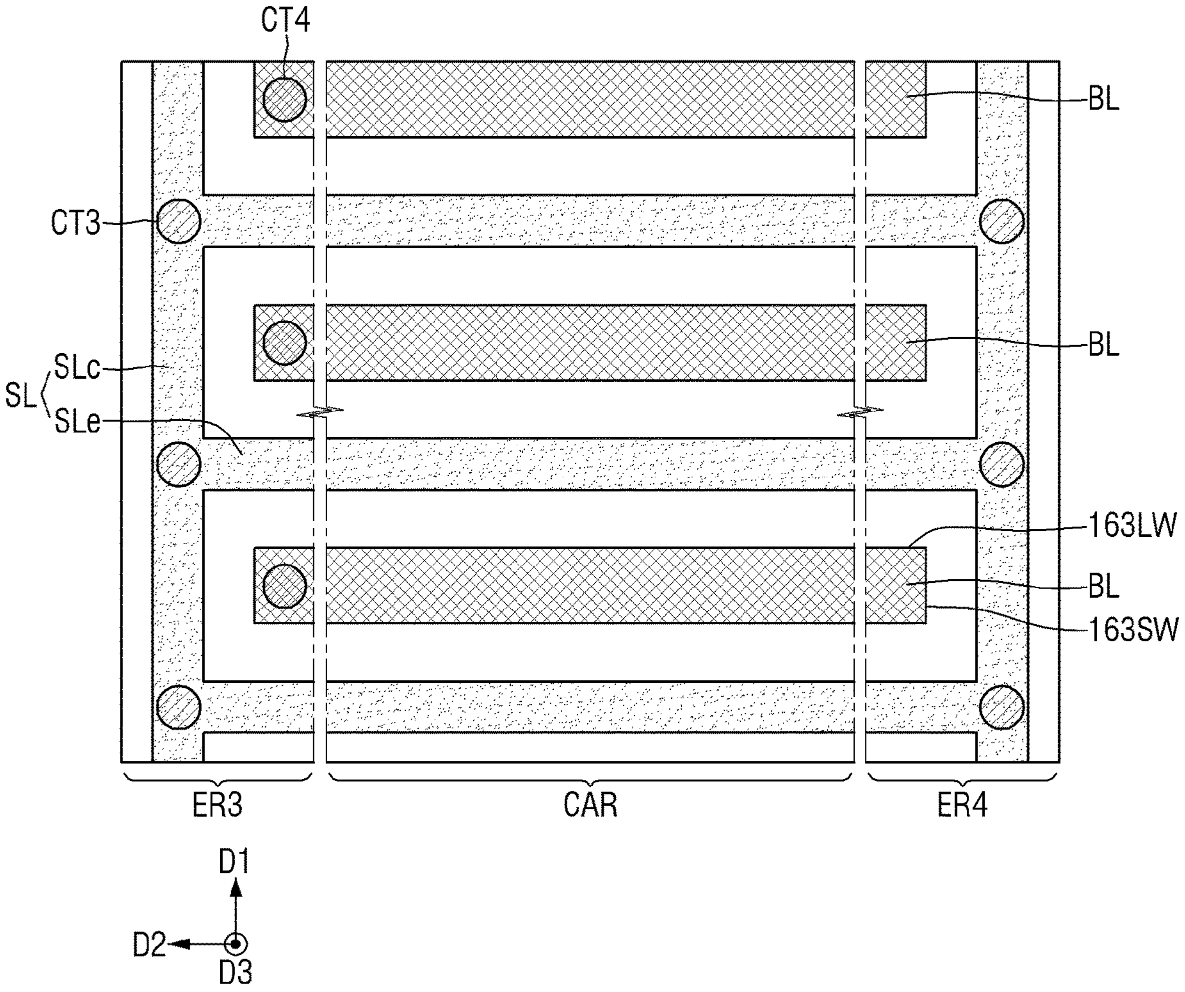
FIG. 27 is an illustrative view of a shape in which bit lines and a shielding conductive pattern of FIG. 2 are routed in the peripheral circuit region.

FIG. 1 is a schematic layout diagram of a semiconductor memory device according to some example embodiments. FIG. 2 is a plan view of a cell array region of FIG. 1. FIG. 3 is a cross-sectional view along line A-A and line B-B of FIG. 2. FIG. 4 is a cross-sectional view along line C-C and line D-D of FIG. 2. FIGS. 5 to 21 are enlarged views of portion P of FIG. 3, respectively. FIGS. 22 to 25 are enlarged views of portion Q of FIG. 4, respectively. FIG. 26 is an illustrative view for describing a shape in which word lines of FIG. 2 are routed in a peripheral circuit region. FIG. 27 is an illustrative view for describing a shape in which bit lines and a shielding conductive pattern of FIG. 2 are routed in the peripheral circuit region.

For reference, FIG. 4 includes a cross-sectional view of a peripheral circuit region bordering the cell array region of FIG. 1. The cross-sectional view of the peripheral circuit region included in FIG. 4 may be a cross-sectional view obtained by cutting bit lines in a direction in which the bit lines extend. That is, in FIG. 4, the cross-sectional view taken along line C-C and line D-D is a view taken along a first direction D1, and a cross-sectional view of the peripheral circuit region PCR is a view taken along a second direction D2.

A semiconductor memory device according to example embodiments of the present disclosure may include memory cells including vertical channel transistors (VCTs).

Referring to FIGS. 1 to 27, the semiconductor memory device according to some example embodiments may include a peripheral gate structure PG, bit lines BL, word lines WL1 and WL2, back gate electrodes BG, a shielding conductive pattern SL, active patterns AP1 and AP2, and data storage patterns DSP.

A substrate 100 may include a cell array region CAR and a peripheral circuit region PCR. Memory cells may be disposed on the cell array region CAR of the substrate 100. For example, the substrate 100 may be a silicon substrate or may include other materials, e.g., silicon germanium, indium antimonide, a lead tellurium compound, indium arsenide, indium phosphide, gallium arsenide, or gallium antimonide.

The peripheral gate structure PG may be disposed on the substrate 100. The peripheral gate structure PG may be disposed across the cell array region CAR and the peripheral circuit region PCR. In other words, one portion of the peripheral gate structure PG may be disposed in the cell array region CAR of the substrate 100, and another portion of the peripheral gate structure PG may be disposed in the peripheral circuit region PCR of the substrate 100.

The peripheral gate structure PG may be included in, e.g., a sensing transistor, a transfer transistor, a driving transistor, and the like. For example, the peripheral gate structure PG included in the sensing transistor may be disposed on the substrate 100 of the cell array region CAR. A type of transistor of a peripheral circuit disposed on the substrate 100 of the cell array region CAR may vary depending on a design layout of the semiconductor memory device.

The peripheral gate structure PG may include a peripheral gate insulating film 215, a peripheral gate conductive pattern 223, and a peripheral gate mask pattern 225. The peripheral gate insulating film 215 may include, e.g., a silicon oxide film, a silicon oxynitride film, a high-k insulating film having a dielectric constant higher than that of the silicon oxide film, or combinations thereof. The high-k insulating film may include, e.g., at least one of metal oxide, metal oxynitride, metal silicon oxide, and metal silicon oxynitride. The peripheral gate conductive pattern 223 may include a conductive material, e.g., at least one of a doped semiconductor material, conductive metal nitride, conductive metal silicon nitride, metal carbonitride, conductive metal silicide, conductive metal oxide, and a two-dimensional (2D) material. The peripheral gate mask pattern 225 is made of an insulating material. In the semiconductor memory device according to some example embodiments, the 2D material may be, e.g., a metallic material and/or a semiconductor material. The 2D material may include a 2D allotrope or a 2D compound, e.g., at least one of graphene, molybdenum disulfide ($MoS_2$), molybdenum diselenide ($MoSe_2$), tungsten diselenide ($WSe_2$), and tungsten disulfide ($WS_2$).

A first peripheral lower insulating film 227 and a second peripheral lower insulating film 228 may be disposed on the substrate 100. Each of the first peripheral lower insulating film 227 and the second peripheral lower insulating film 228 may be made of an insulating material.

A peripheral wiring line 241*a* and peripheral contact plugs 241*b* may be disposed in the first peripheral lower insulating film 227 and the second peripheral lower insulating film 228. The peripheral wiring line 241*a* and the peripheral contact plug 241*b* are illustrated as different films, but they may be integral with each other, e.g., a boundary between the peripheral wiring line 241*a* and the peripheral contact plug 241*b* may not be apparent (e.g., may be visually not visible). Each of the peripheral wiring line 241*a* and the peripheral contact plug 241*b* may include a conductive material.

A first peripheral upper insulating film 261 and a second peripheral upper insulating film 262 may be disposed on the peripheral wiring line 241*a* and the peripheral contact plugs 241*b*. Each of the first peripheral upper insulating film 261 and the second peripheral upper insulating film 262 may be made of an insulating material. Unlike illustrated in the drawings, a peripheral upper insulating film formed as a single film may be disposed on the peripheral wiring line 241*a* and the peripheral contact plugs 241*b*.

A bonding insulating film 263 may be disposed on the second peripheral upper insulating film 262. The bonding insulating film 263 may be used to bond a wafer. The bonding insulating film 263 may include, e.g., silicon carbonitride (SiCN).

The bit lines BL may be disposed on the peripheral gate structure PG, e.g., the bit lines BL may be disposed on the bonding insulating film 263. The bit lines BL may extend to be elongated in the second direction D2, and adjacent bit lines BL may be spaced apart from each other in the first direction D1. Each of the bit lines BL may include a long sidewall 163LW extending in the second direction D2 and a short sidewall 163SW extending in the first direction D1 (FIG. 27).

Each bit line BL may extend from the cell array region CAR to the peripheral circuit region PCR. An end of each bit line BL may be disposed on the peripheral circuit region PCR. A portion of the bit line BL may be disposed at a position overlapping the peripheral circuit region PCR.

Each bit line BL may include a polysilicon pattern 161, a metal pattern 163, and a bit line mask pattern 165 that are sequentially stacked. Here, the bit line mask pattern 165 may be in contact with the bonding insulating film 263. Unlike illustrated in the drawings, the bit line BL may include only one of the polysilicon pattern 161 and the metal pattern 163.

The bit line BL may include a conductive bit line. The conductive bit line may include a film made of a conductive material in the bit line BL. The conductive bit line may include the polysilicon pattern 161 and the metal pattern 163.

The metal pattern 163 may include a conductive material, e.g., at least one of conductive metal nitride, conductive metal silicon nitride, metal carbonitride, conductive metal silicide, conductive metal oxide, a two-dimensional material, and a metal. The bit line mask pattern 165 may include an insulating material, e.g., silicon nitride or silicon oxynitride. For example, as illustrated in FIG. 4, the polysilicon pattern 161 of the bit line BL may not be disposed in the peripheral circuit region PCR.

A shielding structure 171, SL, and 175 may be disposed on the peripheral gate structure PG. The shielding structure 171, SL, and 175 may be disposed on the bonding insulating film 263 and may be in contact with the bonding insulating film 263.

The shielding structure 171, SL, and 175 may be disposed adjacent to the bit line BL. In the cell array region CAR, the shielding structure 171, SL, and 175 may be disposed adjacent to the bit line BL in the first direction D1. The shielding structure 171, SL, and 175 may be disposed between the bit lines BL adjacent to each other in the first direction D1. The shielding structure 171, SL, and 175 may extend in the second direction D2. The shielding structure 171, SL, and 175 may be in contact with the bit line BL.

The shielding structure 171, SL, and 175 may include a shielding conductive pattern SL and shielding insulating films 171 and 175. The shielding insulating films 171 and 175 may include a shielding insulating liner 171 and a shielding insulating capping film 175. The shielding insulating films 171 and 175 may surround a circumference of the shielding conductive pattern SL. In other words, the shielding conductive pattern SL may be disposed inside, e.g., completely enclosed by, the shielding insulating films 171 and 175.

The shielding conductive pattern SL may include an extension portion SLe and a connection portion SLc. The extension portion SLe of the shielding conductive pattern may extend along the long sidewall 163LW of the bit line. The extension portion SLe of the shielding conductive pattern may extend in the second direction D2. The shielding conductive pattern SL disposed between the bit lines BL adjacent to each other in the first direction D1 may be the extension portion SLe of the shielding conductive pattern. In FIGS. 2 and 4, in at least a portion of the connection portion SLc of the shielding conductive pattern, a width of the shielding conductive pattern SL in the second direction D2 may increase as the shielding conductive pattern SL becomes distant from the substrate 100. In a cross-sectional view, the connection portion SLc of the shielding conductive pattern may have an inverted spacer shape.

The connection portion SLc of the shielding conductive pattern may extend along the short sidewall 163SW of the bit line. The connection portion SLc of the shielding conductive pattern may extend in the first direction D1. The connection portion SLc of the shielding conductive pattern may connect the extending portions SLe of the shielding conductive pattern adjacent to each other in the first direction D1 to each other. The connection portion SLc of the shielding conductive pattern may be directly connected to the extending portion SLe of the shielding conductive pattern.

The shielding conductive pattern SL may extend from the cell array region CAR to the peripheral circuit region PCR. An end of the shielding conductive pattern SL may be disposed on the peripheral circuit region PCR. The connection portion SLc of the shielding conductive pattern may be disposed on the peripheral circuit region PCR.

The shielding conductive pattern SL may include a conductive material, e.g., at least one of conductive metal nitride, conductive metal silicon nitride, metal carbonitride, conductive metal silicide, conductive metal oxide, a two-dimensional material, and a metal. Each of the shielding insulating liner 171 and the shielding insulating capping film 175 may be made of an insulating material. When the shielding insulating liner 171 and the shielding insulating capping film 175 include the same material, a boundary between the shielding insulating liner 171 and the shielding insulating capping film 175 may not be apparent.

The shielding structure 171, SL, and 175 may be disposed between the bit lines BL adjacent to each other in the first direction D1. Thus, a coupling noise between the bit lines BL may be decreased.

In FIGS. 4 and 22 to 25, the shielding conductive pattern SL may include a first surface SL_S1 and a second surface SL_S2 opposite to each other in a third direction D3. For example, the first surface SL_S1 of the shielding conductive pattern and the second surface SL_S2 of the shielding conductive pattern may be included in the extension portion SLe of the shielding conductive pattern. The metal pattern 163 of the bit line BL may include a first surface 163_S1 and a second surface 163_S2 opposite to each other in the third direction D3. The first surface SL_S1 of the shielding conductive pattern and the first surface 163_S1 of the metal pattern are closer to the bonding insulating film 263 than the second surface SL_S2 of the shielding conductive pattern and the second surface 163_S2 of the metal pattern are. The third direction D3 may be a thickness direction of the substrate 100.

Figure 22:
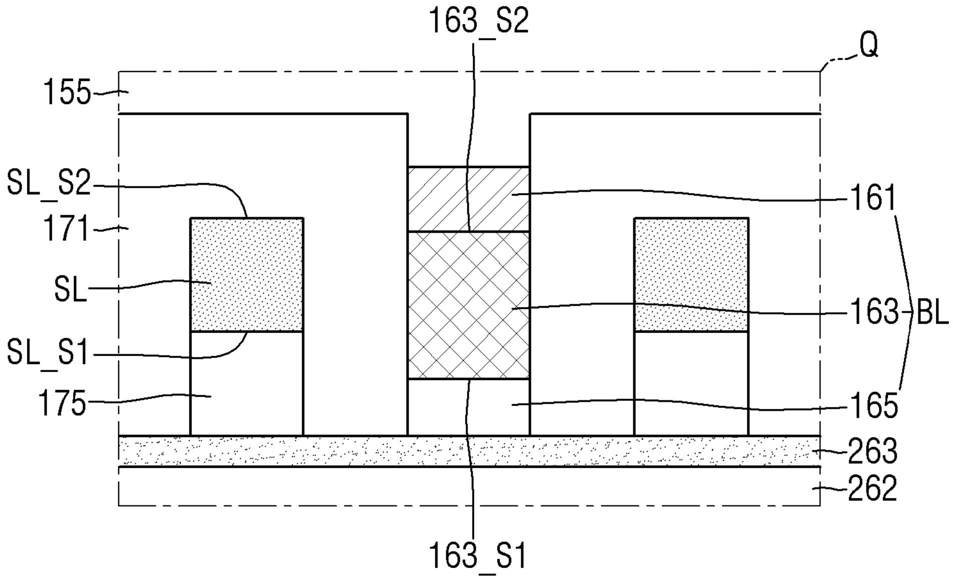
FIGS. 22 to 25 are enlarged views of portion Q of FIG. 4, respectively.
Figure 23:
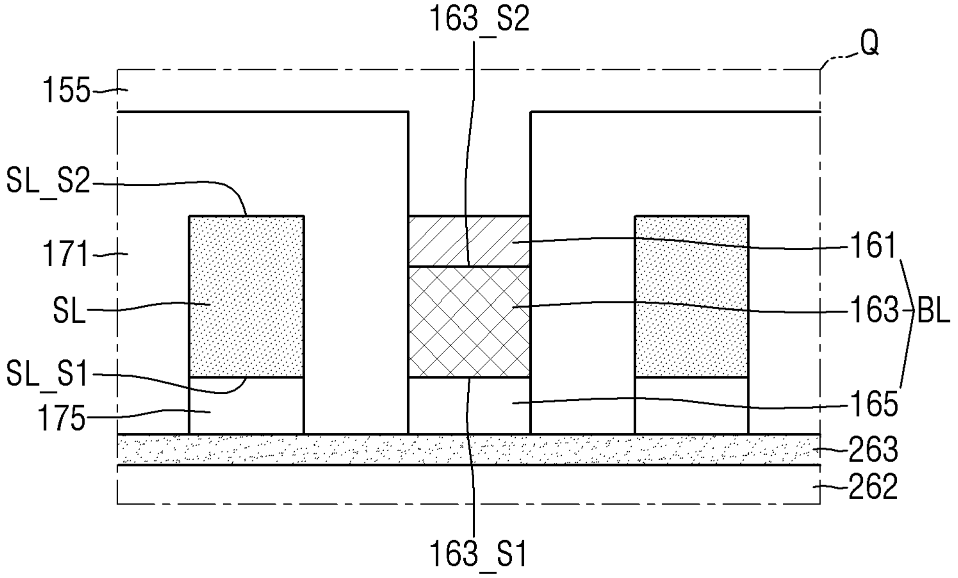
Figure 24:
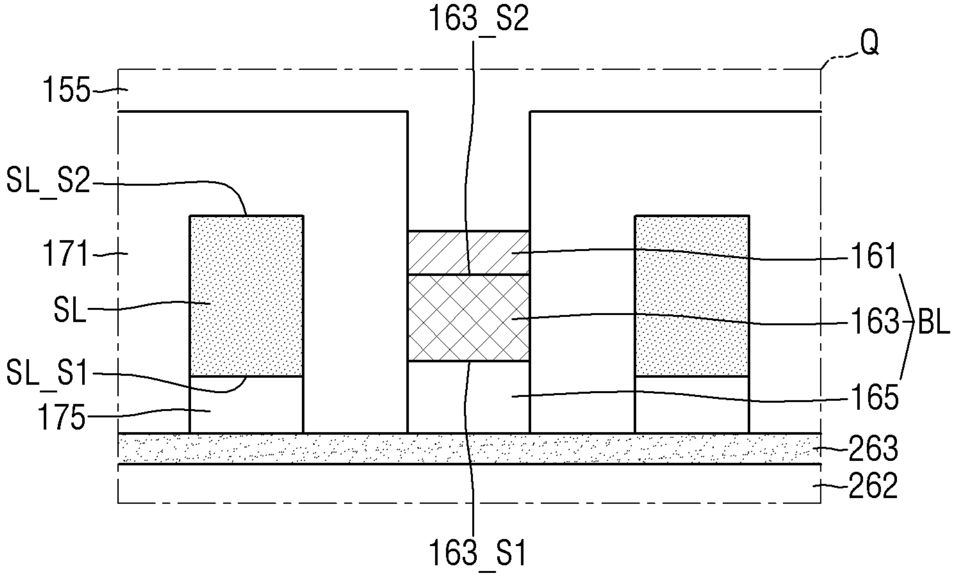

For example, as illustrated in FIG. 22, a height of the conductive bit line, e.g., a total height of the polysilicon pattern 161 and the metal pattern 163, in the third direction D3 is greater than a height of the shielding conductive pattern SL in the third direction D3. In another example, as illustrated in FIG. 24, a height of the conductive bit line in the third direction D3 is smaller than a height of the shielding conductive pattern SL in the third direction D3. In FIGS. 22 and 24, a height of the conductive bit line in the third direction D3 is different from a height of the shielding conductive pattern SL in the third direction D3. In yet another example, as illustrated in FIG. 23, a height of the conductive bit line in the third direction D3 may be the same as a height of the shielding conductive pattern SL in the third direction D3.

Based on the bonding insulating film 263, the height of the first surface SL_S1 of the shielding conductive pattern may be greater than, smaller than, or equal to the height of the first surface 163_S1 of the metal pattern. Based on the bonding insulating film 263, the height of the second surface SL_S2 of the shielding conductive pattern may be greater than, smaller than, or equal to the height of the second surface 163_S2 of the metal pattern.

Figure 25:
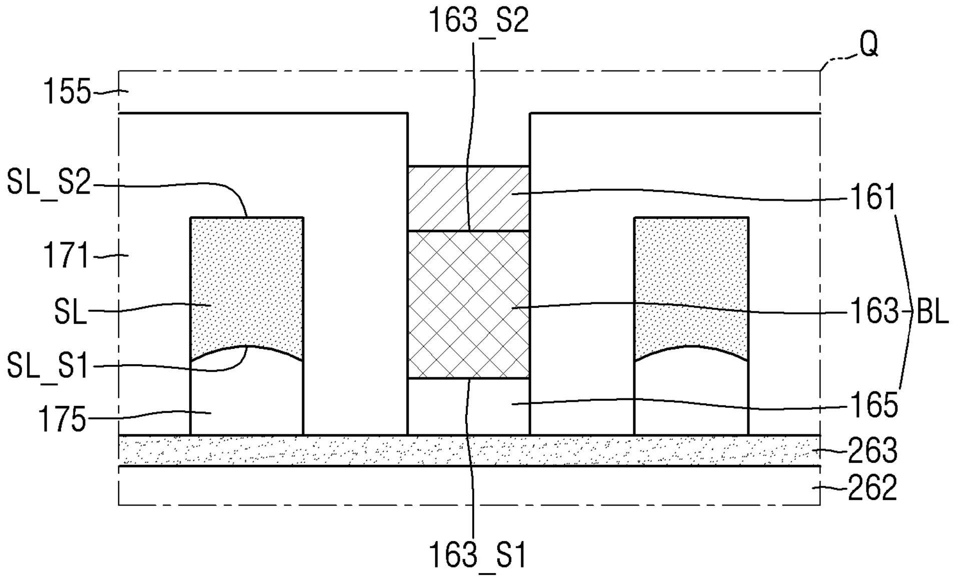

For example, in FIGS. 22 and 25, the first surface SL_S1 of the shielding conductive pattern may have a concave curved surface or may be a flat surface.

For example, as illustrated in FIG. 27, the bit lines BL and the shielding conductive pattern SL may extend from the cell array region CAR to third and fourth edge regions ER3 and ER4, e.g., in the second direction D2. The third edge region ER3 and the fourth edge region ER4 may be included in the peripheral circuit region PCR.

In a plan view, each bit line BL may be surrounded by the shielding conductive pattern SL, a perimeter of each bit line BL may be completely surrounded by the shielding conductive pattern SL. A portion of the extension portion SLe of the shielding conductive pattern may be disposed in the cell array region CAR. The other portion of the extension portion SLe of the shielding conductive pattern and the connection portion SLc of the shielding conductive pattern may be disposed in the third and fourth edge regions ER3 and ER4.

Shielding pattern contact plugs CT3 may be connected to the shielding conductive pattern SL. Bit line contact plugs CT4 may be connected to the bit lines BL. The bit line contact plug CT4 may be connected to the polysilicon pattern 161 and metal pattern 163 of the bit line BL. A shape, e.g., arrangement, in which the shielding pattern contact plug CT3 and the bit line contact plug CT4 are disposed is only an example, and any convenient arrangement may be implemented.

As illustrated in FIG. 1, the first active patterns AP1 and the second active patterns AP2 may be disposed on the respective bit lines BL. The first active patterns AP1 and the second active patterns AP2 may be alternately disposed along the second direction D2.

The first active patterns AP1 may be spaced apart from each other in the first direction D1. The first active patterns AP1 may be spaced apart from each other at regular intervals. The second active patterns AP2 may be spaced apart from each other in the first direction D1. The second active patterns AP2 may be spaced apart from each other at regular intervals. The first and second active patterns AP1 and AP2 may be two-dimensionally arranged along the first direction D1 and the second direction D2 crossing each other.

For example, each of the first active pattern AP1 and the second active pattern AP2 may be made of a single crystal semiconductor material. As an example, each of the first active pattern AP1 and the second active pattern AP2 may be made of single crystal silicon.

Each of the first active pattern AP1 and the second active pattern AP2 may have a length in the first direction D1, have a width in the second direction D2, and have a height in the third direction D3. Each of the first active pattern AP1 and the second active pattern AP2 may have a substantially uniform width. That is, each of the first active pattern AP1 and the second active pattern AP2 may have substantially the same width on first and second surfaces S1 and S2 thereof. In addition, the width of the first active pattern AP1 may be the same as the width of the second active pattern AP2.

The width of the first active pattern AP1 and the width of the second active pattern AP2 may be several nanometers to several tens of nanometers. For example, the width of the first active pattern AP1 and the width of the second active pattern AP2 in the second direction D2 may be 1 nm to 30 nm, e.g., 1 nm to 10 nm. The length of each of the first and second active patterns AP1 and AP2 may be greater than a line width of the bit line BL. That is, the length of each of the first and second active patterns AP1 and AP2 may be greater than a width of the bit line BL in the first direction D1.

Figure 5:
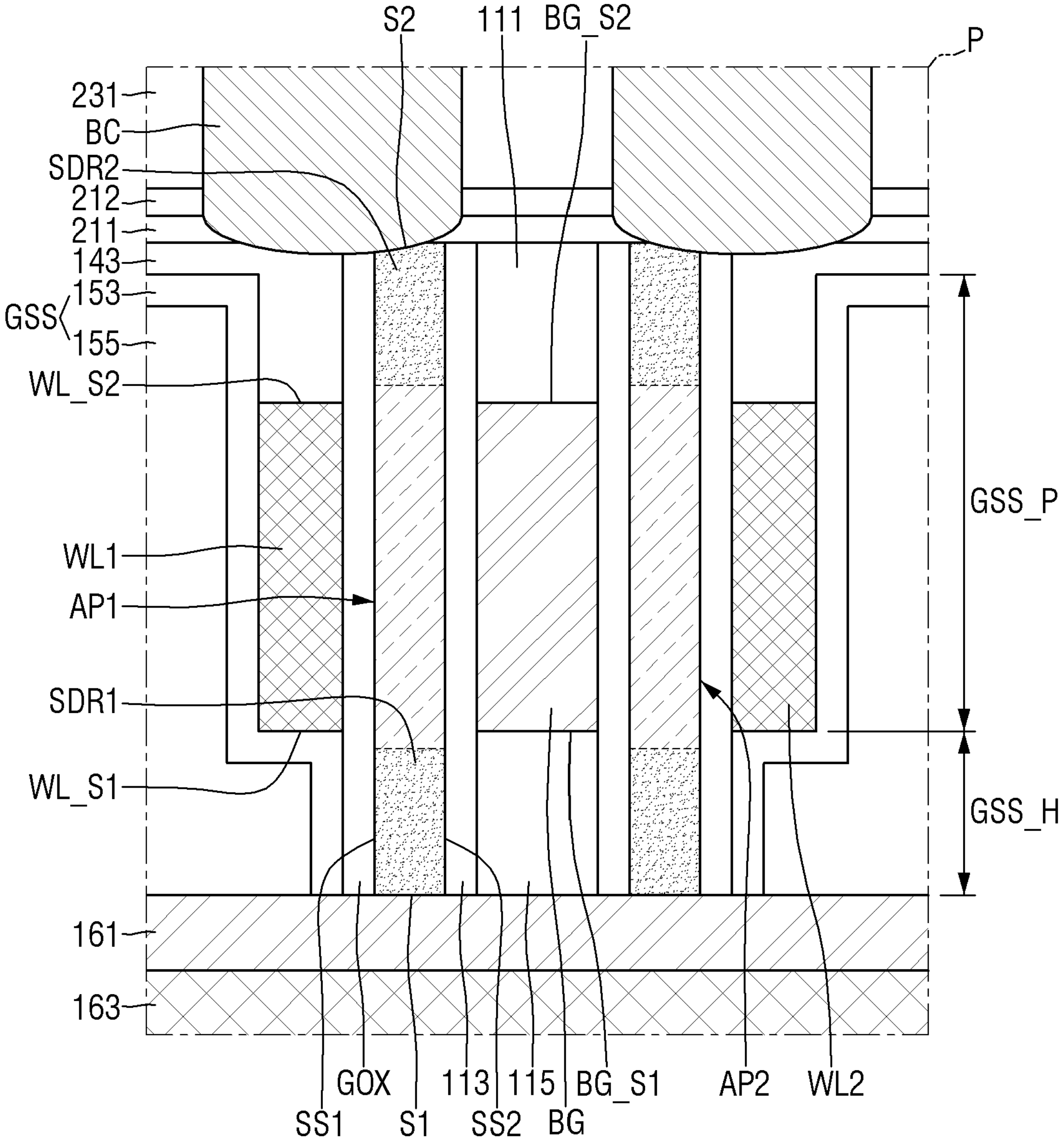
FIGS. 5 to 21 are enlarged views of portion P of FIG. 3, respectively.

Referring to FIG. 5, each of the first and second active patterns AP1 and AP2 includes first and second surfaces S1 and S2 opposite to each other in the third direction D3. For example, the first surfaces S1 of the first and second active patterns AP1 and AP2 may be in, e.g., direct, contact with the polysilicon pattern 161 of the bit line BL. Unlike illustrated in FIG. 5, when the polysilicon pattern 161 is omitted, the first surfaces S1 of the first and second active patterns AP1 and AP2 may be in contact with the metal pattern 163.

Each of the first active pattern AP1 and the second active pattern AP2 may include a first sidewall SS1 and a second sidewall SS2 opposite to each other in the second direction D2. The second sidewall SS2 of the first active pattern AP1 may face the first sidewall SS1 of the second active pattern AP2. The first sidewall SS1 of the first active pattern AP1 may be adjacent to a first word line WL1. The second sidewall SS2 of the second active pattern AP2 may be adjacent to a second word line WL2.

For example, as illustrated in FIG. 5, each of the first and second active patterns AP1 and AP2 may include a first dopant region SDR1 adjacent to the bit line BL and a second dopant region SDR2 adjacent to a contact pattern BC. Each of the first active pattern AP1 and the second active pattern AP2 may include a channel region between the first dopant region SDR1 and the second dopant region SDR2. The first and second dopant regions SDR1 and SDR2 are regions doped with dopants within the first and second active patterns AP1 and AP2. Concentration of impurities in the first and second dopant regions SDR1 and SDR2 may be higher than concentrations of impurities in the channel regions of the first and second active patterns AP1 and AP2. In another example, unlike FIG. 5, each of the first active pattern AP1 and the second active pattern AP2 may not include at least one of the first dopant region SDR1 and the second dopant region SDR2.

At the time of an operation of the semiconductor memory device, the channel regions of the first and second active patterns AP1 and AP2 may be controlled by the first and second word lines WL1 and WL2 and the back gate electrodes BG. Since the first and second active patterns AP1 and AP2 are made of a single crystal semiconductor material, leakage current characteristics of the semiconductor memory device may be improved.

Figure 6:
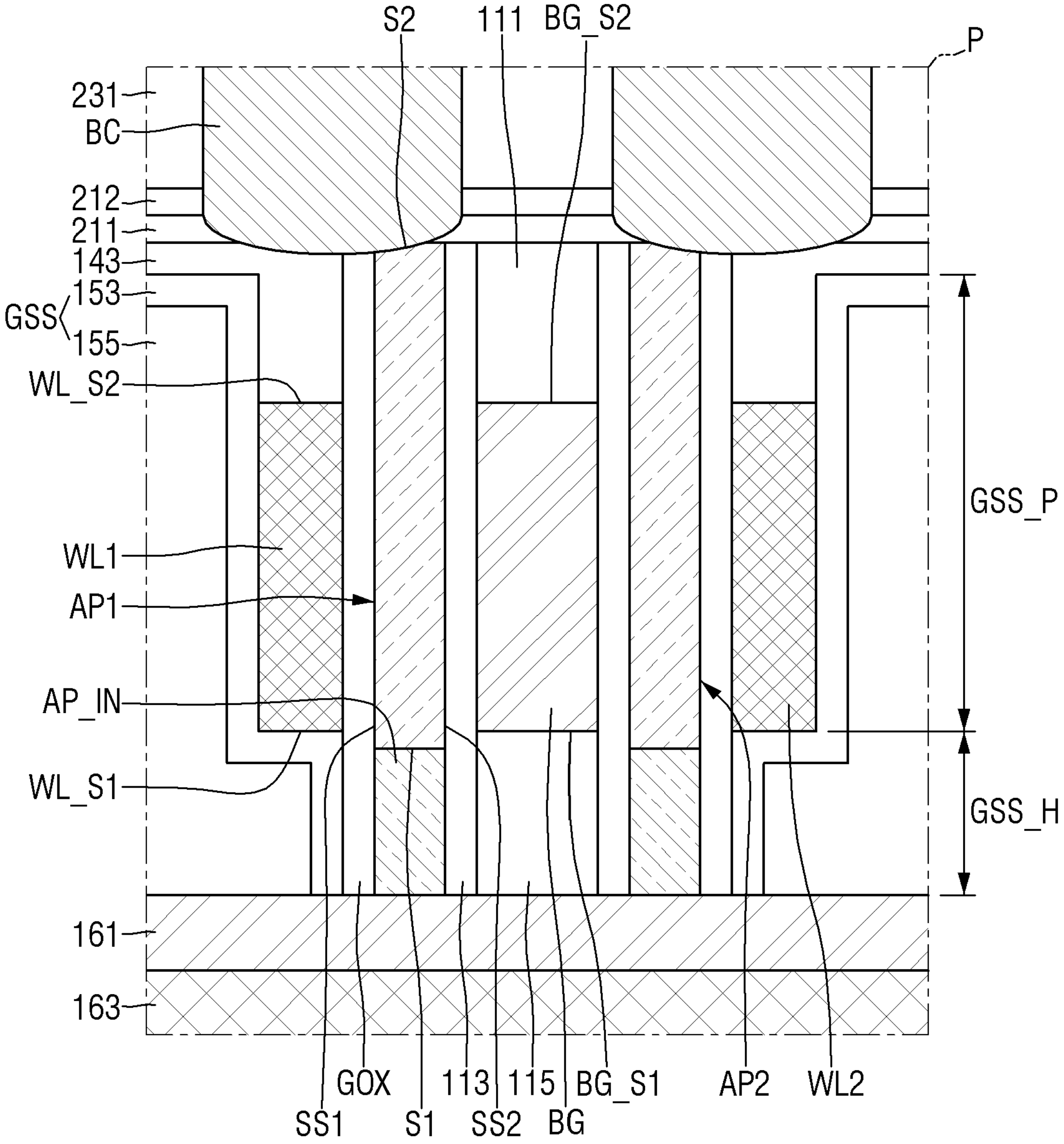
Figure 7:
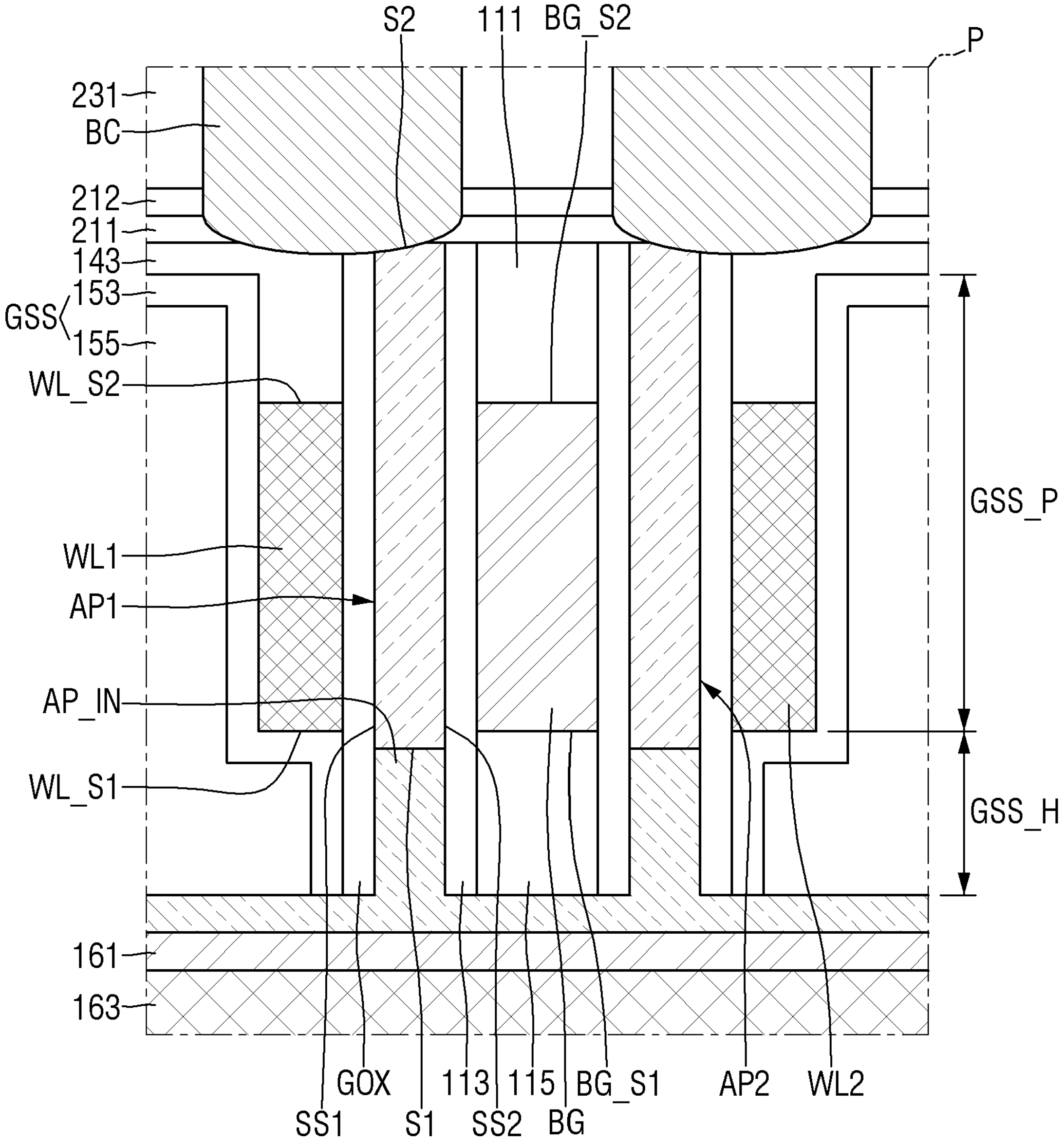
Figure 8:
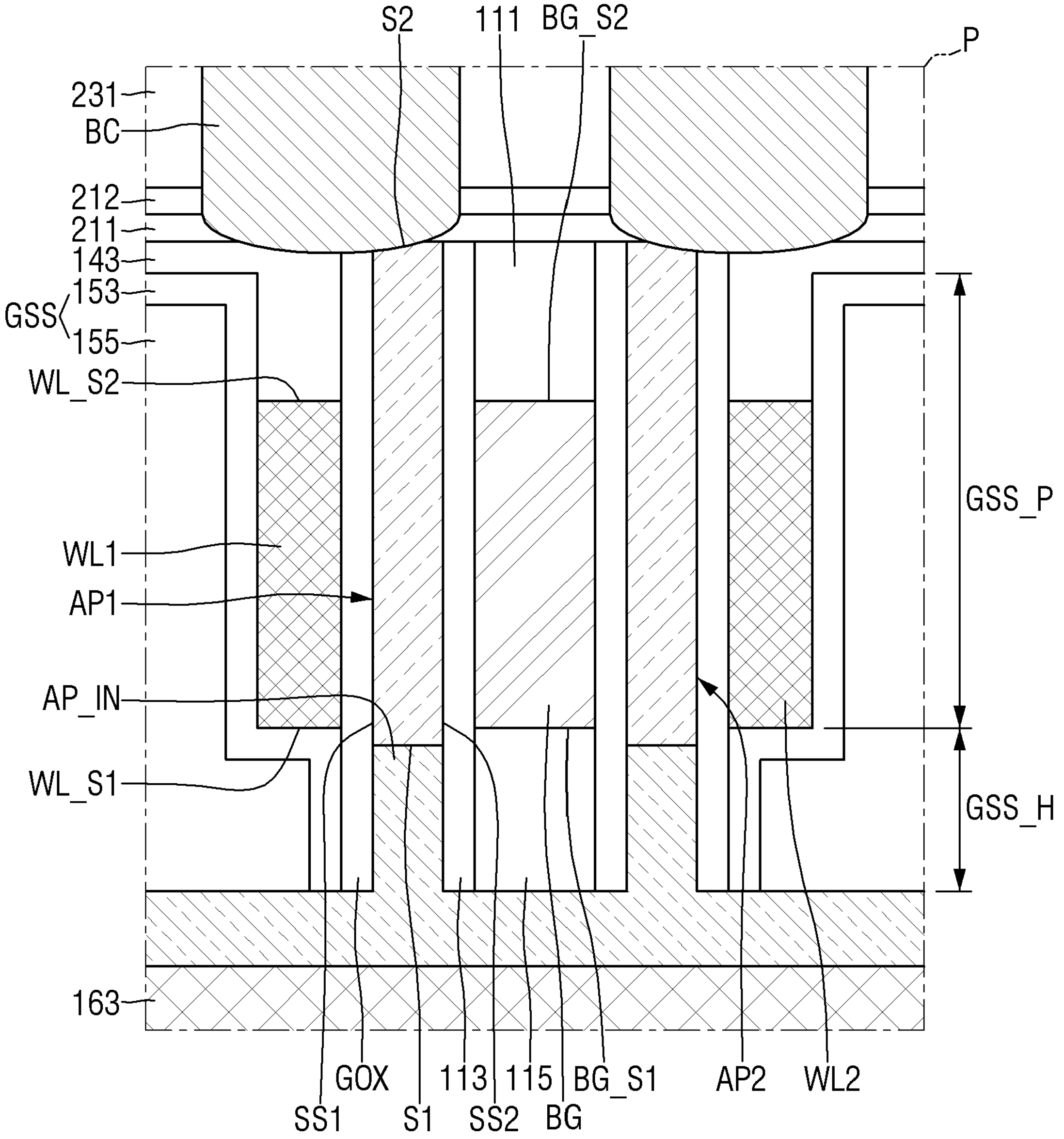

In FIGS. 6 to 8, the semiconductor memory device according to some example embodiments may further include insertion semiconductor patterns AP_IN disposed between the first active pattern AP1 and the metal pattern 163 and between the second active pattern AP2 and the metal pattern 163. The insertion semiconductor patterns AP_IN may include a semiconductor material different from that of the first and second active patterns AP1 and AP2. For example, when the first and second active patterns AP1 and AP2 include silicon, the insertion semiconductor patterns AP_IN may include silicon germanium. The insertion semiconductor patterns AP_IN are inserted, such that a floating body effect may be improved.

Referring to FIG. 6, the insertion semiconductor pattern AP_IN between the first active pattern AP1 and the metal pattern 163 may be spaced apart, e.g., completely separated, from the insertion semiconductor pattern AP_IN between the second active pattern AP2 and the metal pattern 163 in the second direction D2.

In FIGS. 7 and 8, the insertion semiconductor pattern AP_IN between the first active pattern AP1 and the metal pattern 163 may be connected to the insertion semiconductor pattern AP_IN between the second active pattern AP2 and the metal pattern 163. That is, a portion of the insertion semiconductor pattern AP_IN may extend in the second direction D2 along the metal pattern 163 in a line shape. For example, as illustrated in FIG. 7, the polysilicon pattern 161 may be disposed between the insertion semiconductor patterns AP_IN and the metal pattern 163. In another example, as illustrated in FIG. 8, the insertion semiconductor patterns AP_IN may be in direct contact with the metal pattern 163.

The back gate electrodes BG may be disposed on the bit line BL and the shielding conductive pattern SL. The back gate electrodes BG may be spaced apart from each other in the second direction D2. The back gate electrodes BG may be spaced apart from each other at regular intervals. Each back gate electrode BG may extend in the first direction D1 across the bit line BL.

Each back gate electrode BG may be disposed between the first active pattern AP1 and the second active pattern AP2 adjacent to each other in the second direction D2. In other words, the first active pattern AP1 may be disposed on one side of each back gate electrode BG, and the second active pattern AP2 may be disposed on the other side of each back gate electrode BG. A height of the back gate electrode BG in the third direction D3 may be smaller than the height of, e.g., each of, the first and second active patterns AP1 and AP2.

Each back gate electrode BG may be disposed between the second sidewall SS2 of the first active pattern AP1 and the first sidewall SS1 of the second active pattern AP2. Each back gate electrode BG may be disposed on the second sidewall SS2 of the first active pattern AP1 and the first sidewall SS1 of the second active pattern AP2.

The first active pattern AP1 may be disposed between the first word line WL1 and the back gate electrode BG. The second active pattern AP2 may be disposed between the second word line WL2 and the back gate electrode BG. A pair of first and second word lines WL1 and WL2 may be disposed between the back gate electrodes BG adjacent to each other in the second direction D2.

The back gate electrode BG may include a first surface BG_S1 and a second surface BG_S2 opposite to each other in the third direction D3. The first surface BG_S1 of the back gate electrode is closer to the bit line BL than the second surface BG_S2 of the back gate electrode is.

The back gate electrode BG may include a conductive material, e.g., at least one of doped polysilicon, conductive metal nitride, conductive metal silicon nitride, metal carbonitride, conductive metal silicide, conductive metal oxide, a two-dimensional material, and a metal. A voltage is applied to the back gate electrode BG at the time of an operation of the semiconductor memory device, such that a threshold voltage of the vertical channel transistor may be adjusted. The threshold voltage of the vertical channel transistor is adjusted, such that deterioration of the leakage current characteristics of the semiconductor memory device may be prevented.

A back gate isolation pattern 111 may be disposed between the first active pattern AP1 and the second active pattern AP2 adjacent to each other in the second direction D2. The back gate isolation pattern 111 may extend in the first direction D1 in parallel with the back gate electrode BG. The back gate isolation pattern 111 may be disposed on the second surface BG_S2 of the back gate electrode.

The back gate isolation pattern 111 may include, e.g., a silicon oxide, a silicon oxynitride, or a silicon nitride. The back gate isolation pattern 111 may be formed at the same level as a gate capping pattern 143 to be described later. Here, the term "same level" refers to formation by the same fabricating process. The back gate isolation pattern 111 may be made of the same material as the gate capping pattern 143.

Back gate insulating patterns 113 may be disposed between the back gate electrode BG and the first active pattern AP1 and between the back gate electrode BG and the second active pattern AP2. The back gate insulating patterns 113 may be disposed between the back gate isolation pattern 111 and the first active pattern AP1 and between the back gate isolation pattern 111 and the second active pattern AP2. The back gate insulating pattern 113 may include, e.g., a silicon oxide, a silicon oxynitride, a high-k insulating material having a dielectric constant higher than that of the silicon oxide, or combinations thereof.

A back gate capping pattern 115 may be disposed between the bit line BL and the back gate electrode BG. The back gate capping pattern 115 may be disposed between the first active pattern AP1 and the second active pattern AP2 adjacent to each other in the second direction D2. The back gate capping pattern 115 may extend in the first direction D1 in parallel with the back gate electrode BG. The back gate capping pattern 115 may be disposed on the first surface BG_S1 of the back gate electrode. A thickness of the back gate capping pattern 115 between the bit lines BL may be different from a thickness of the back gate capping pattern 115 on the bit lines BL.

The back gate capping pattern 115 may be made of an insulating material. The back gate capping pattern 115 may include, e.g., at least one of a silicon oxide, a silicon oxynitride, and a silicon nitride.

The first word line WL1 and the second word line WL2 may be disposed on the bit line BL and the shielding conductive pattern SL. Each of the first word line WL1 and the second word line WL2 may extend in the first direction D1. The first word lines WL1 and the second word lines WL2 may be alternately arranged in the second direction D2.

The first word lines WL1 may be disposed on the first sidewalls SS1 of the first active patterns AP1. The second word lines WL2 may be disposed on the second sidewalls SS2 of the second active patterns AP2. The first active patterns AP1 and the second active patterns AP2 may be disposed between the first word line WL1 and the second word line WL2 adjacent to each other in the second direction D2.

The first word line WL1 and the second word line WL2 may be spaced apart from the bit line BL and the contact patterns BC in the third direction D3. The first word line WL1 and the second word line WL2 may be positioned between the bit line BL and the contact patterns BC.

Each of the first word line WL1 and the second word line WL2 may have a width in the second direction D2. The width of the first word line WL1 and the width of the second word line WL2 on the bit line BL may be different from the width of the first word line WL1 and the width of the second word line WL2 on the shielding conductive pattern SL.

For example, each of the first word line WL1 and the second word line WL2 may include a first portion WLa of a word line and a second portion WLb of the word line. A width of the first portion WLa of the word line in the second direction D2 may be smaller than a width of the second portion WLb of the word line in the second direction D2. As an example, the first portion WLa of the word line may be disposed on, e.g., to vertically overlap, the bit line BL. The second portion WLb of the word line may be disposed on, e.g., to vertically overlap, the shielding conductive pattern SL.

The respective first word lines WL1 and second word lines WL2 may include the first portions WLa of the word lines and the second portions WLb of the word line alternately disposed along the first direction D1. In the first word line WL1, each of the first active patterns AP1 may be disposed between the second portions WLb of the word lines adjacent to each other in the first direction D1. In the second word line WL2, each of the second active patterns AP2 may be disposed between the second portions WLb of the word lines adjacent to each other in the first direction D1.

Each of the first word line WL1 and the second word line WL2 may include a first surface WL_S1 and a second surface WL_S2 opposite to each other in the third direction D3. The first surfaces WL_S1 of the first and second word lines are closer to the bit line BL than the second surfaces WL_S2 of the first and second word lines are.

The first word line WL1 will be described as an example. As an example, a height of the first word line WL1 in the third direction D3 may be the same as a height of the back gate electrode BG in the third direction D3. As another example, a height of the first word line WL1 in the third direction D3 may be greater than a height of the back gate electrode BG in the third direction D3. As still another example, a height of the first word line WL1 in the third direction D3 may be smaller than a height of the back gate electrode BG in the third direction D3.

In addition, as an example, based on the bit line BL, a height of the first surface WL_S1 of the first word line may be the same as a height of the first surface BG_S1 of the back gate electrode, e.g., relative to the upper surface of the metal pattern 163. As another example, the first surface WL_S1 of the first word line may be higher than the first surface BG_S1 of the back gate electrode. As still another example, the first surface WL_S1 of the first word line may be lower than the first surface BG_S1 of the back gate electrode.

In addition, as an example, based on the bit line BL, a height of the second surface WL_S2 of the first word line may be the same as a height of the second surface BG_S2 of the back gate electrode, e.g., relative to the upper surface of the metal pattern 163. As another example, the second surface WL_S2 of the first word line may be higher than the second surface BG_S2 of the back gate electrode. As still another example, the second surface WL_S2 of the first word line may be lower than the second surface BG_S2 of the back gate electrode. The first and second word lines WL1 and WL2 may include a conductive material, e.g., at least one of doped polysilicon, conductive metal nitride, conductive metal silicon nitride, metal carbonitride, conductive metal silicide, conductive metal oxide, a two-dimensional material, and a metal.

Figure 9:
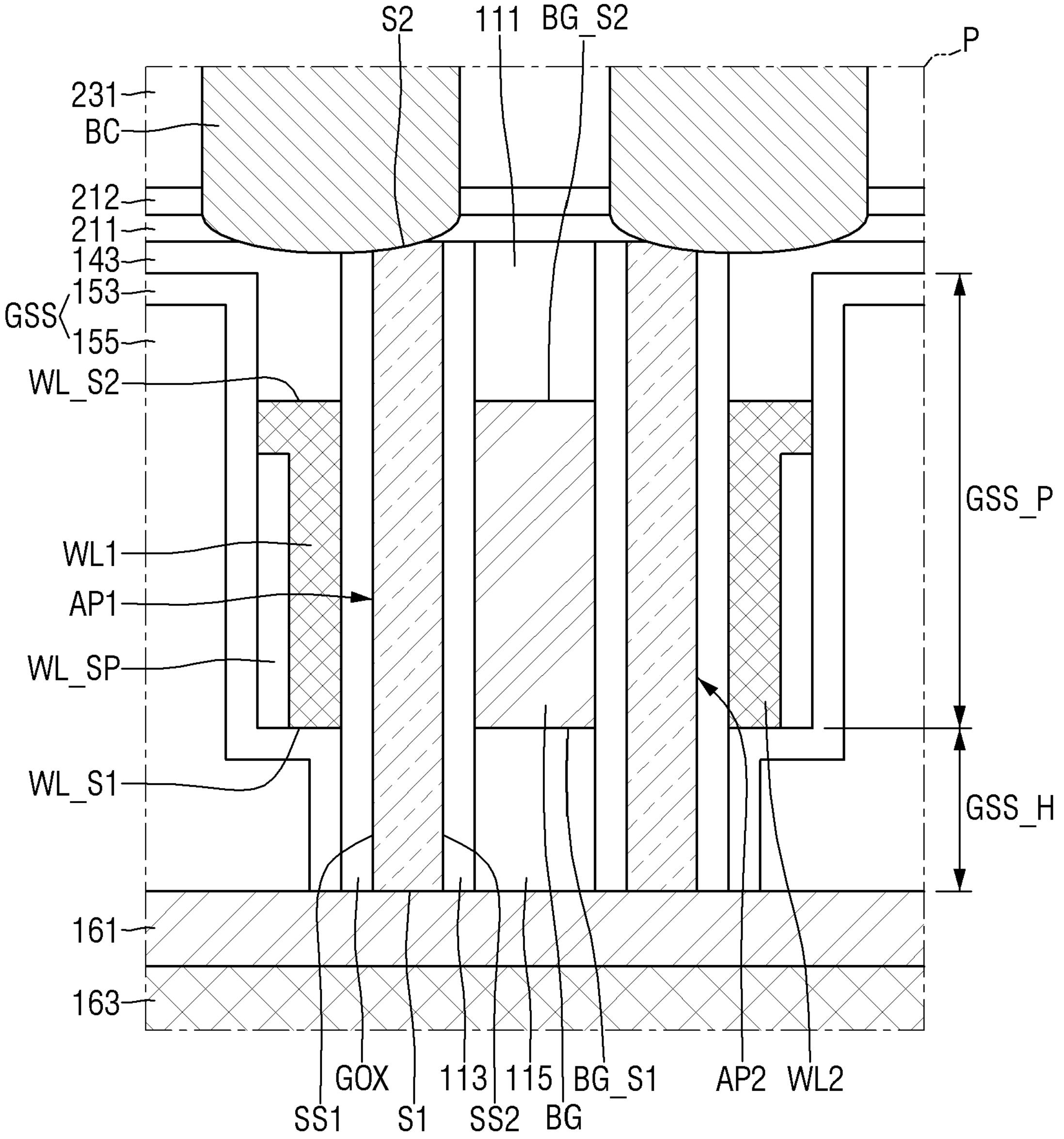

In FIG. 9, each of the first and second word lines WL1 and WL2 may have an L-shaped cross section. That is, the first and second word lines WL1 and WL2 may include vertical parts adjacent to the first and second active patterns AP1 and AP2 and horizontal parts protruding from the vertical parts in a horizontal direction (i.e., the second direction D2), respectively. Word line spacers WL_SP may be disposed on the horizontal parts of the first and second word lines WL1 and WL2. The word line spacer WL_SP may be made of an insulating material.

Figure 10:
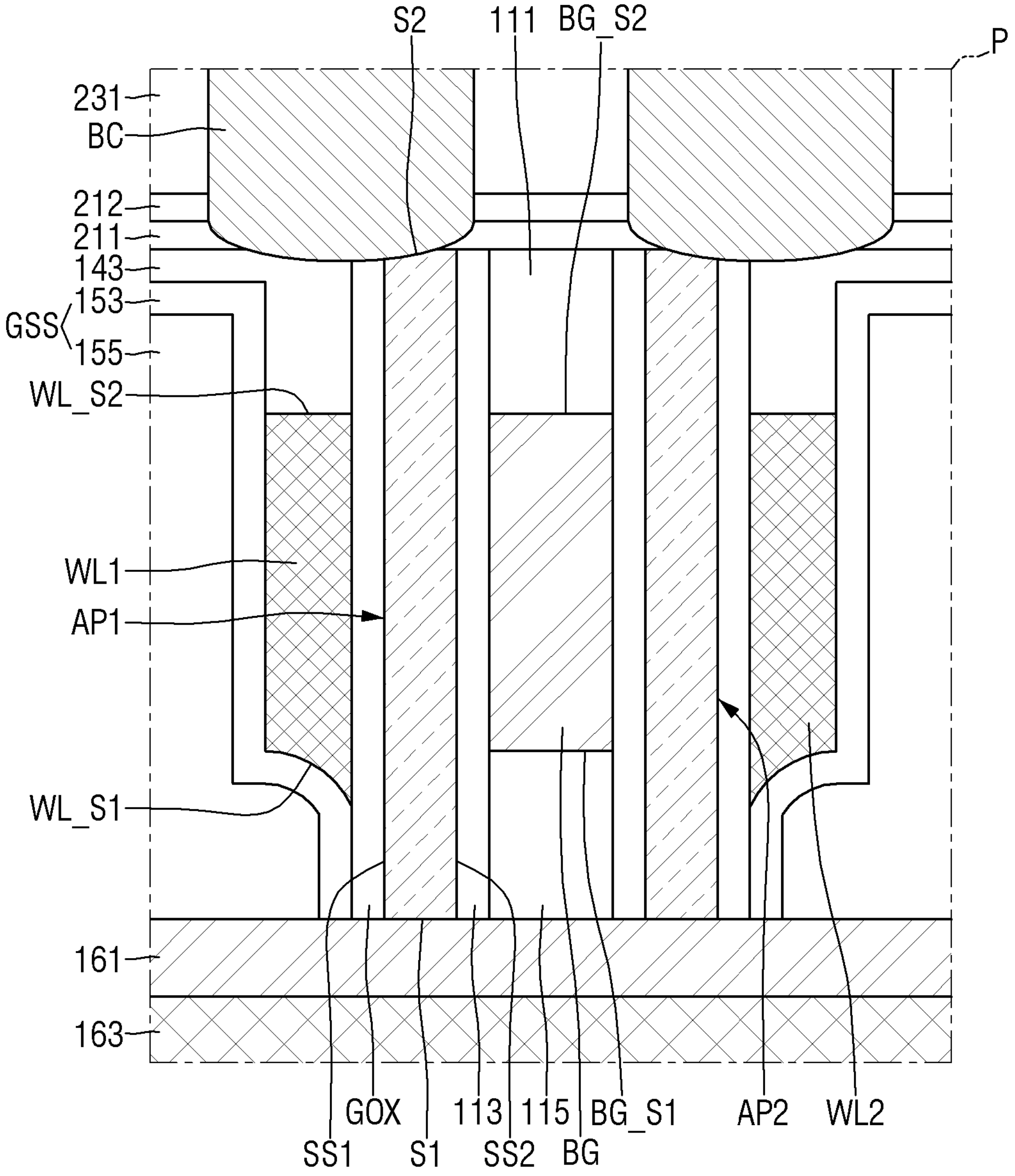
Figure 11:
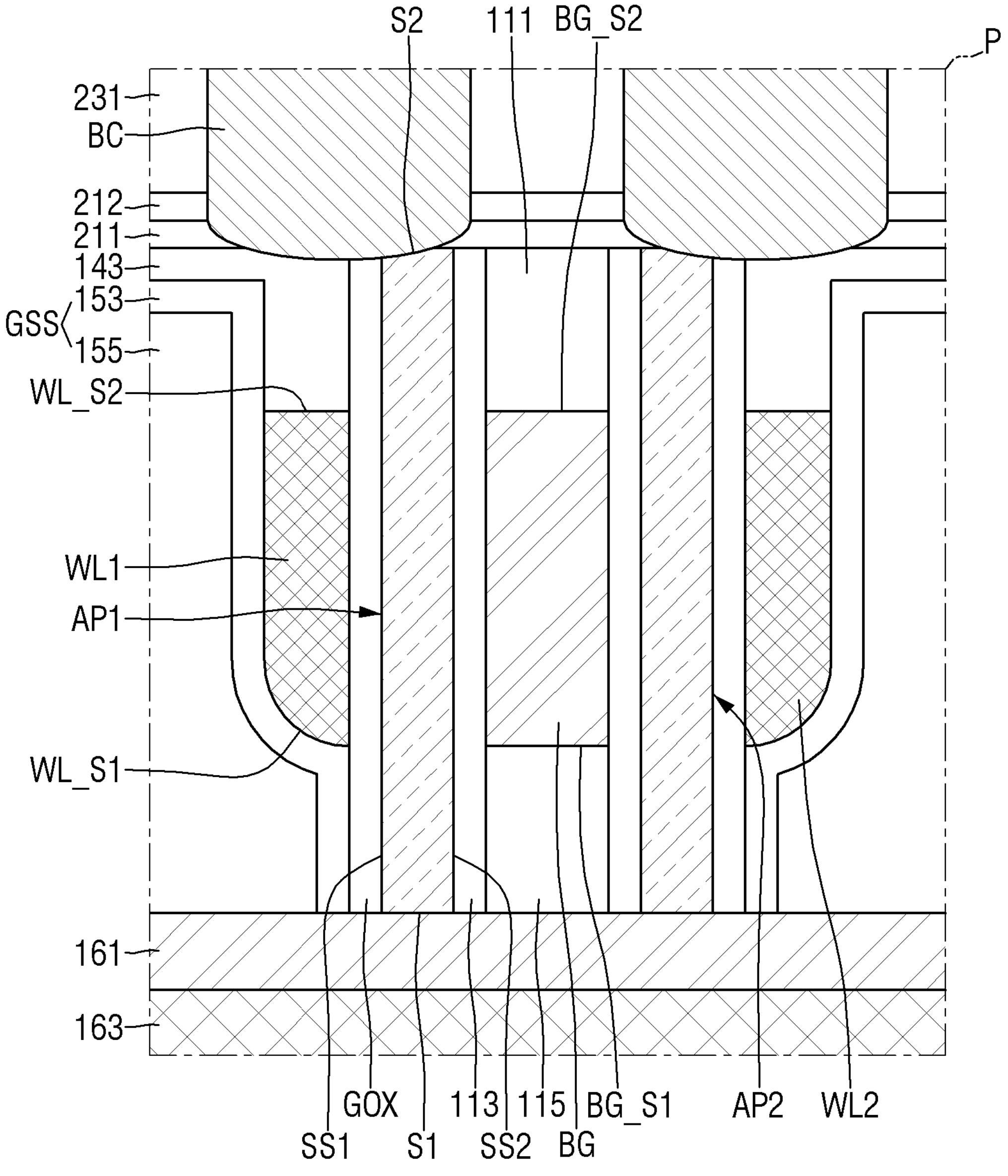

In FIGS. 10 and 11, the first surfaces WL_S1 of the first and second word lines WL1 and WL2 may have various shapes. For example, as illustrated in FIG. 10, the first surfaces WL_S1 of the first and second word lines WL1 and WL2 may be concavely rounded. In another example, as illustrated in FIG. 11, each of the first and second word lines WL1 and WL2 may have a spacer shape. In other words, the first surfaces WL_S1 of the first and second word lines WL1 and WL2 may be convexly rounded, e.g., bulging out.

Figure 12:
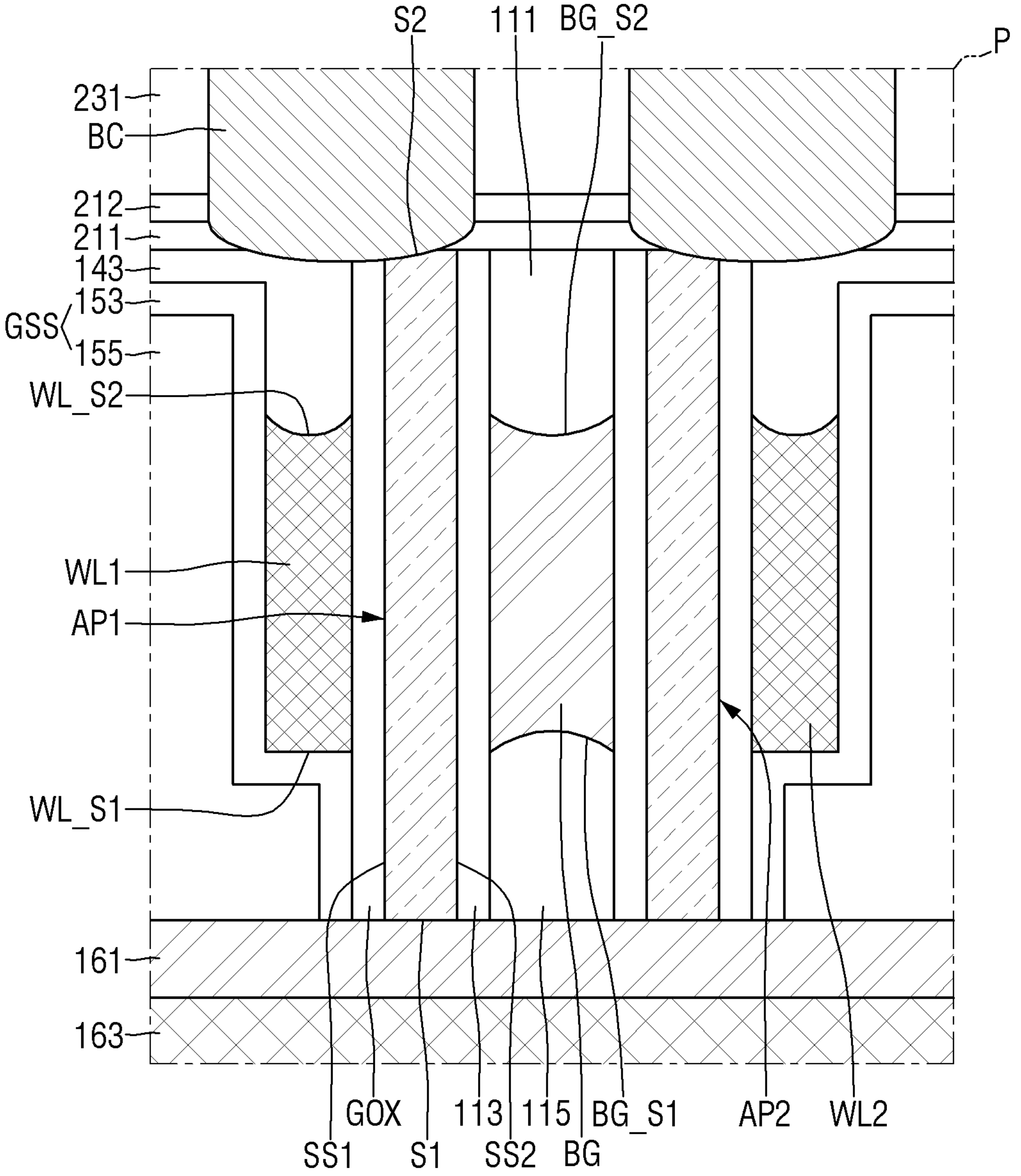

In FIGS. 5 and 12, which are cross-sectional views taken along the second direction D2, the second surfaces WL_S2 of the first and second word lines WL1 and WL2 may have concavely curved surfaces or may be flat surfaces. In addition, the first surface BG_S1 of the back gate electrode may have a concavely curved surface or may be a flat surface. In addition, the second surface BG_S2 of the back gate electrode may have a concavely curved surface or may be a flat surface. Unlike FIG. 12, one of the first surface BG_S1 of the back gate electrode and the second surface BG_S2 of the back gate electrode may be a flat surface.

Figure 13:
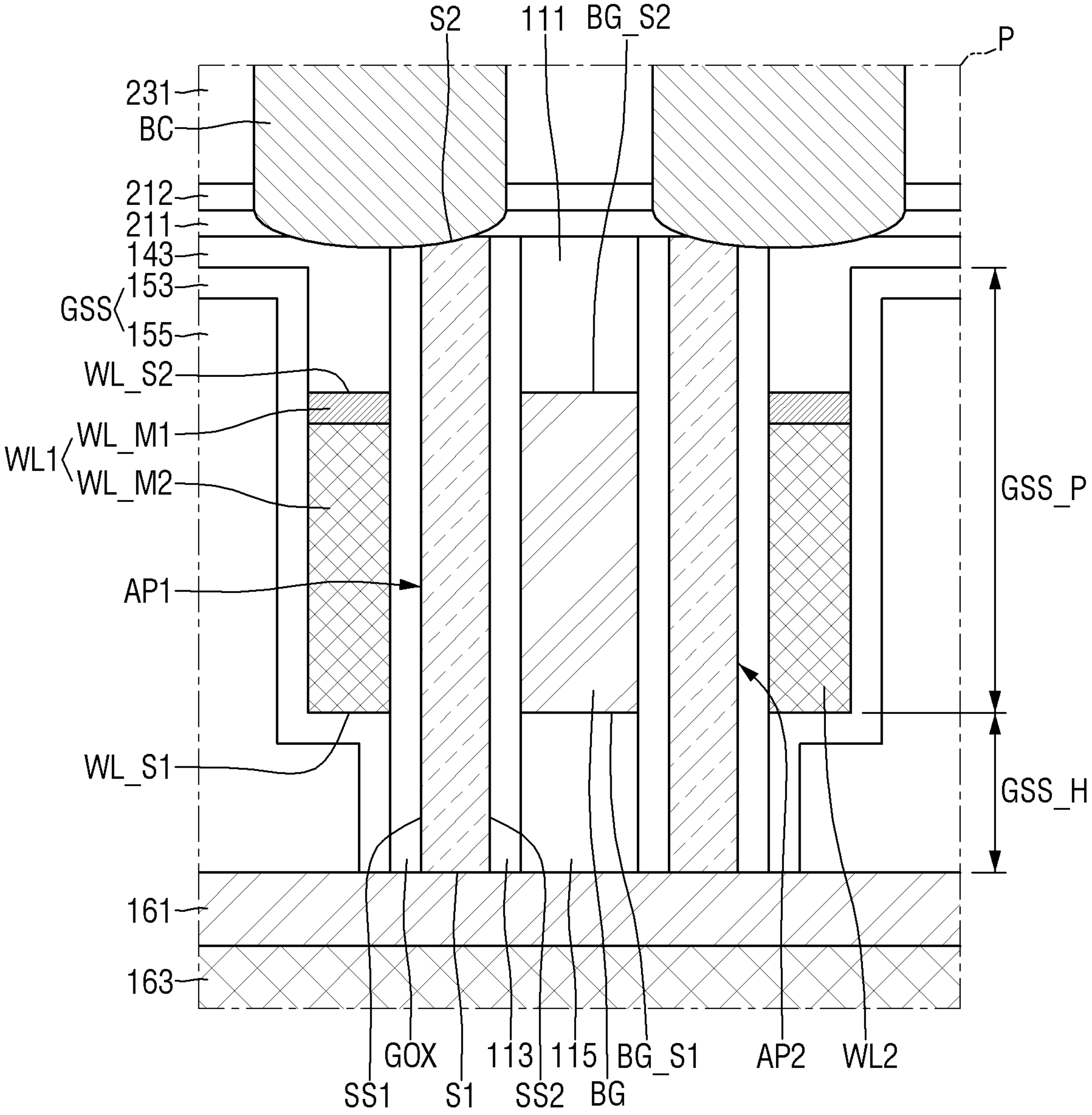
Figure 14:
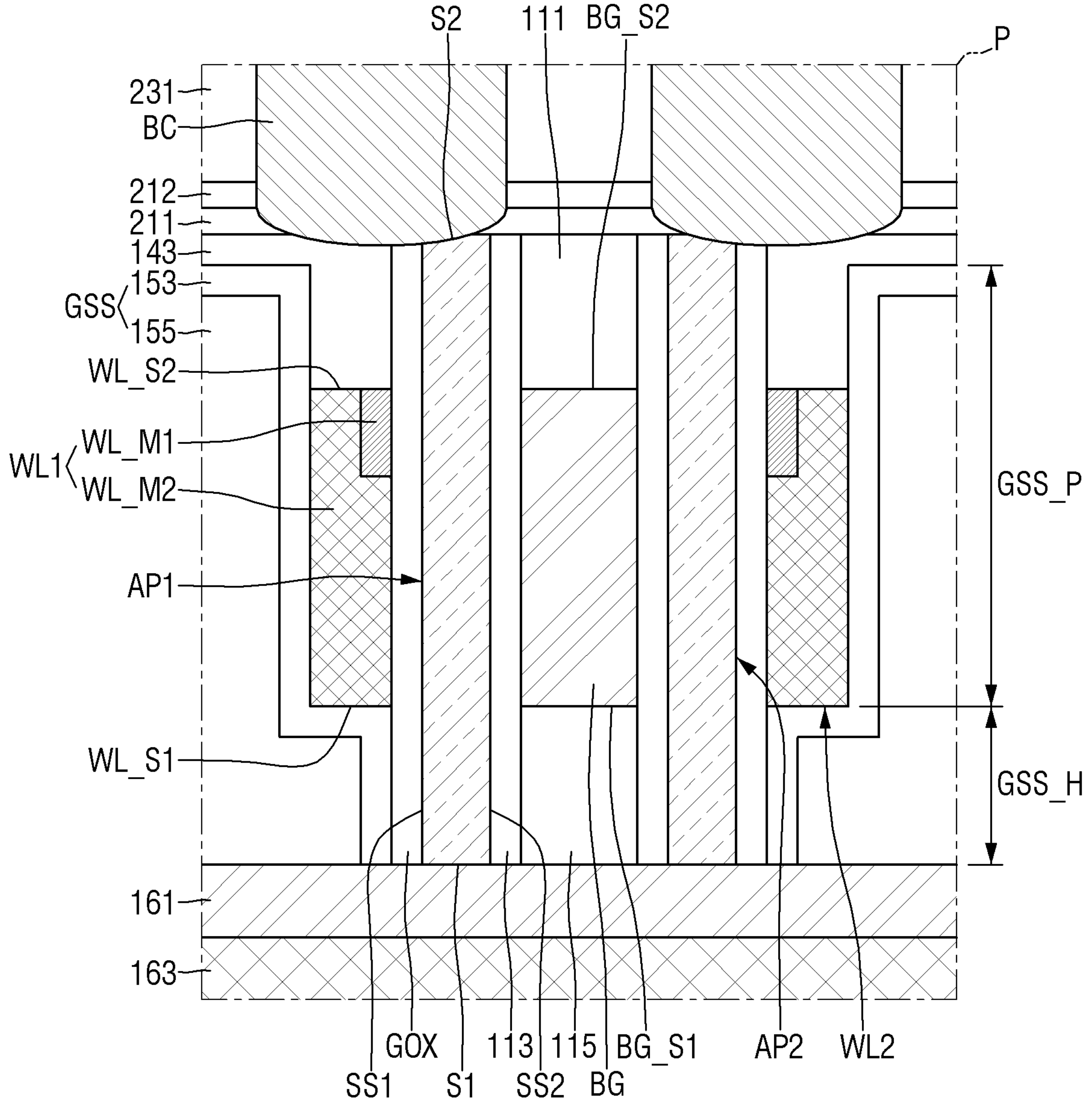

In FIGS. 13 and 14, each of the first word line WL1 and the second word line WL2 may include a first word line material film WL_M1 and a second word line material film WL_M2 that have different work functions.

In FIG. 13, the second surfaces WL_S2 of the first and second word lines WL1 and WL2 are defined by the first word line material film WL_M1 and are not defined by the second word line material film WL_M2. For example, as illustrated in FIG. 13, the first and second word lines material films WL_M1 and WL_M2 may be stacked on top of each other along the third direction D3, e.g., the first word line material film WL_M1 may completely cover an upper surface of the second word line material film WL_M2.

In FIG. 14, the first word line material film WL_M1 may extend along portions of the sidewalls SS1 and SS2 of the first and second active patterns AP1 and AP2 in a line shape. The second surfaces WL_S2 of the first and second word lines WL1 and WL2 may be defined by the first word line material film WL_M1 and the second word line material film WL_M2, e.g., upper surfaces of the first and second word line material films WL_M1 and WL_M2 may be coplanar with each other.

Each of the first word line WL1 and the second word line WL2 includes materials having different work functions. Thus, the threshold voltage of the vertical channel transistor may be well adjusted.

Gate insulating patterns GOX may be disposed between the first word line WL1 and the first active pattern AP1 and between the second word line WL2 and the second active patterns AP2. The gate insulating patterns GOX may extend in the first direction D1 in parallel with the first and second word lines WL1 and WL2. The gate insulating pattern GOX may include, e.g., a silicon oxide film, a silicon oxynitride film, a high-k insulating film having a dielectric constant higher than that of the silicon oxide film, or combinations thereof.

The gate insulating patterns GOX may extend along the first sidewall SS1 of the first active pattern AP1 and extend along the second sidewall SS2 of the second active pattern AP2. In the semiconductor memory device according to some example embodiments, in a cross-sectional view, the gate insulating pattern GOX between the first active pattern AP1 and the first word line WL1 may be isolated from the gate insulating pattern GOX between the second active pattern AP2 and the second word line WL2.

The gate capping patterns 143 may be disposed between the first word line WL1 and the contact pattern BC and between the second word line WL2 and the contact pattern BC. The gate capping patterns 143 may cover the second surfaces WL_S2 of the first and second word lines WL1 and WL2.

A gate isolation pattern GSS may be disposed on the bit line BL. The gate isolation pattern GSS may be disposed between the bit line BL and the contact patterns BC. The gate isolation pattern GSS may be in contact with the bit line BL.

The gate isolation pattern GSS may be disposed between the first word line WL1 and the second word line WL2 adjacent to each other in the second direction D2. The first word line WL1 and the second word line WL2 may be isolated from each other by the gate isolation pattern GSS. The gate isolation pattern GSS may extend in the first direction D1 between the first word line WL1 and the second word line WL2.

The first word line WL1 may be disposed between the gate isolation pattern GSS and the first active pattern AP1. The second word line WL2 may be disposed between the gate isolation pattern GSS and the second active pattern AP2.

The gate isolation pattern GSS may include a horizontal part GSS_H and a protrusion part GSS_P. The protrusion part GSS_P of the gate isolation pattern may protrude from the horizontal part GSS_H of the gate isolation pattern in the third direction D3, e.g., a combined cross-section of the protrusion part GSS_P with the horizontal part GSS_H may have an inverted T-shape (e.g., gate isolation filling film 155 in FIG. 3).

The horizontal part GSS_H of the gate isolation pattern may be closer to the bit line BL than the protrusion part GSS_P of the gate isolation pattern is. The horizontal part GSS_H of the gate isolation pattern may be in contact with the bit line BL. A width of the horizontal part GSS_H of the gate isolation pattern in the second direction D2 is greater than a width of the protrusion part GSS_P of the gate isolation pattern in the second direction D2.

The protrusion part GSS_P of the gate isolation pattern may be disposed between a sidewall of the first word line WL1 and a sidewall of the second word line WL2 facing each other. The horizontal part GSS_H of the gate isolation pattern may cover the first surfaces WL_S1 of the first and second word lines WL1 and WL2.

The first word line WL1 and the second word line WL2 are disposed on the horizontal part GSS_H of the gate isolation pattern. The first word line WL1 and the second word line WL2 may have a shape in which they are mounted on the horizontal part GSS_H of the gate isolation pattern. The first word line WL1 and the second word line WL2 may be disposed between the horizontal part GSS_H of the gate isolation pattern and the contact patterns BC.

The gate isolation pattern GSS may include a gate isolation liner 153 and a gate isolation filling film 155. The gate isolation liner 153 may extend along the first surfaces WL_S1 of the first and second word lines WL1 and WL2 and the sidewalls of the first and second word lines WL1 and WL2. The gate isolation liner 153 may be in contact with the gate insulating pattern GOX. Each of the gate isolation liner 153 and the gate isolation filling film 155 may be made of an insulating material. Unlike illustrated in the drawings, the gate isolation pattern GSS may be a single film.

In FIG. 26, the first and second word lines WL1 and WL2 and the back gate electrodes BG may extend from the cell array region CAR to first and second edge regions ER1 and ER2. The first edge region ER1 and the second edge region ER2 may be included in the peripheral circuit region PCR.

Each of the first and second word lines WL1 and WL2 may include a line portion extending in the first direction D1 and a protrusion portion extending in the second direction D2 and connected to the line portion. As an example, the protrusion portion of the first word line WL1 may be disposed in the second edge region ER2, and the protrusion portion of the second word line WL2 may be disposed in the first edge region ER1.

Furthermore, isolation insulating patterns 300 may be disposed in the first and second edge regions ER1 and ER2, respectively. The isolation insulating patterns 300 may vertically penetrate through the first and second word lines WL1 and WL2 in each of the first and second edge regions ER1 and ER2. The first and second word lines WL1 and WL2 may be electrically isolated from each other by the isolation insulating patterns 300 in the first and second edge regions ER1 and ER2.

In the first edge region ER1, a first word line contact plug CT1 may be connected to the second word line WL2. In the second edge region ER2, a second word line contact plug CT2 may be connected to the first word line WL1. A shape in which the first word line contact plug CT1 and the second word line contact plug CT2 are disposed is only an example for description, and any convenient shape, e.g., arrangement, may be implemented. Further, a method for isolating the first word line WL1 and the second word line WL2 from each other as illustrated in FIG. 26 is only an example, and any convenient isolation method or structure may be implemented.

The contact patterns BC may penetrate through a contact interlayer insulating film 231 and contact etch stop films 211 and 212. The contact patterns BC may be connected to the first and second active patterns AP1 and AP2, respectively. The contact patterns BC may be connected to the second surfaces S2 of the first and second active patterns AP1 and AP2.

Each of the contact patterns BC may have various shapes, e.g., a circular shape, an elliptical shape, a rectangular shape, a square shape, a rhombic shape, and a hexagonal shape, in a plan view. The contact pattern BC may include a conductive material, e.g., at least one of doped polysilicon, conductive metal nitride, conductive metal silicon nitride, metal carbonitride, conductive metal silicide, conductive metal oxide, a two-dimensional material, and a metal.

The contact etch stop films 211 and 212 may include a lower contact etch stop film 211 and an upper contact etch stop film 212. The lower contact etch stop film 211 and the upper contact etch stop film 212 may be sequentially stacked on the gate capping pattern 143 and the back gate isolation pattern 111. Unlike illustrated in the drawings, the contact etch stop film may be a single film. Each of the contact interlayer insulating film 231, the lower contact etch stop film 211, and the upper contact etch stop film 212 may be made of an insulating material.

Figure 15:
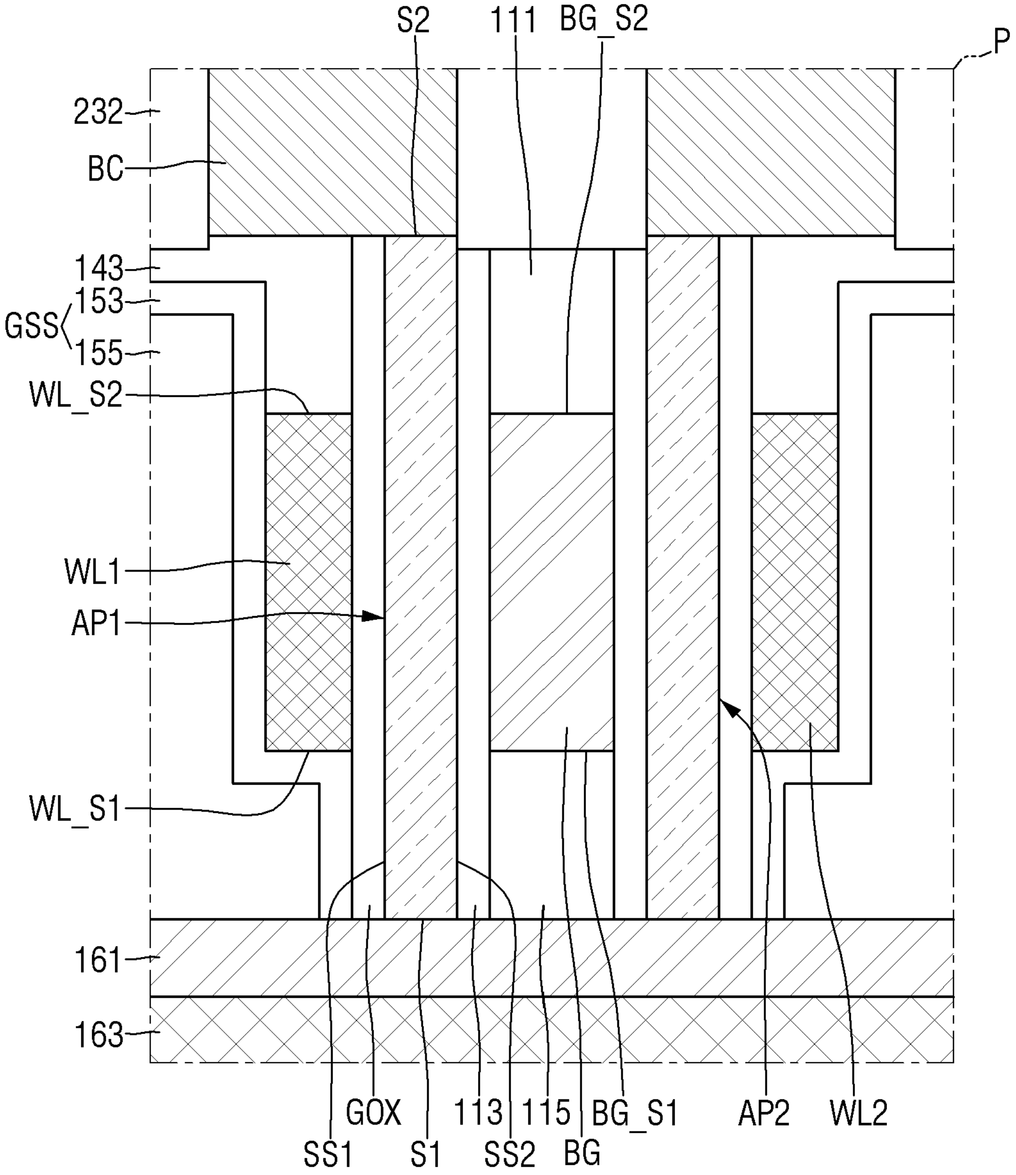
Figure 16:
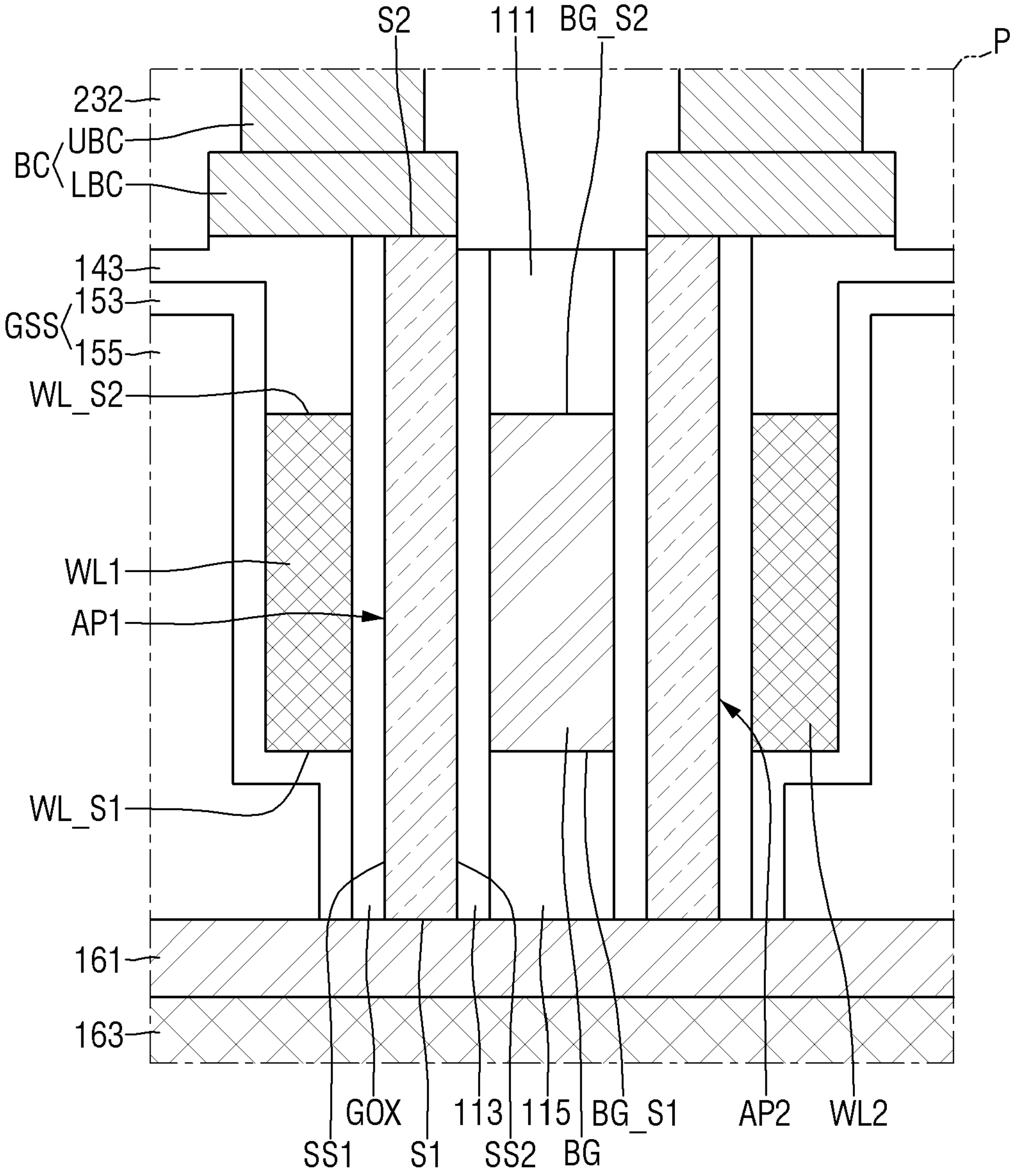
Figure 17:
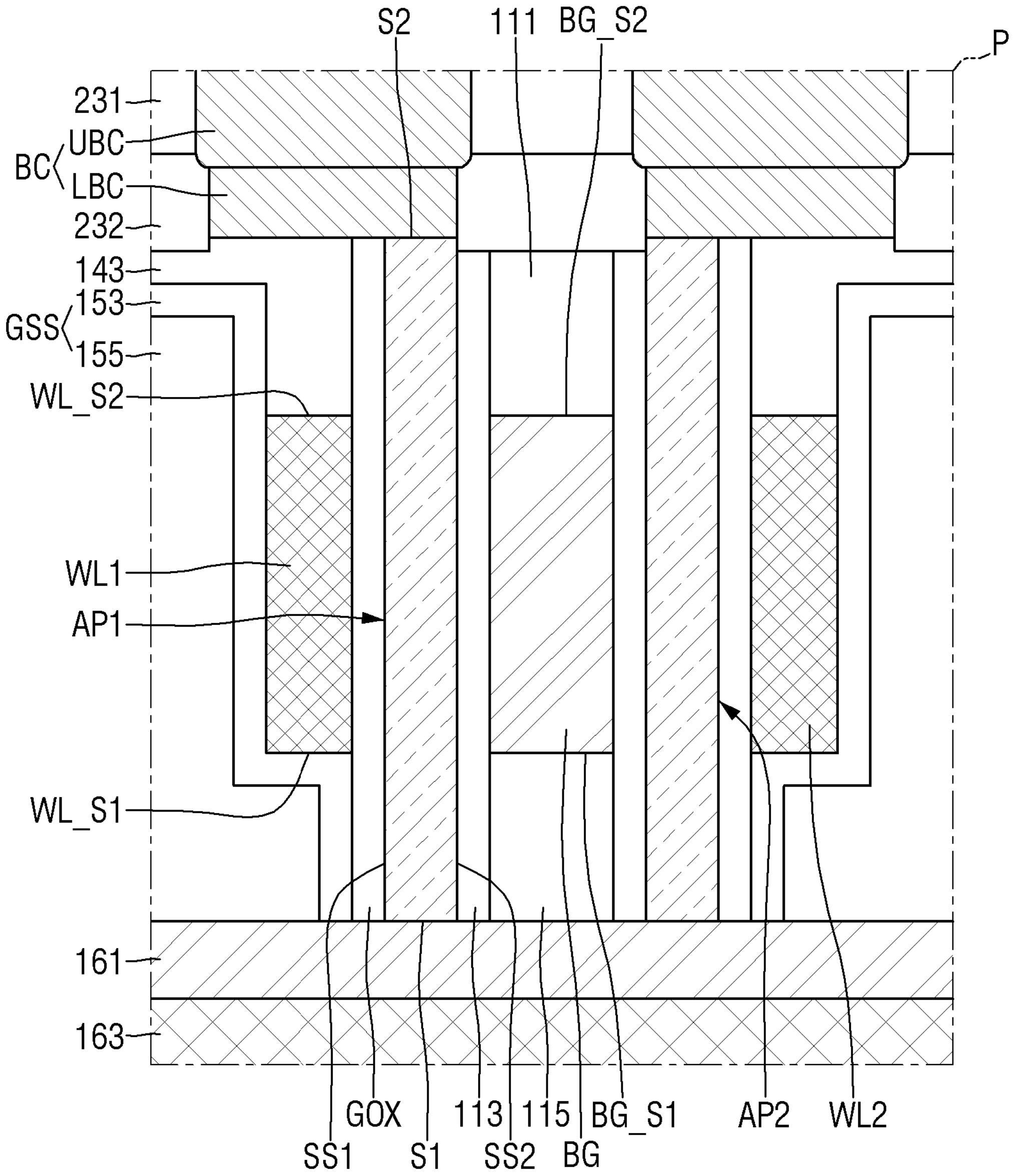

In FIGS. 15 to 17, the lower contact etch stop film 211 and the upper contact etch stop film 212 may not be disposed on the gate capping pattern 143 and the back gate isolation pattern 111.

For example, as illustrated in FIG. 15, the contact patterns BC may be formed in an embossing manner. More specifically, a contact film may be formed on the gate capping pattern 143, the back gate isolation pattern 111, and the second surfaces S2 of the first and second active patterns AP1 and AP2. Thereafter, the contact patterns BC may be formed by patterning the contact film. A contact isolation pattern 232 may be formed between the isolated contact patterns BC. The contact isolation pattern 232 may be made of an insulating material.

In FIGS. 16 and 17, each of the contact patterns BC may include a lower contact pattern LBC and an upper contact pattern UBC. The lower contact patterns LBC are in contact with the first and second active patterns AP1 and AP2. The upper contact patterns UBC are disposed on the lower contact patterns LBC. A concentration of impurities included in the lower contact pattern LBC may be higher than a concentration of impurities included in the upper contact pattern UBC.

For example, as illustrated in FIG. 16, each of the lower contact pattern LBC and the upper contact pattern UBC may be formed in an embossing manner. After the lower contact pattern LBC is formed in the embossing manner, the upper contact pattern UBC may also be formed in the embossing manner. The contact isolation pattern 232 may include a lower portion and an upper portion. The lower portion of the contact isolation pattern 232 may be formed in a process of forming the lower contact pattern LBC. The upper portion of the contact isolation pattern 232 may be formed in a process of forming the upper contact pattern UBC. It has been illustrated in FIG. 16 that a width of the lower contact pattern LBC in the horizontal direction (e.g., the second direction D2) is greater than a width of the upper contact pattern UBC in the horizontal direction.

In another example, as illustrated in FIG. 17, the lower contact pattern LBC may be formed in an embossing manner. The upper contact pattern UBC may be formed in an engraving manner. More specifically, after the lower contact pattern LBC and the contact isolation pattern 232 are formed, the contact interlayer insulating film 231 may be formed. The contact interlayer insulating film 231 may include a contact hole exposing at least a portion of the lower contact pattern LBC. Subsequently, the upper contact pattern UBC may be formed in the contact hole of the contact interlayer insulating film 231. It has been illustrated in FIG. 17 that a width of the lower contact pattern LBC in the horizontal direction (e.g., the second direction D2) is smaller than a width of the upper contact pattern UBC in the horizontal direction.

In FIGS. 18 to 21, the gate capping pattern 143 (see FIG. 5) is not disposed on the second surfaces WL_S2 of the first and second word lines WL1 and WL2. The gate insulating pattern GOX may cover the second surfaces WL_S2 of the first and second word lines WL1 and WL2. The back gate isolation pattern 111 (see FIG. 5) is not disposed on the second surface BG_S2 of the back gate electrode. The back gate insulating pattern 113 may cover the second surface BG_S2 of the back gate electrode.

Figure 18:
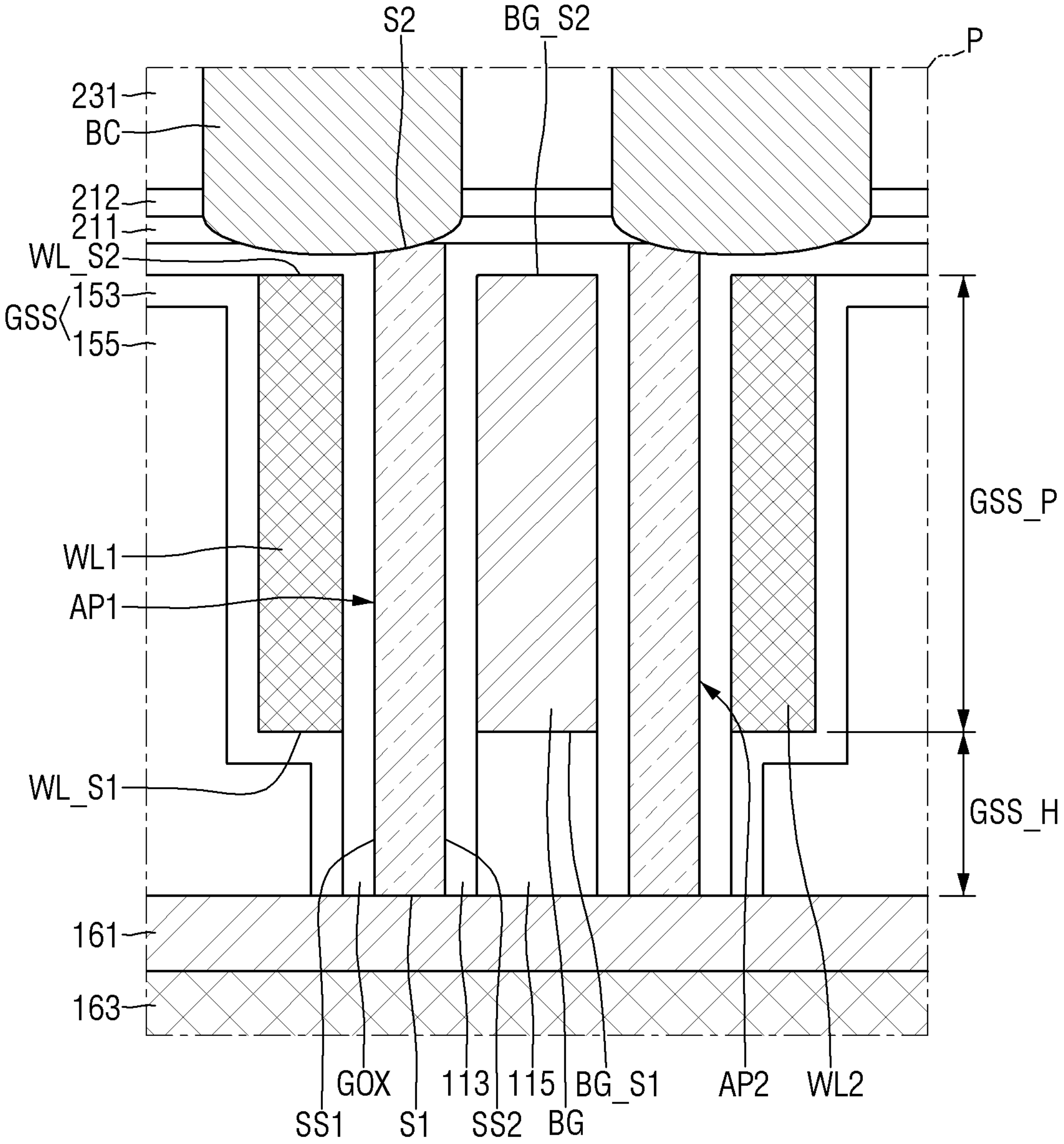

For example, as illustrated in FIG. 18, the contact patterns BC may penetrate through the contact interlayer insulating film 231 and the contact etch stop films 211 and 212. The contact patterns BC may be connected to the first and second active patterns AP1 and AP2, respectively. The contact patterns BC may be formed in an engraving manner.

Figure 19:
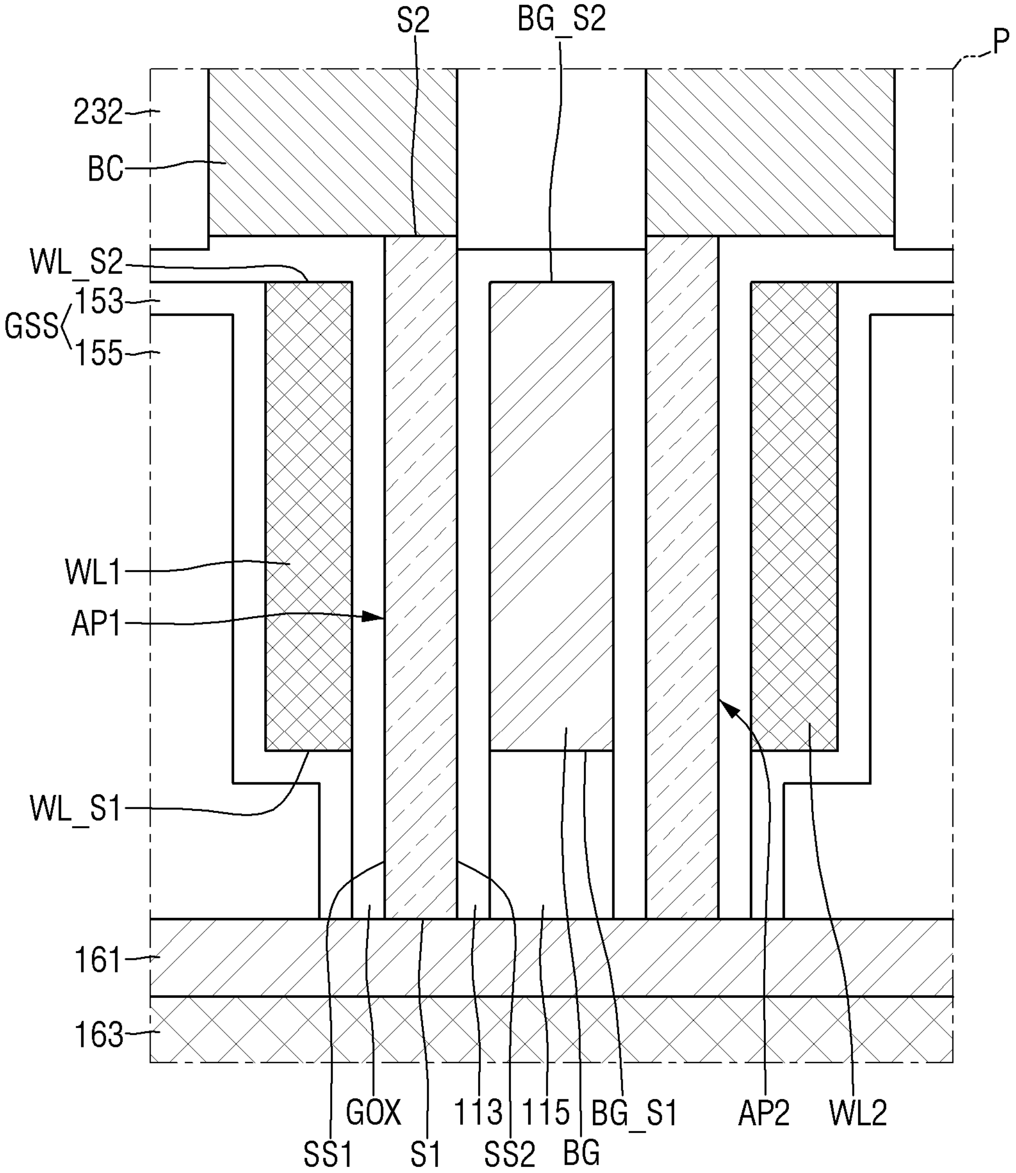
Figure 20:
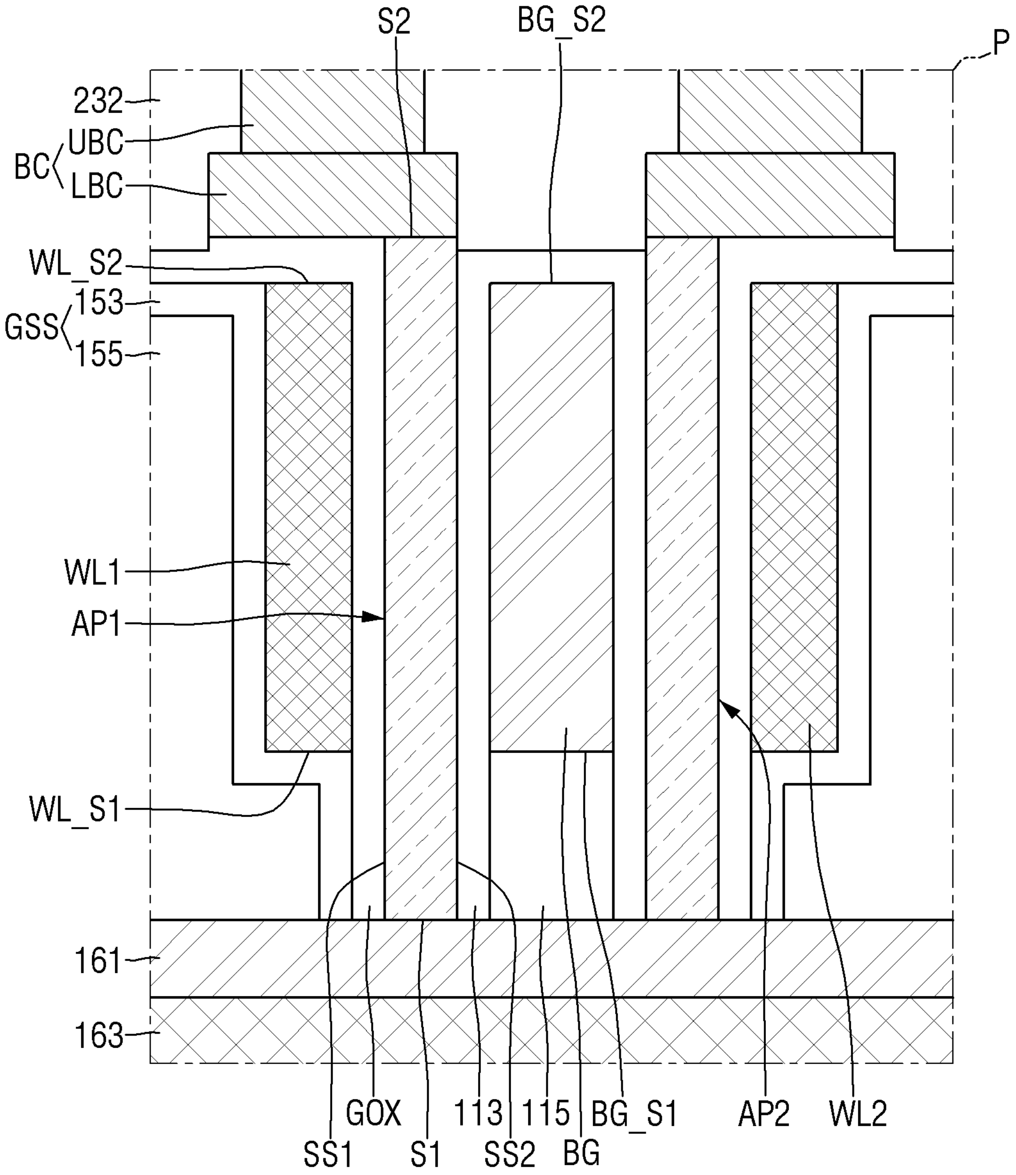
Figure 21:
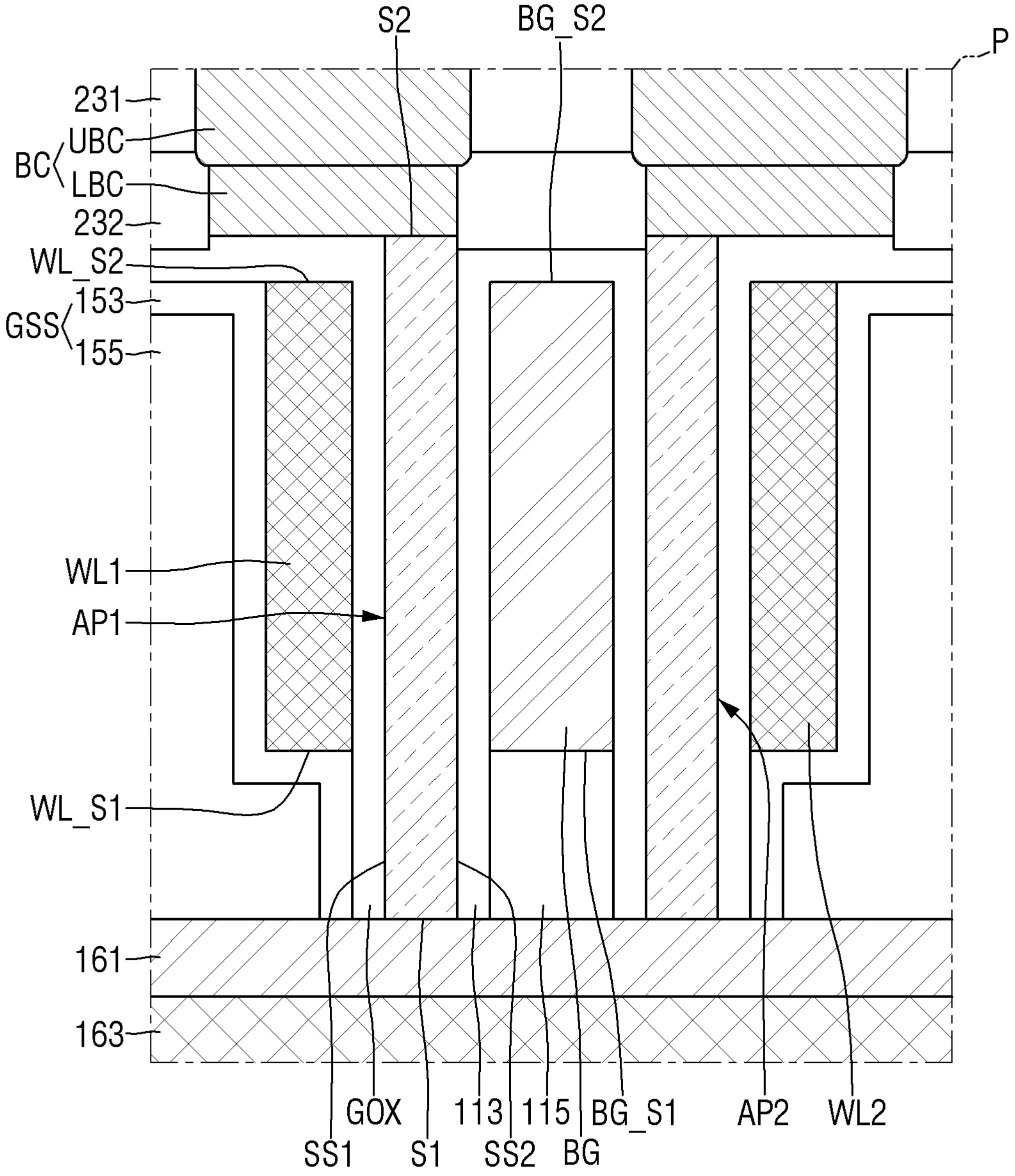

In FIGS. 19 to 21, the lower contact etch stop film 211 and the upper contact etch stop film 212 may not be disposed on the gate insulating pattern GOX and the back gate insulating pattern 113. For example, as illustrated in FIG. 19, the contact patterns BC may be formed in an embossing manner. A description of FIG. 19 may be substantially similar to the description of FIG. 15.

In FIGS. 20 and 21, each of the contact patterns BC may include a lower contact pattern LBC and an upper contact pattern UBC. A concentration of impurities included in the lower contact pattern LBC may be higher than a concentration of impurities included in the upper contact pattern UBC.

In FIG. 20, each of the lower contact pattern LBC and the upper contact pattern UBC may be formed in an embossing manner. In FIG. 21, the lower contact pattern LBC may be formed in an embossing manner. The upper contact pattern UBC may be formed in an engraving manner.

Landing pads LP may be disposed on the contact patterns BC. In a plan view, the landing pads LP may have various shapes, e.g., a circular shape, an elliptic shape, a rectangular shape, a square shape, a rhombic shape, and a hexagonal shape.

Pad isolation insulating patterns 235 may be disposed between the landing pads LP. In a plan view, the landing pads LP may be arranged in a matrix shape along the first direction D1 and the second direction D2. An upper surface of the landing pad LP may be substantially coplanar with an upper surface of the pad isolation insulating pattern 235. The landing pad LP may include a conductive material, e.g., at least one of doped polysilicon, conductive metal nitride, conductive metal silicon nitride, metal carbonitride, conductive metal silicide, conductive metal oxide, a two-dimensional material, and a metal.

The data storage patterns DSP may be disposed on the landing pads LP, respectively. The data storage patterns DSP may be electrically connected to the first and second active patterns AP1 and AP2, respectively. The data storage patterns DSP may be arranged in a matrix shape along the first direction D1 and the second direction D2, as illustrated in FIG. 2. The data storage patterns DSP may completely overlap or partially overlap the landing pads LP in the third direction D3. The data storage patterns DSP may be in contact with the entirety or portions of the upper surfaces of the landing pads LP.

For example, as illustrated in FIG. 3, the data storage patterns DSP may be capacitors. The data storage patterns DSP may include a capacitor dielectric film 253 interposed between storage electrodes 251 and a plate electrode 255. In this case, the storage electrode 251 may be in contact with the landing pad LP. In a plan view, the storage electrode 251 may have various shapes, e.g., a circular shape, an elliptic shape, a rectangular shape, a square shape, a rhombic shape, and a hexagonal shape. The data storage patterns DSP may completely overlap or partially overlap the landing pads LP. The data storage patterns DSP may be in contact with the entirety or portions of the upper surfaces of the landing pads LP. The storage electrodes 251 may penetrate through an upper etch stop film 247. The upper etch stop film 247 may be made of an insulating material.

In another example, the data storage patterns DSP may be variable resistance patterns that may be switched to two resistance states by an electrical pulse applied to a memory element. For example, the data storage patterns DSP may include phase-change materials whose crystal states change according to an amount of current, perovskite compounds, transition metal oxide, magnetic materials, ferromagnetic materials, or antiferromagnetic materials.

Although not illustrated in the drawings, memory cell contact plugs connected to the plate electrode 255 may be disposed on the data storage patterns DSP.

Lower peripheral contact plugs LPLGa, LPLGb, and LPLGc penetrate through an element isolation film STI. The lower peripheral contact plugs LPLGa, LPLGb, and LPLGc may be connected to the metal pattern 163 disposed at the end of the bit line BL, the connection portion SLc of the shielding conductive pattern, and the peripheral wiring line 241*a*. The lower peripheral contact plug LPLGa connected to the metal pattern 163 disposed at the end of the bit line BL may be a portion of the bit line contact plug CT4 illustrated in FIG. 27. The lower peripheral contact plug LPLGb connected to the connection portion SLc of the shielding conductive pattern may be a portion of the shielding pattern contact plug CT3 illustrated in FIG. 27.

Contact plug pads PLP may be disposed on the lower peripheral contact plugs LPLGa, LPLGb, and LPLGc. The pad isolation insulating patterns 235 may be disposed between the contact plug pads PLP.

Upper peripheral contact plugs PPLG penetrate through an upper interlayer insulating film 270 and the upper etch stop film 247. The upper peripheral contact plugs PPLG may be disposed on the contact plug pads PLP. The upper peripheral contact plugs PPLG may be connected to the contact plug pads PLP.

Each of the lower peripheral contact plugs LPLGa, LPLGb, and LPLGc, the contact plug pads PLP, and the upper peripheral contact plugs PPLG may include a conductive material, e.g., at least one of doped polysilicon, conductive metal nitride, conductive metal silicon nitride, metal carbonitride, conductive metal silicide, conductive metal oxide, a two-dimensional material, and a metal.

FIGS. 28 to 32 are views for describing a semiconductor memory device according to some example embodiments. For convenience of explanation, contents different from those described with reference to FIGS. 1 to 27 will be mainly described.

Figure 28:
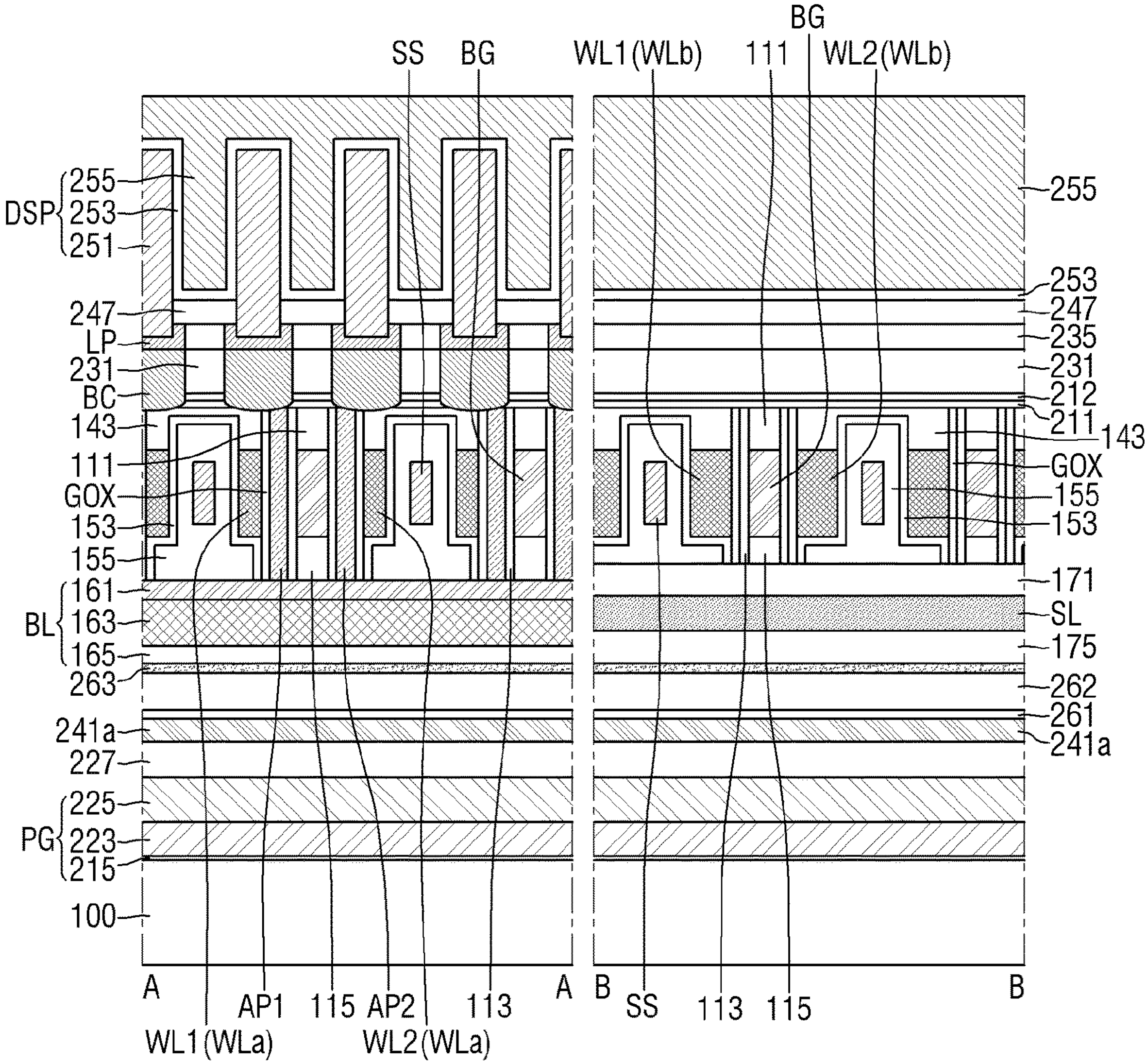
FIGS. 28 to 32 are views of a semiconductor memory device according to some example embodiments.

Referring to FIG. 28, a semiconductor memory device according to some example embodiments may further include an intermediate structure SS between the first and second word lines WL1 and WL2 adjacent to each other. The intermediate structure SS may extend in the first direction D1 in parallel with the first and second word lines WL1 and WL2. The intermediate structure SS may decrease coupling noise between the first and second word lines WL1 and WL2 adjacent to each other.

The intermediate structure SS may be an air gap surrounded by the gate isolation filling film 155. Alternatively, the intermediate structure SS may be a shielding line made of a conductive material.

Figure 29:
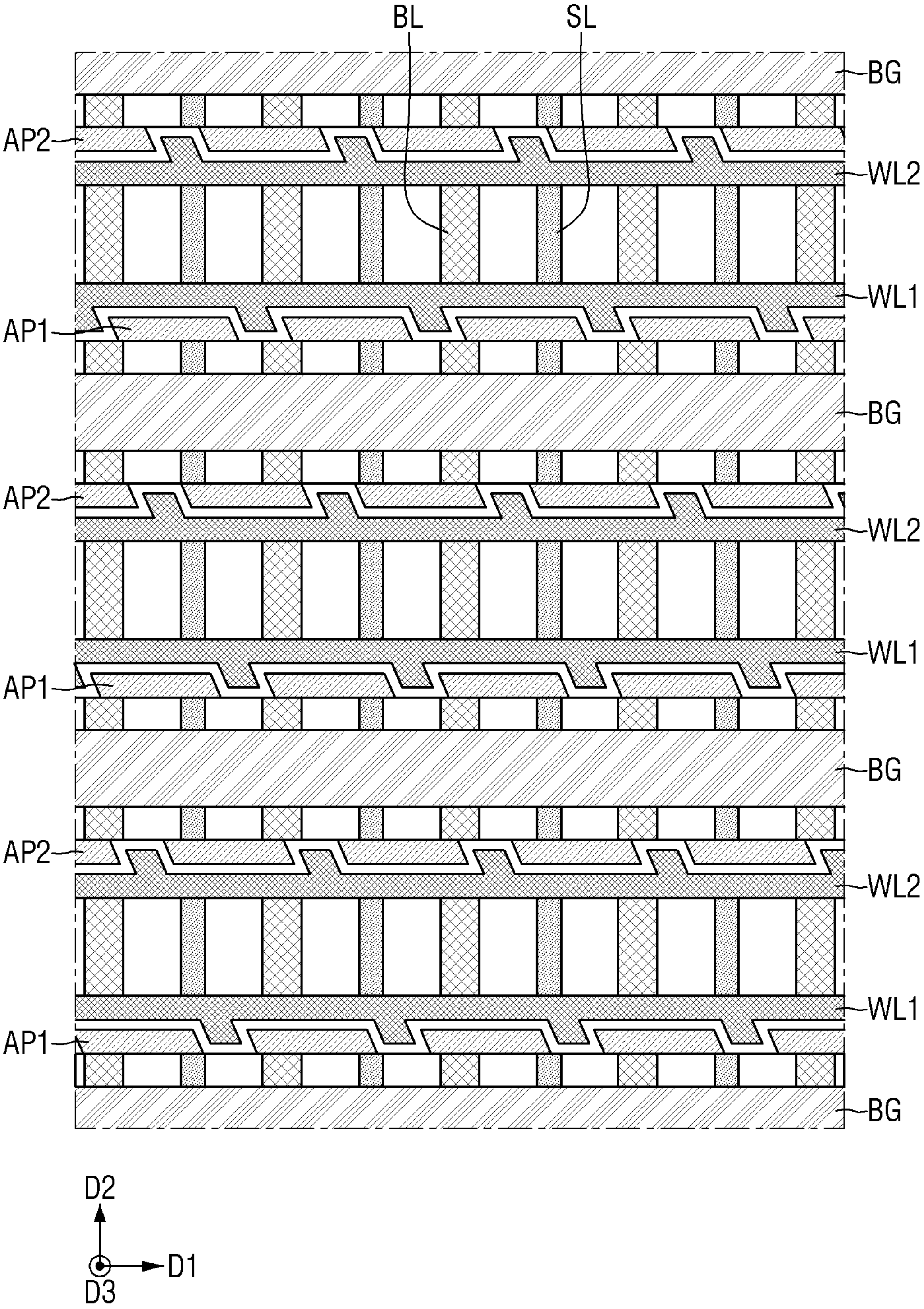

Referring to FIG. 29, in the semiconductor memory device according to some example embodiments, the first and second active patterns AP1 and AP2 may be alternately arranged in an oblique direction with respect to the first direction D1 and the second direction D2. Here, the oblique direction may be parallel to an upper surface of the substrate 100.

In a plan view, each of the first and second active patterns AP1 and AP2 may have a parallelogram shape or a rhombic shape. Since the first and second active patterns AP1 and AP2 are disposed in the oblique direction, coupling between the first and second active patterns AP1 and AP2 facing each other in the second direction D2 may be decreased.

Figure 30:
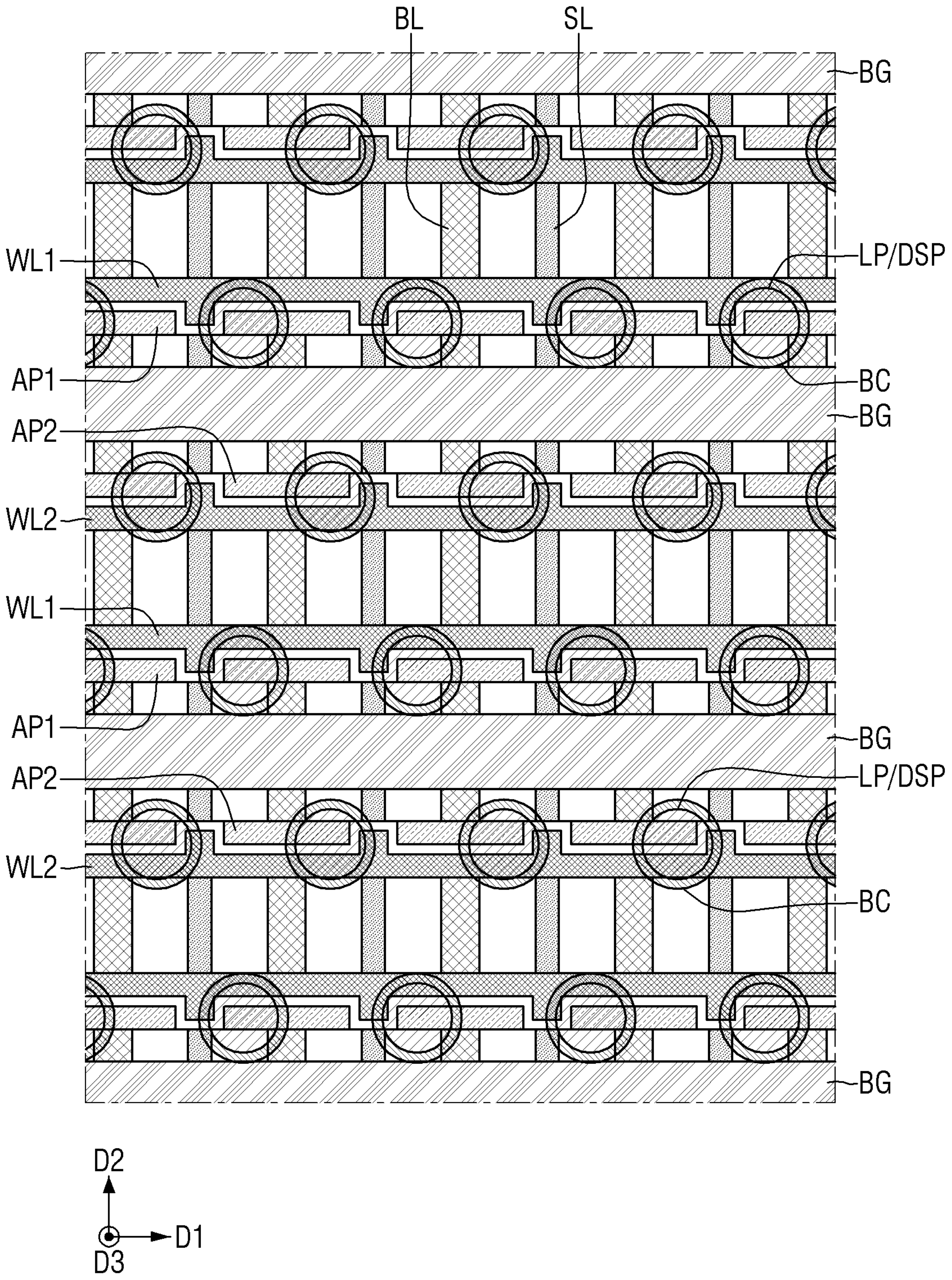

Referring to FIG. 30, in the semiconductor memory device according to some example embodiments, the landing pads LP and the data storage patterns DSP may also be arranged in a zigzag shape or a honeycomb shape in a plan view.

Figure 31:
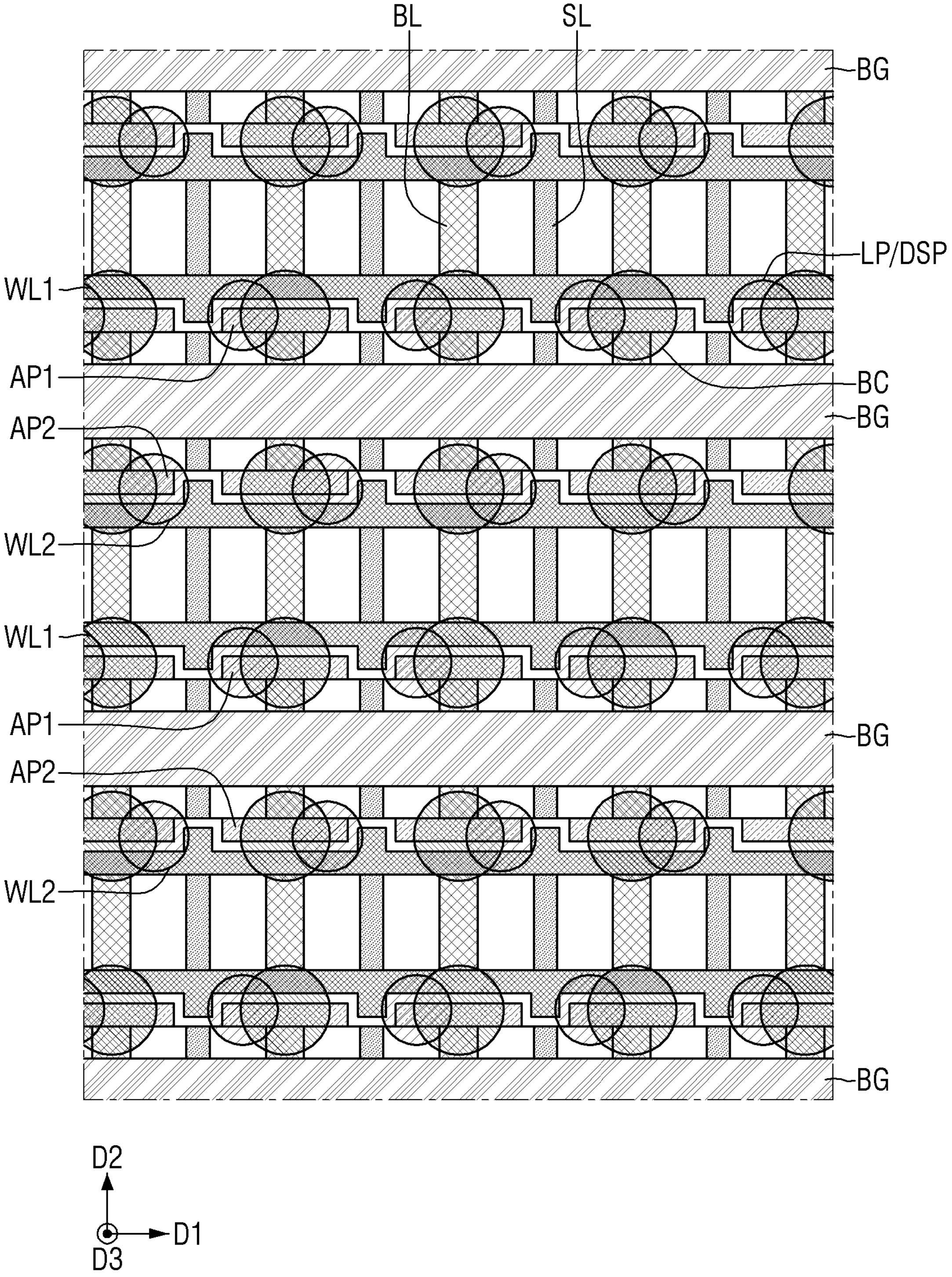

Referring to FIG. 31, in the semiconductor memory device according to some example embodiments, the data storage patterns DSP may be disposed to be misaligned with the landing pads LP in a plan view. Each data storage pattern DSP may be in contact with a portion of the landing pad LP.

Figure 32:
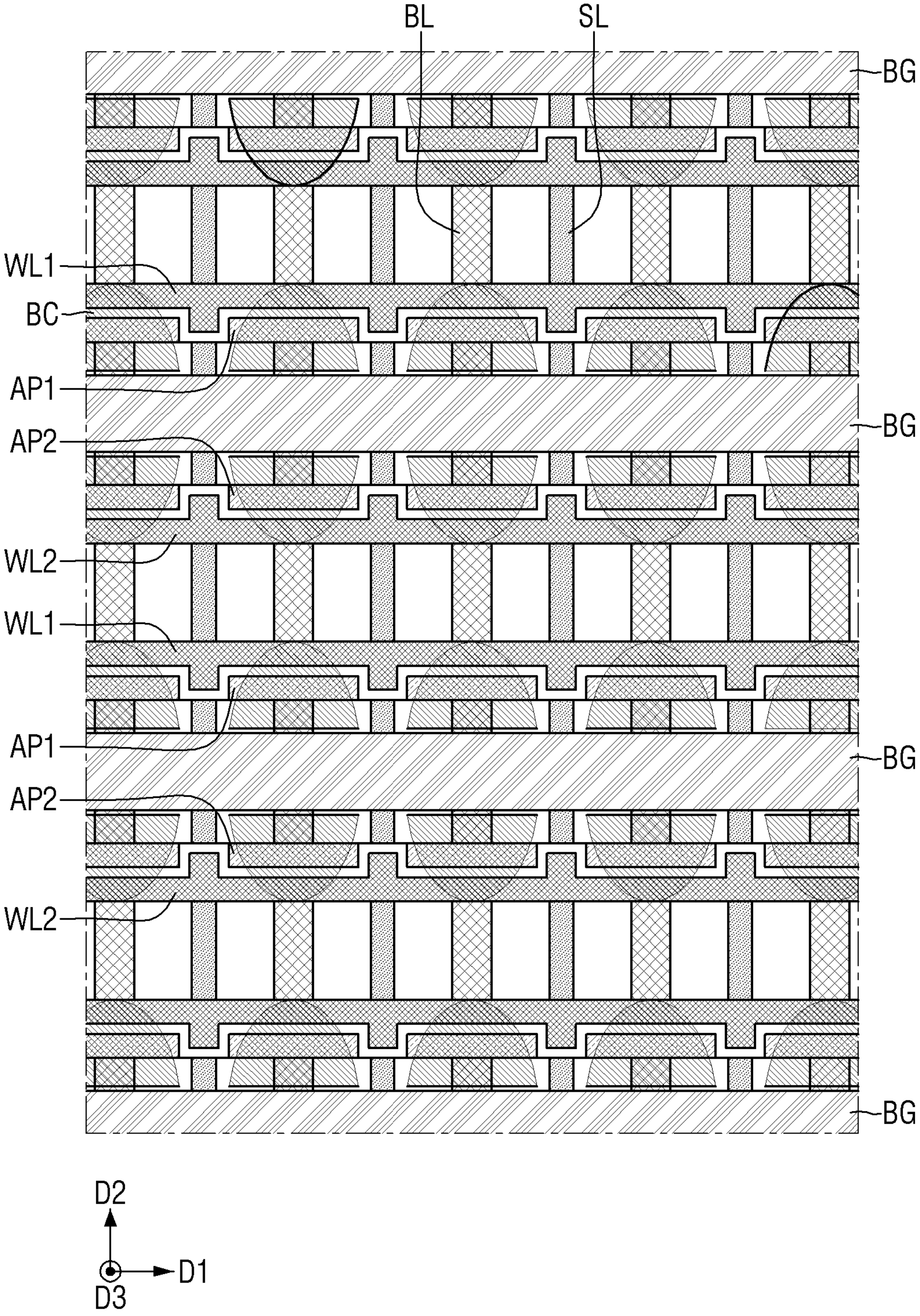

Referring to FIG. 32, in the semiconductor memory device according to some example embodiments, each of the contact patterns BC disposed on the first and second active patterns AP1 and AP2 may have a semi-circular shape or a semi-elliptical shape in a plan view. The contact patterns BC may be disposed to be symmetric to each other with the back gate electrode BG interposed therebetween in a plan view.

Figure 33:
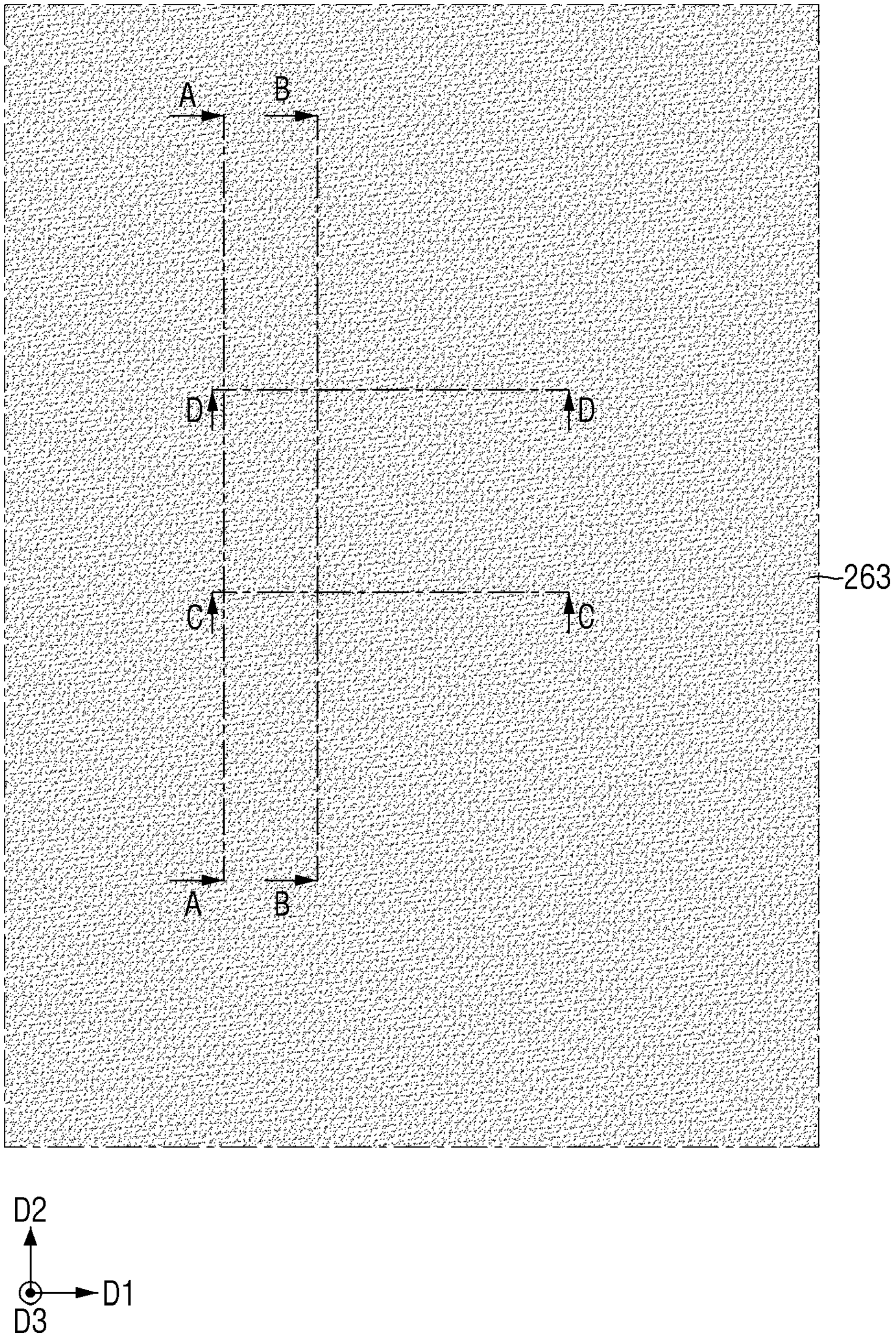
FIGS. 33 to 103 are stages in a method for fabricating a semiconductor memory device according to some example embodiments.
Figure 91:
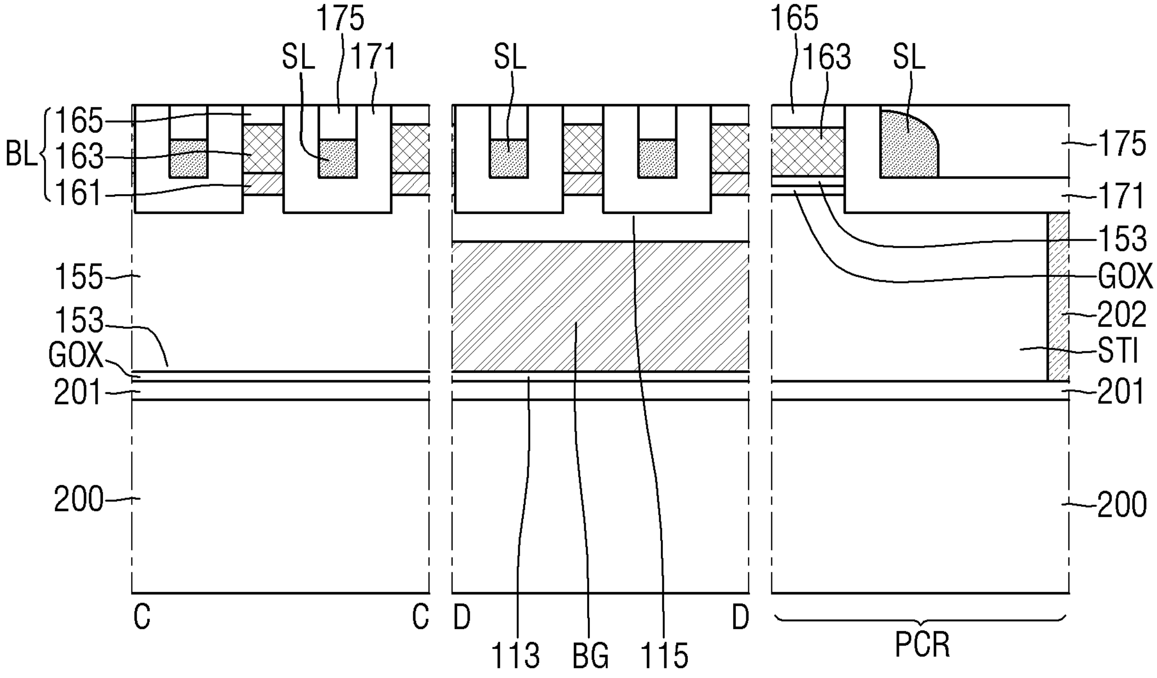
Figure 103:
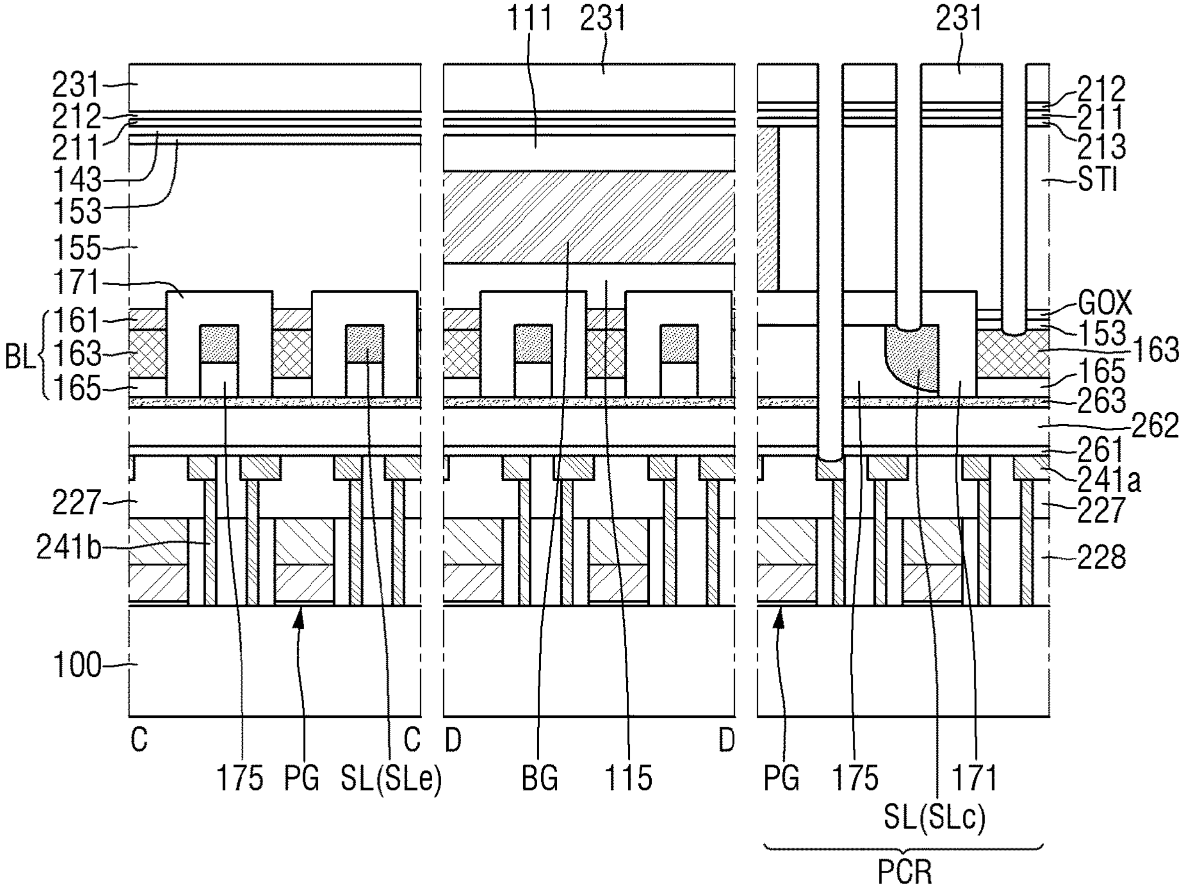

FIGS. 33 to 103 are views for describing a method for fabricating a semiconductor memory device according to some example embodiments. For reference, cutting lines and coordinate systems illustrated in FIGS. 36 to 91 are in a state in which cutting lines and a coordinate system of FIG. 2 are inverted in the first direction D1.

Figure 34:
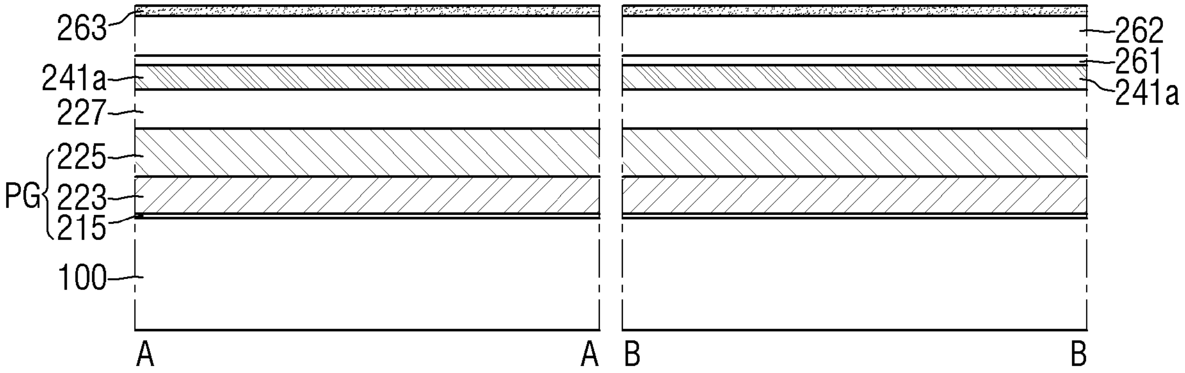
Figure 35:
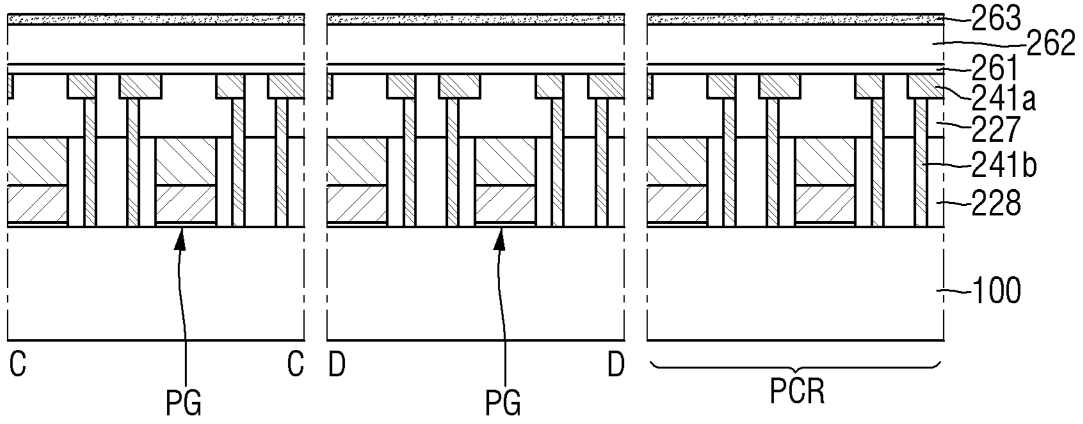

Referring to FIGS. 33 to 35, the peripheral gate structure PG may be formed on the substrate 100. The peripheral wiring line 241*a* and the peripheral contact plugs 241*b* may be formed on the substrate 100. The first peripheral upper insulating film 261 and the second peripheral upper insulating film 262 may be sequentially formed on the peripheral wiring line 241*a* and the peripheral contact plugs 241*b*. The bonding insulating film 263 may be formed on the second peripheral upper insulating film 262.

Figure 36:
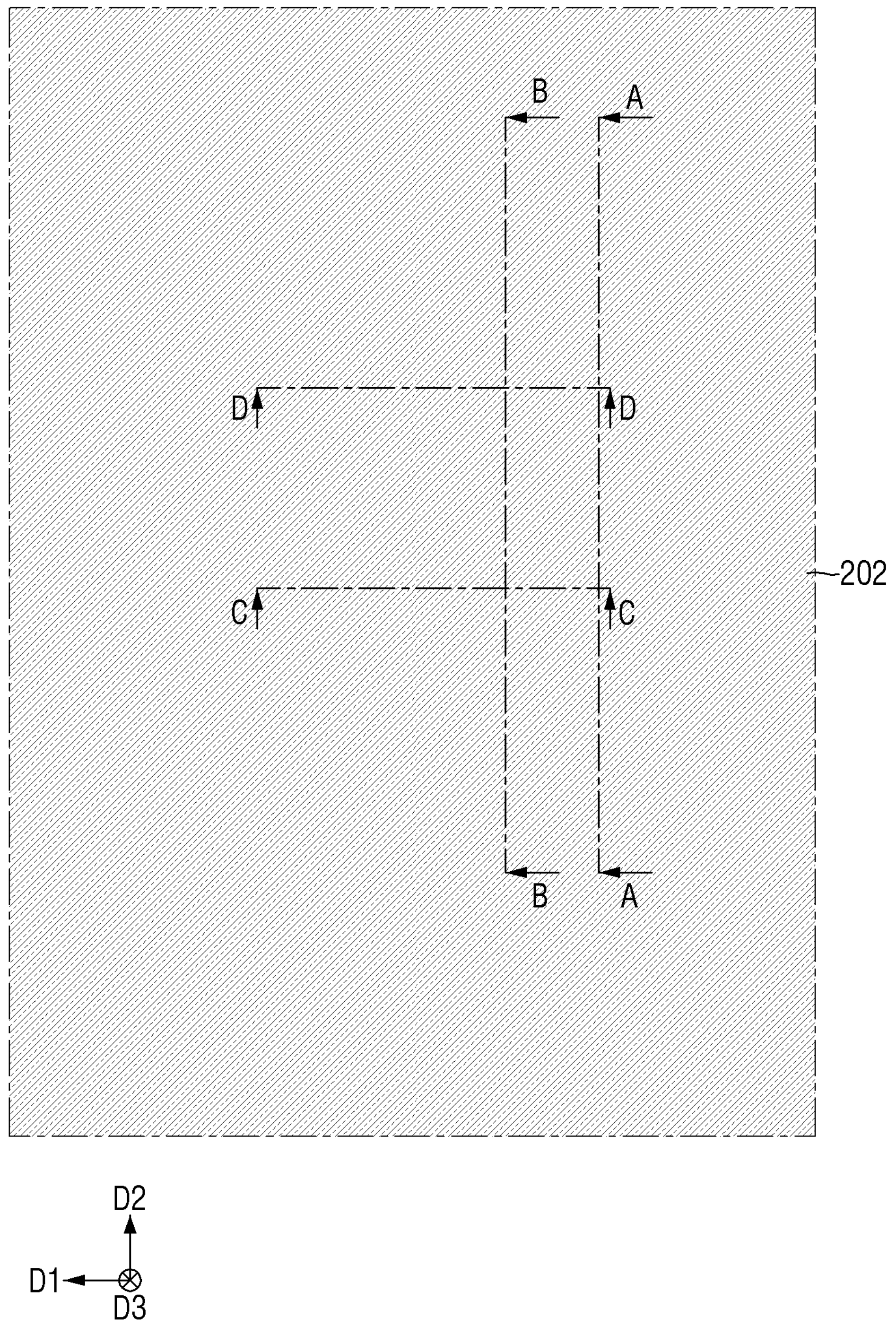
Figure 37:
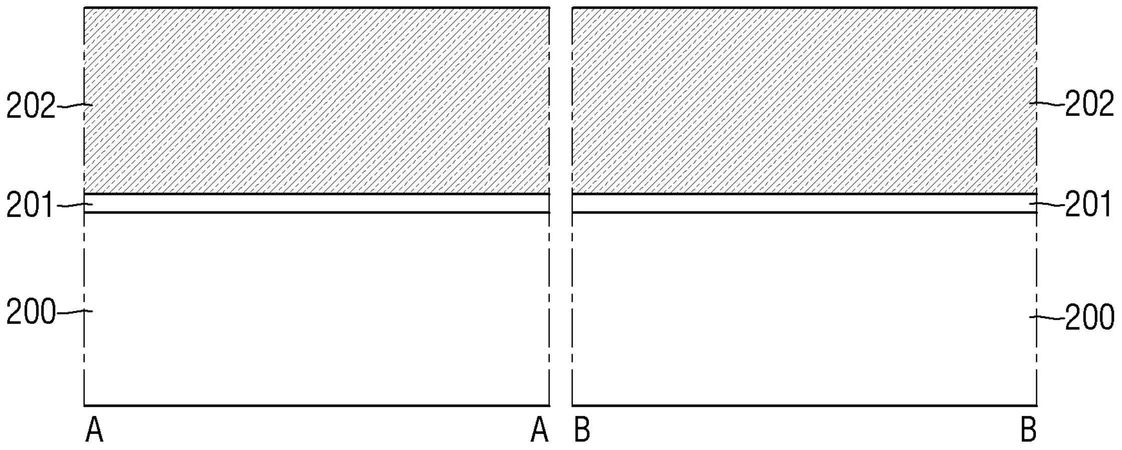
Figure 38:
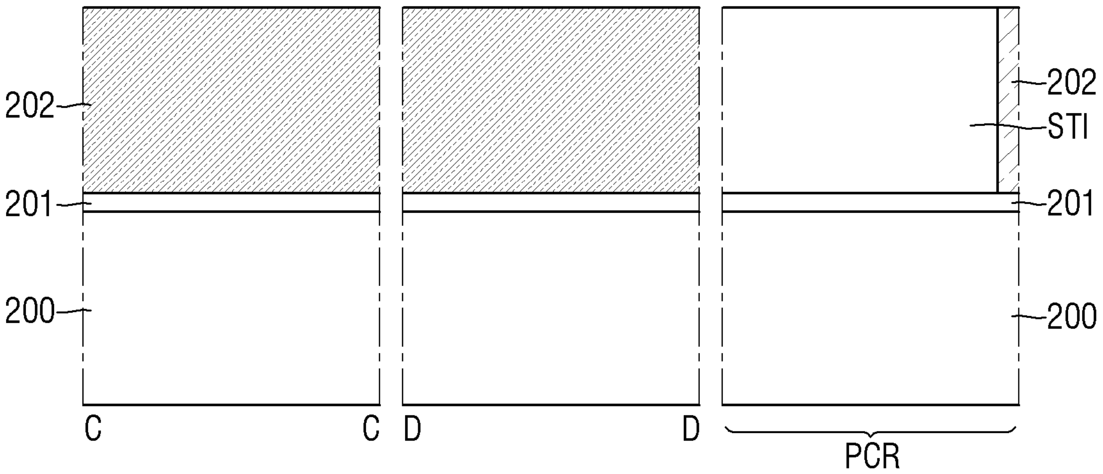

Referring to FIGS. 36 to 38, a sub-substrate structure including a sub-substrate 200, a buried insulating layer 201, and an active layer 202 may be provided. The buried insulating layer 201 and the active layer 202 may be provided on the sub-substrate 200. The sub-substrate 200, the buried insulating layer 201, and the active layer 202 may be a silicon-on-insulator substrate (i.e., an SOI substrate).

The sub-substrate 200 may include the cell array region CAR and the peripheral circuit region PCR. The sub-substrate 200 may be, e.g., a silicon substrate, a germanium substrate, a silicon-germanium substrate, or the like.

The buried insulating layer 201 may be a buried oxide (BOX) formed by a separation by an implanted oxygen (SIMO) method or a bonding and layer transfer method. Alternatively, the buried insulating layer 201 may be an insulating film formed by a chemical vapor deposition method. The buried insulating layer 201 may include, e.g., a silicon oxide film, a silicon nitride film, a silicon oxynitride film, and/or a low-k insulating film.

The active layer 202 may be a single crystal semiconductor film. The active layer 202 may be, e.g., a single crystal silicon substrate, a germanium substrate, a silicon-germanium substrate, or the like. The active layer 202 may have first and second surfaces opposite to each other in the third direction D3, and the second surface of the active layer 202 may be in contact with the buried insulating layer 201.

The element isolation film STI may be formed in the active layer 202 of the peripheral circuit region PCR. The element isolation film STI may be formed by patterning the active layer 202 of the peripheral circuit region PCR to form an element isolation trench exposing the buried insulating layer 201, and then filling the element isolation trench with an insulating material. An upper surface of the element isolation film STI may be substantially coplanar with the first surface of the active layer 202.

Figure 39:
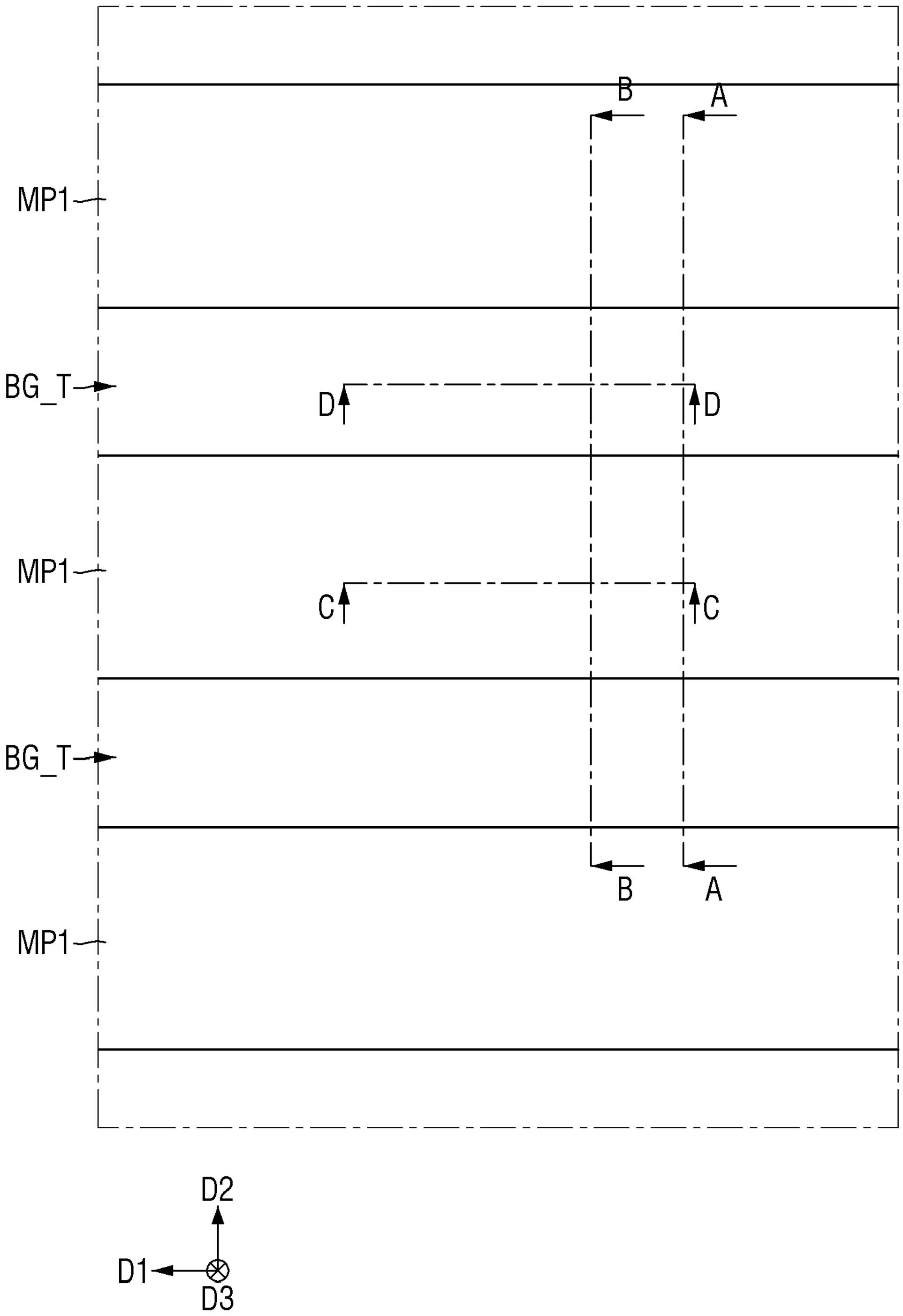
Figure 40:
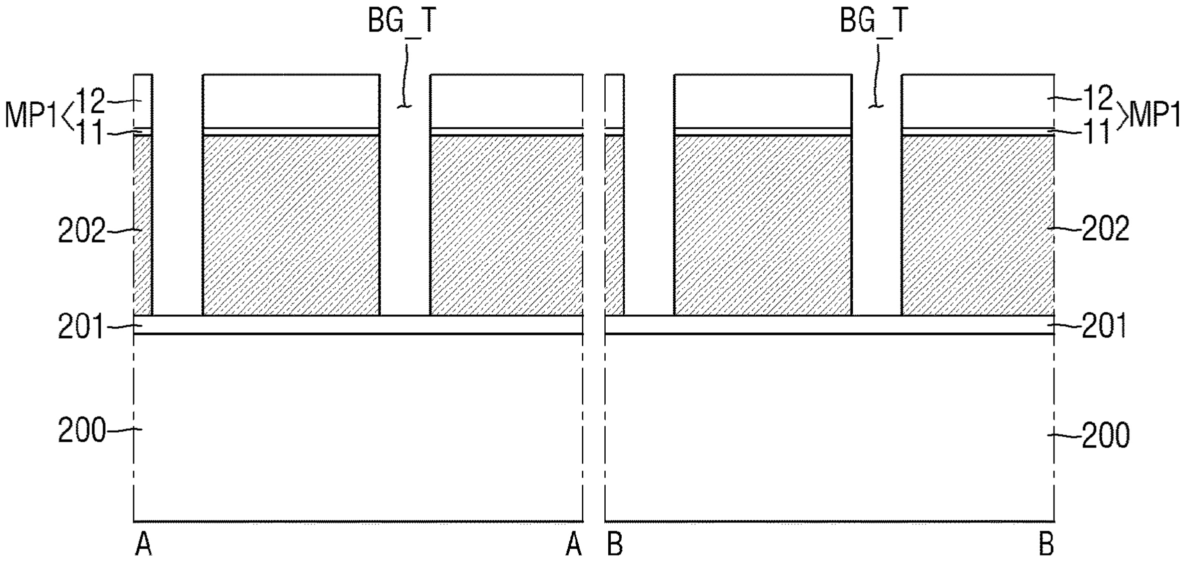
Figure 41:
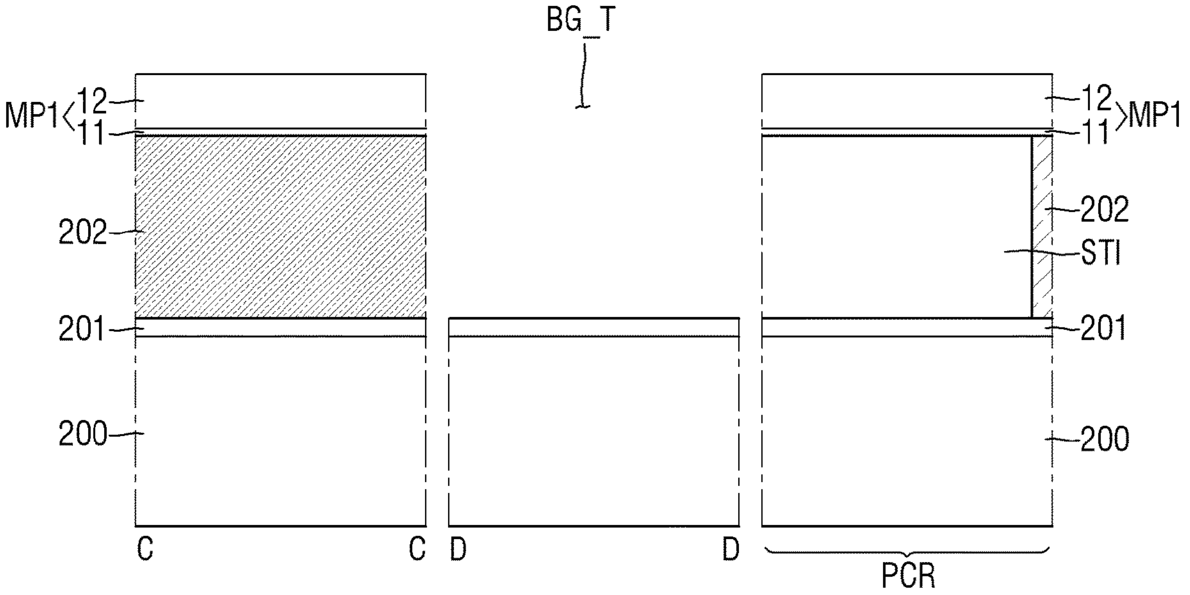

Referring to FIGS. 39 to 41, a first mask pattern MP1 may be formed on the active layer 202. The first mask pattern MP1 may have line-shaped openings extending in the first direction D1 from the cell array region CAR. The first mask pattern MP1 may include a first lower mask film 11 and a first upper mask film 12 that are sequentially stacked.

The first upper mask film 12 may be made of a material having etch selectivity with respect to the first lower mask film 11. As an example, the first lower mask film 11 may include silicon oxide, and the first upper mask film 12 may include silicon nitride.

Subsequently, the active layer 202 of the cell array region CAR may be anisotropically etched using the first mask pattern MP1 as an etch mask. Accordingly, back gate trenches BG_T extending in the first direction D1 may be formed in the active layer 202 of the cell array region CAR. The back gate trenches BG_T may expose the buried insulating layer 201, and may be spaced apart from each other by a predetermined distance in the second direction D2.

Figure 42:
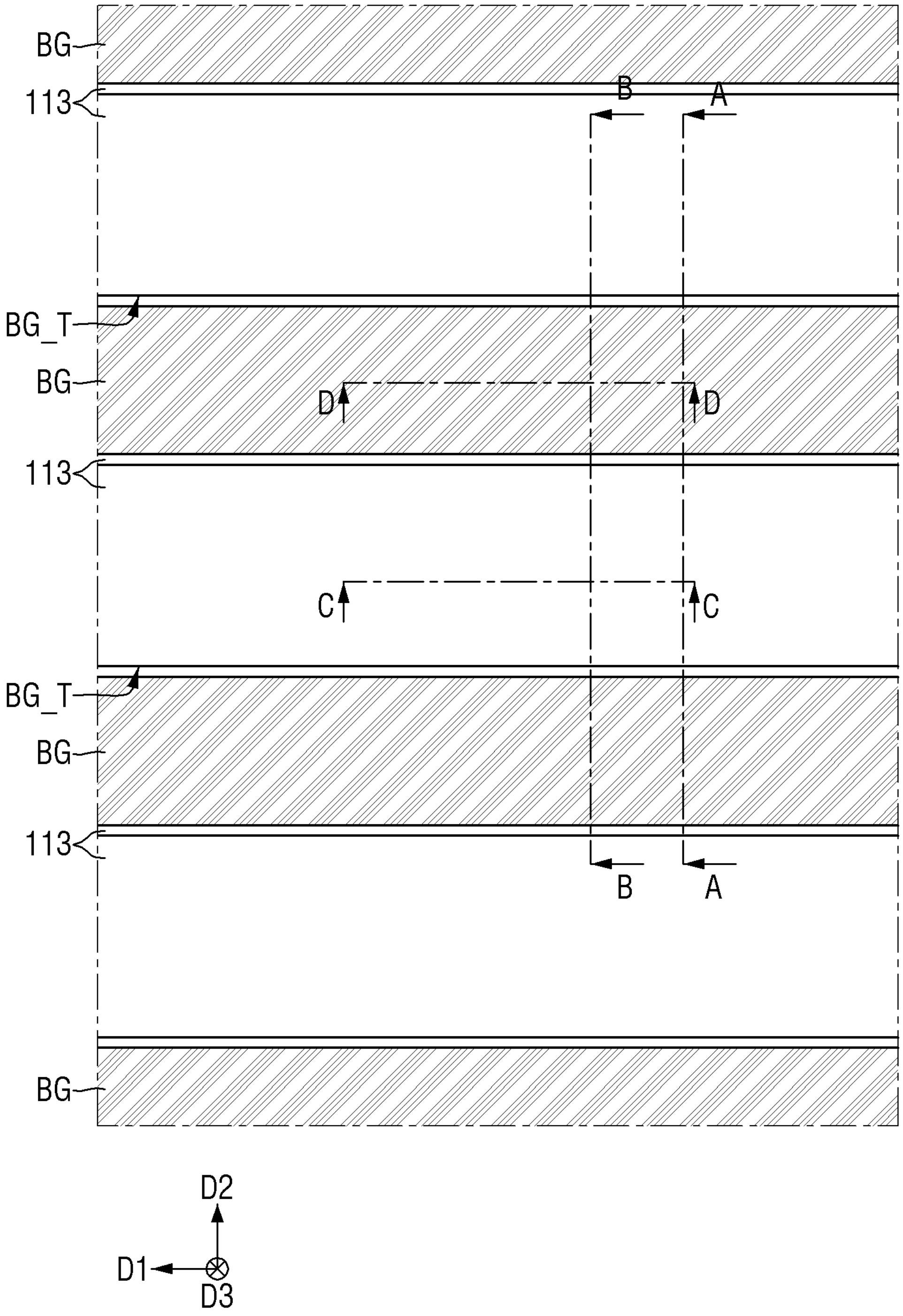
Figure 43:
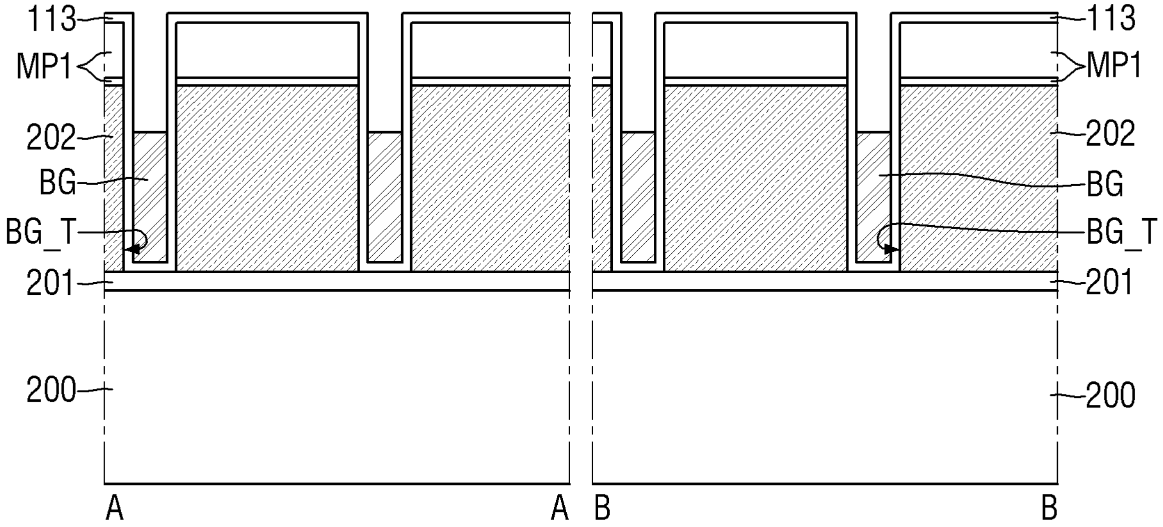
Figure 44:
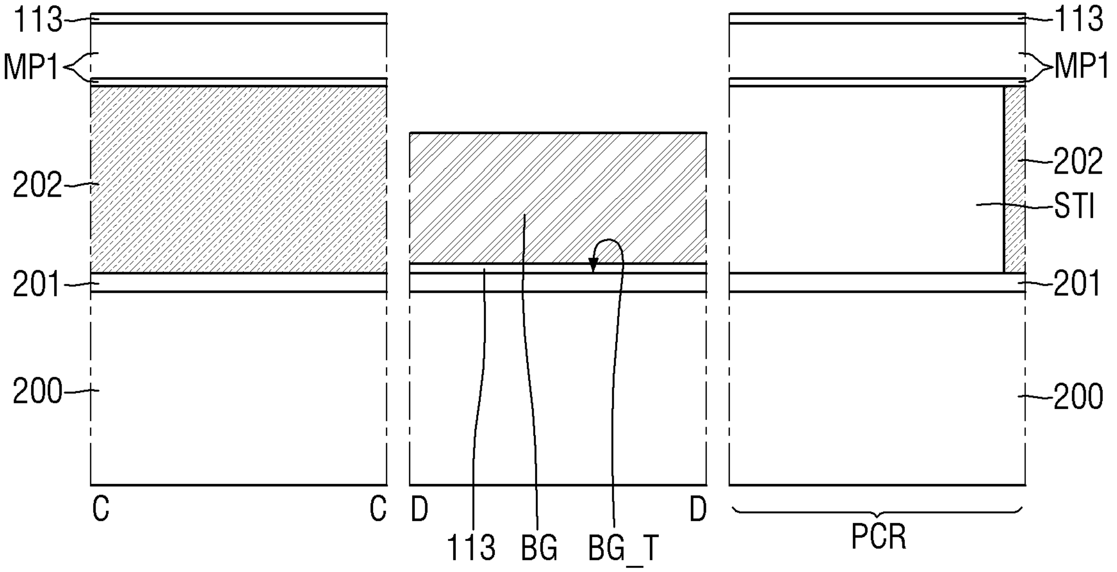

Referring to FIGS. 42 to 44, a back gate insulating pattern 113 and back gate electrodes BG may be formed in the back gate trenches BG_T.

More specifically, the back gate insulating pattern 113 may be formed along sidewalls and bottom surfaces of the back gate trenches BG_T and an upper surface of the first mask pattern MP1. A back gate conductive film may be formed on the back gate insulating pattern 113. The back gate conductive film may fill the back gate trenches BG_T. Subsequently, the back gate electrodes BG extending in the first direction D1 may be formed by isotropically etching the back gate conductive film. The back gate electrodes BG may fill portions of the back gate trenches BG_T.

Meanwhile, according to some example embodiments, before the back gate insulating pattern 113 is formed, a gas phase doping (GPD) process or a plasma assisted doping (PLAD) process may be performed. Through the above-described process, the active layer 202 exposed by the back gate trenches BG_T may be doped with impurities.

Figure 45:
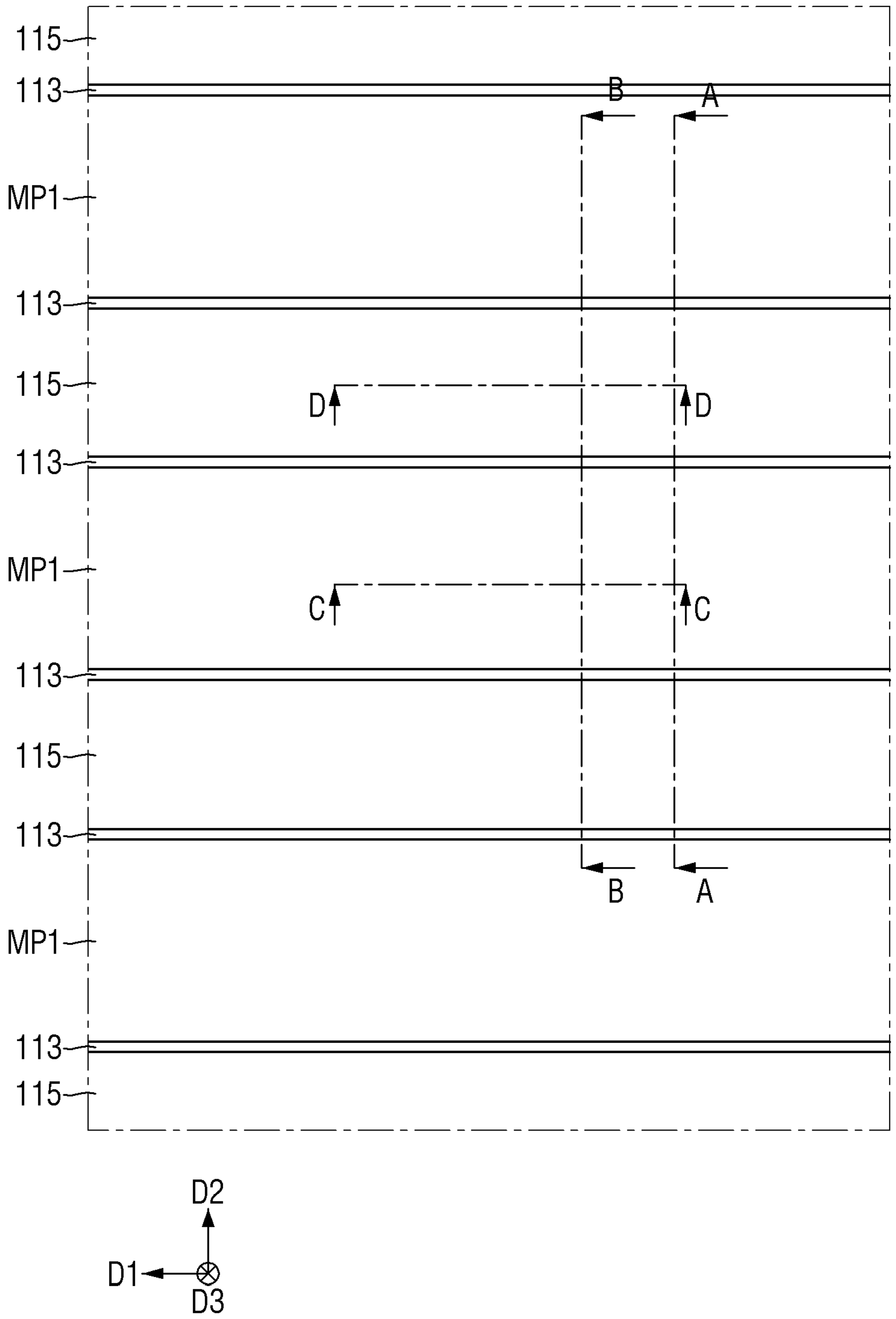
Figure 46:
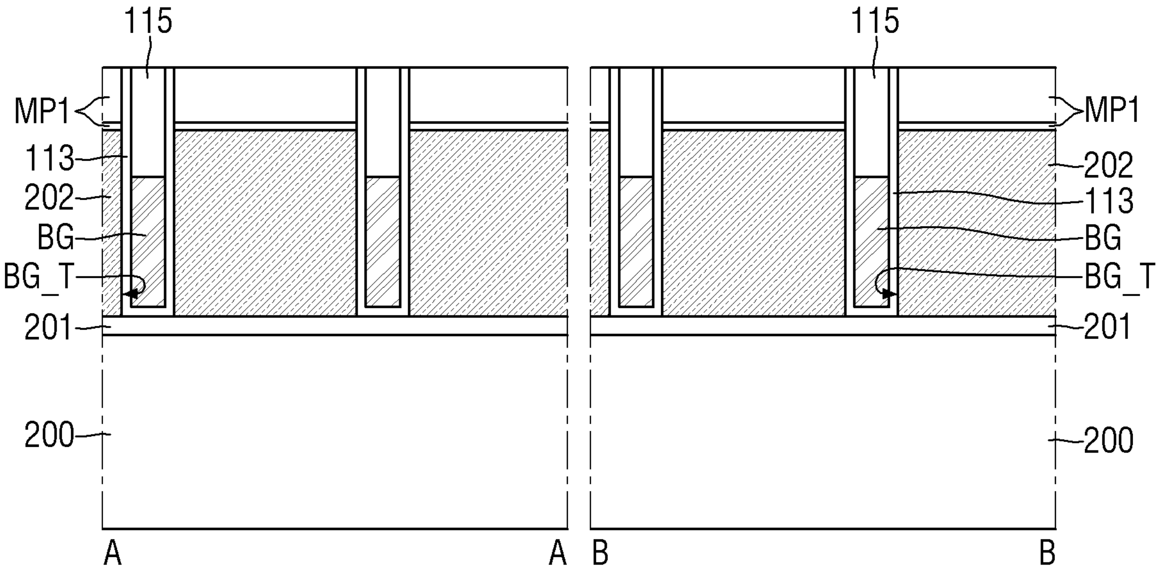
Figure 47:
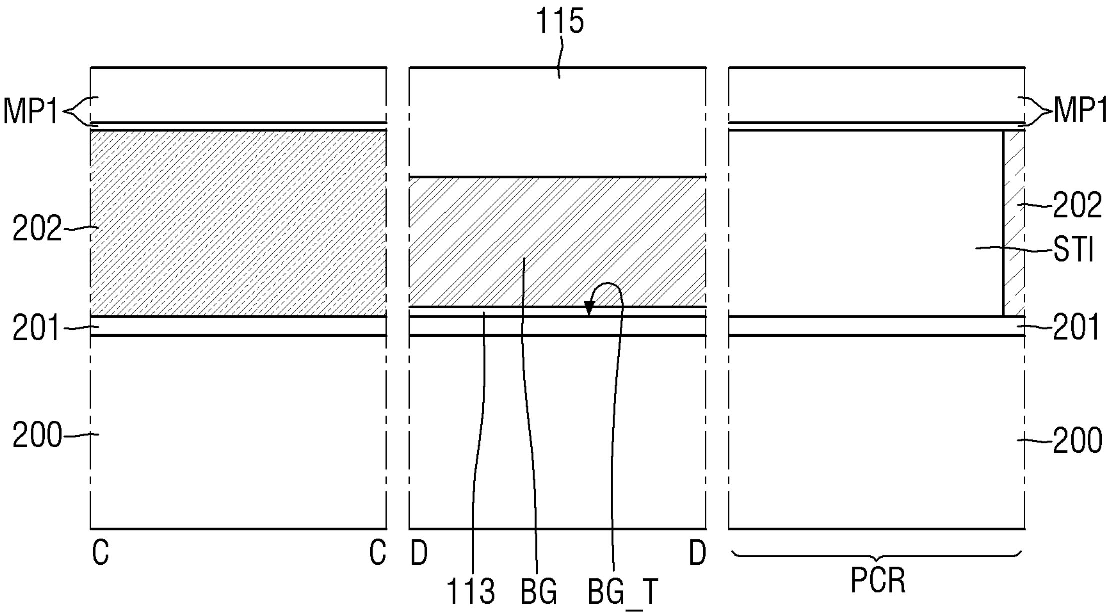

Referring to FIGS. 45 to 47, back gate capping patterns 115 may be formed on the back gate electrodes BG. The back gate capping patterns 115 may fill the other portions of the back gate trenches BG_T.

When the back gate capping pattern 115 and the back gate insulating pattern 113 are made of the same material (e.g., silicon oxide), while the back gate capping pattern 115 is formed, the back gate insulating pattern 113 on the upper surface of the first mask pattern MP1 may be removed.

Meanwhile, before the back gate capping patterns 115 are formed, a gas phase doping (GPD) process or a plasma assisted doping (PLAD) process may be performed. As a result, the active layer 202 may be doped with impurities through the back gate trenches BG_T in which the back gate electrodes BG are formed.

After the back gate capping patterns 115 are formed, the first upper mask film 12 may be removed. The back gate capping patterns 115 may have a form in which they protrude upward from an upper surface of the first lower mask film 11.

Figure 48:
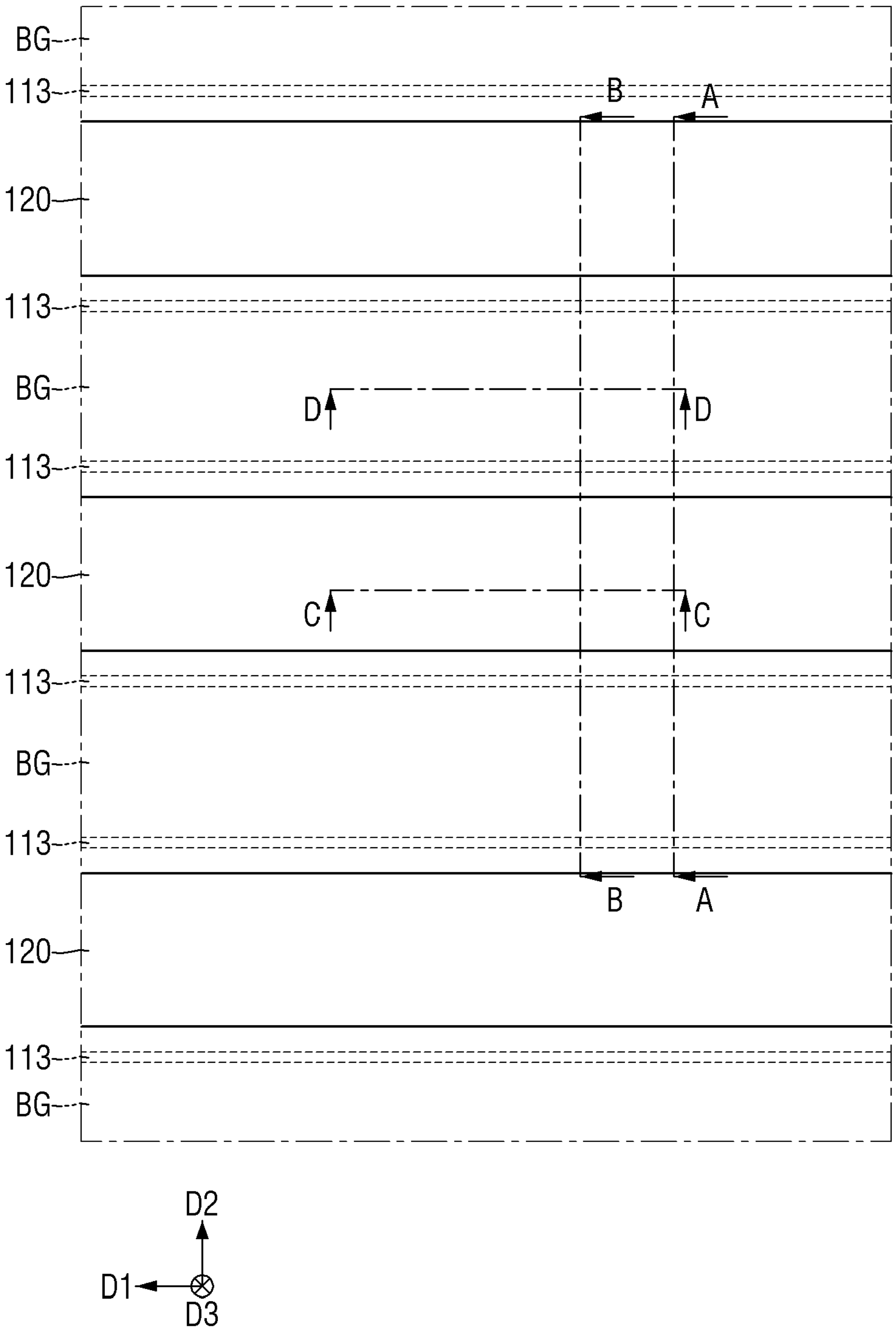
Figure 49:
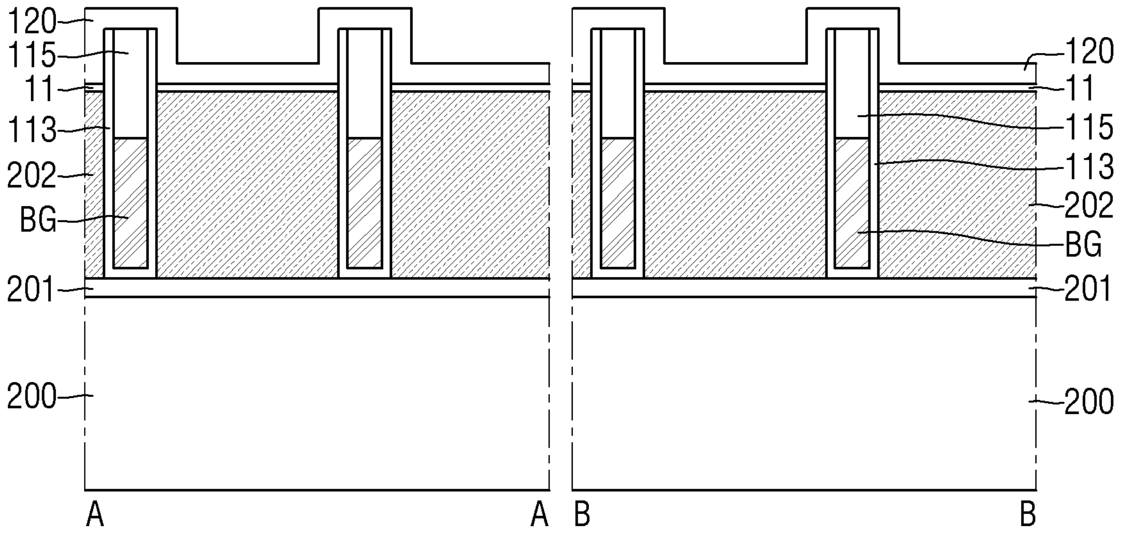
Figure 50:
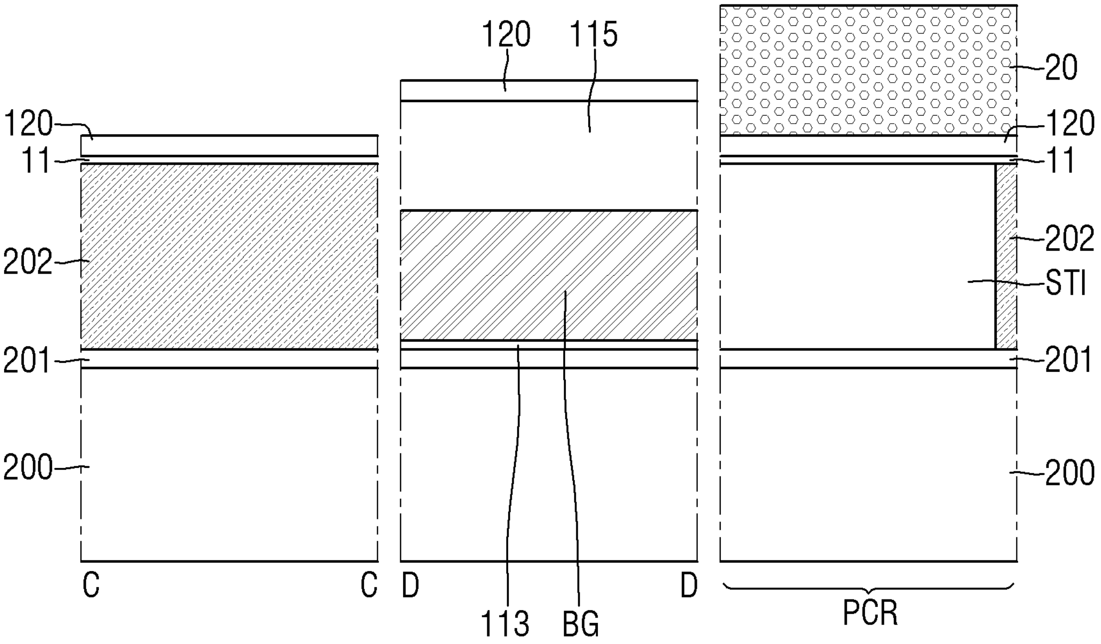

Subsequently, referring to FIGS. 48 to 50, a spacer film 120 may be formed along the upper surface of the first lower mask film 11, sidewalls of the back gate insulating patterns 113, and upper surfaces of the back gate capping patterns 115. The spacer film 120 may be formed to have a uniform thickness. Widths of active patterns of vertical channel transistors may be determined according to a deposition thickness of the spacer film 120. The spacer film 120 may be made of an insulating material. The spacer film 120 may include, e.g., silicon oxide, silicon oxynitride, silicon nitride, silicon carbide (SiC), silicon carbon nitride (SiCN), combinations thereof, and the like.

Subsequently, a peripheral mask pattern 20 exposing the cell array region CAR may be formed on the spacer film 120 of the peripheral circuit region PCR.

Figure 51:
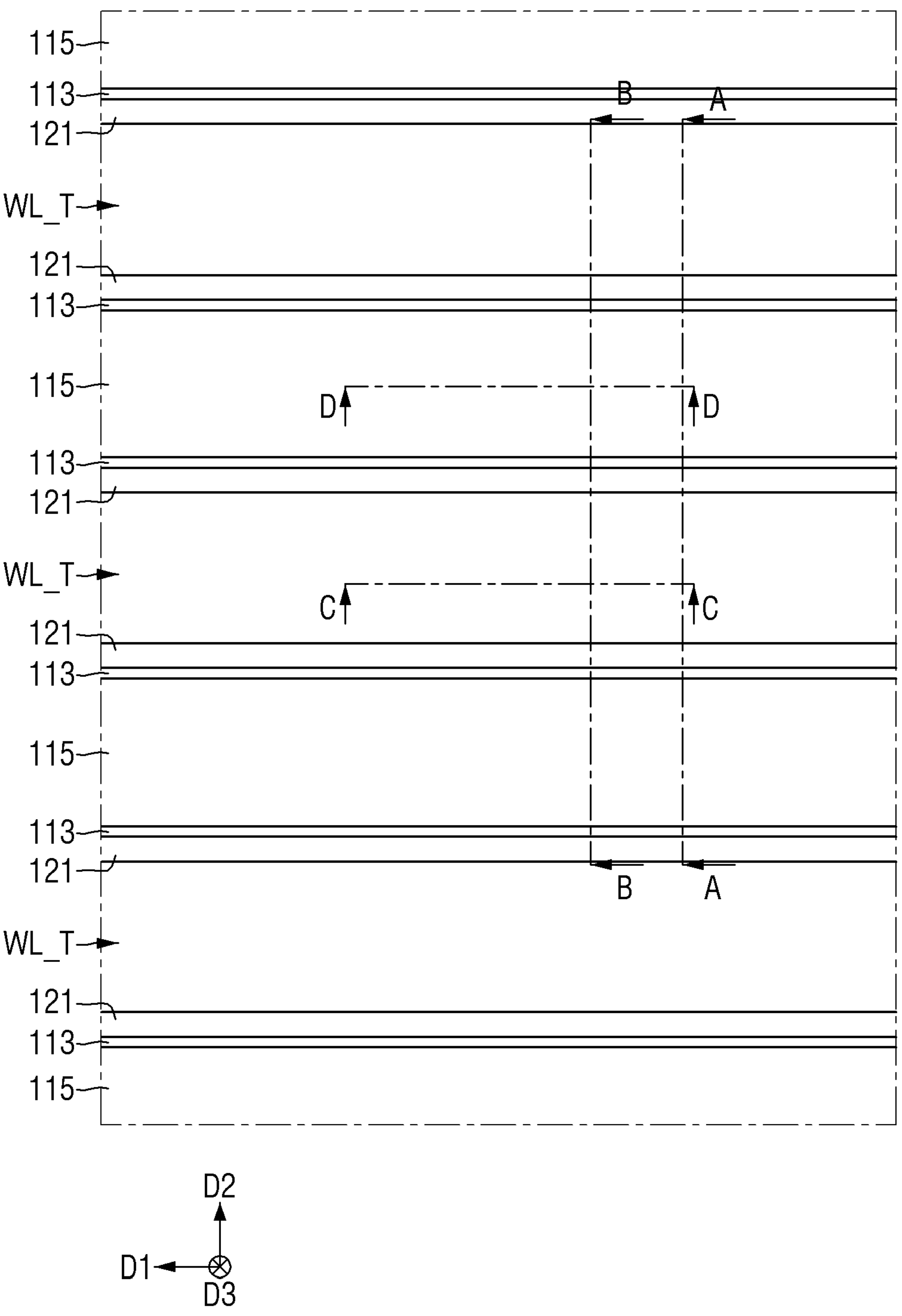
Figure 52:
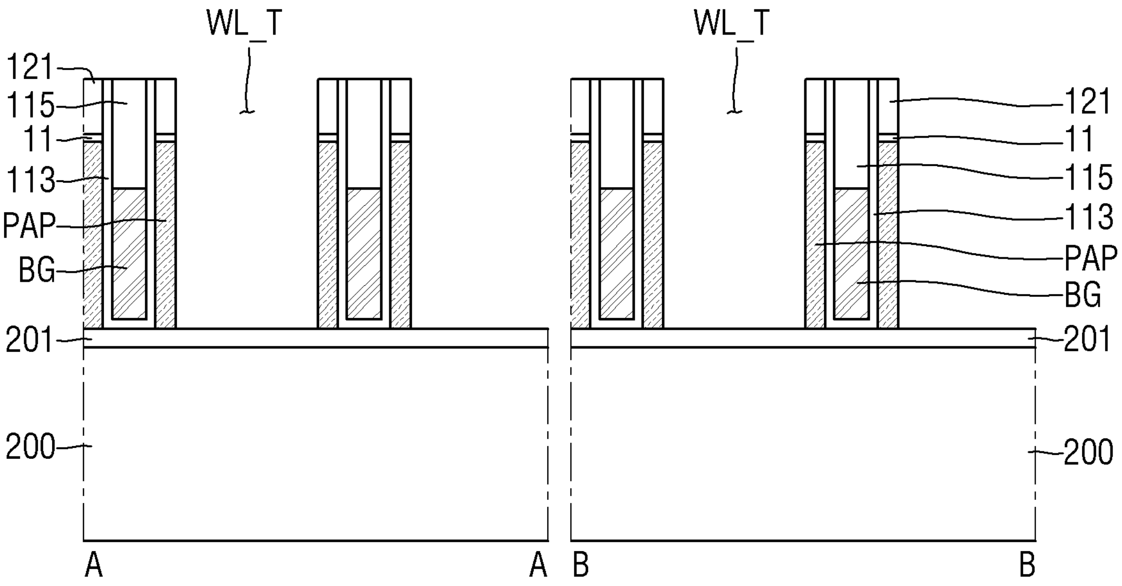
Figure 53:
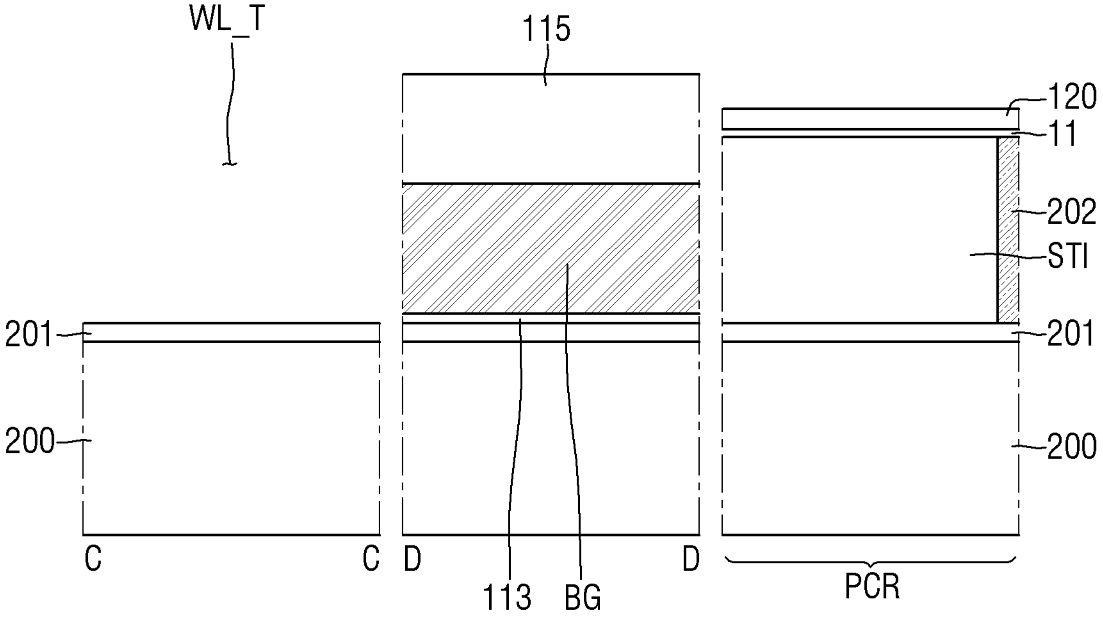

Referring to FIGS. 51 to 53, a pair of spacer patterns 121 may be formed on the sidewalls of the back gate insulating pattern 113 by performing an anisotropic etching process on the spacer film 120.

An anisotropic etching process may be performed on the active layer 202 using the spacer patterns 121 as an etch mask. As a result, a pair of pre-active patterns PAP separated from each other may be formed on both sides of each back gate insulating pattern 113. The pre-active patterns PAP are formed, such that the buried insulating layer 201 may be exposed.

The pre-active patterns PAP may extend in the first direction D1 in a line shape in parallel with the back gate electrode BG. A word line trench WL_T may be formed between the pre-active patterns PAP adjacent to each other in the second direction D2.

After the spacer patterns 121 are formed, the peripheral mask pattern 20 may be removed. A portion of the spacer film 120 may remain on the first lower mask film 11 of the peripheral circuit region PCR.

Figure 54:
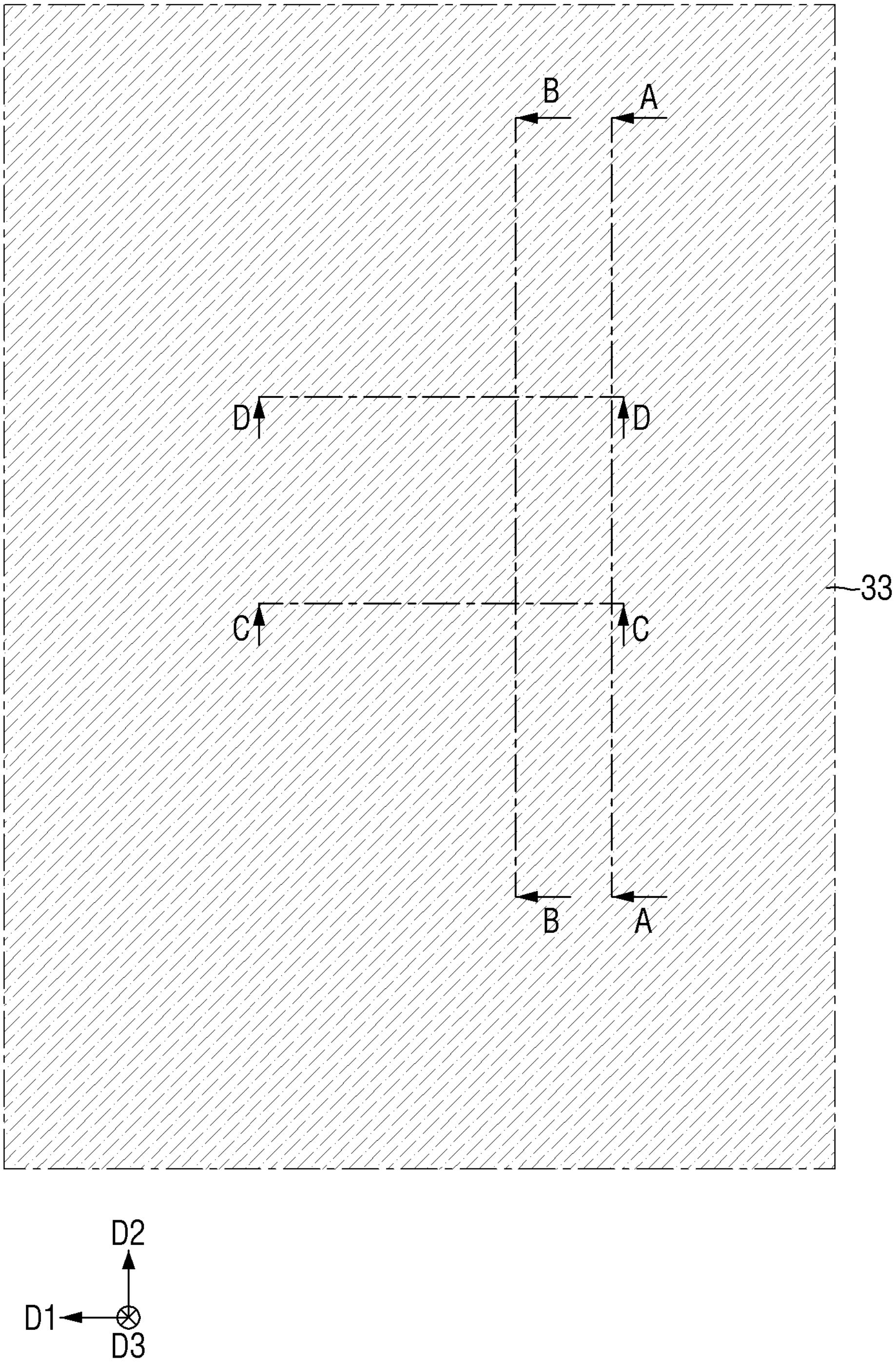
Figure 55:
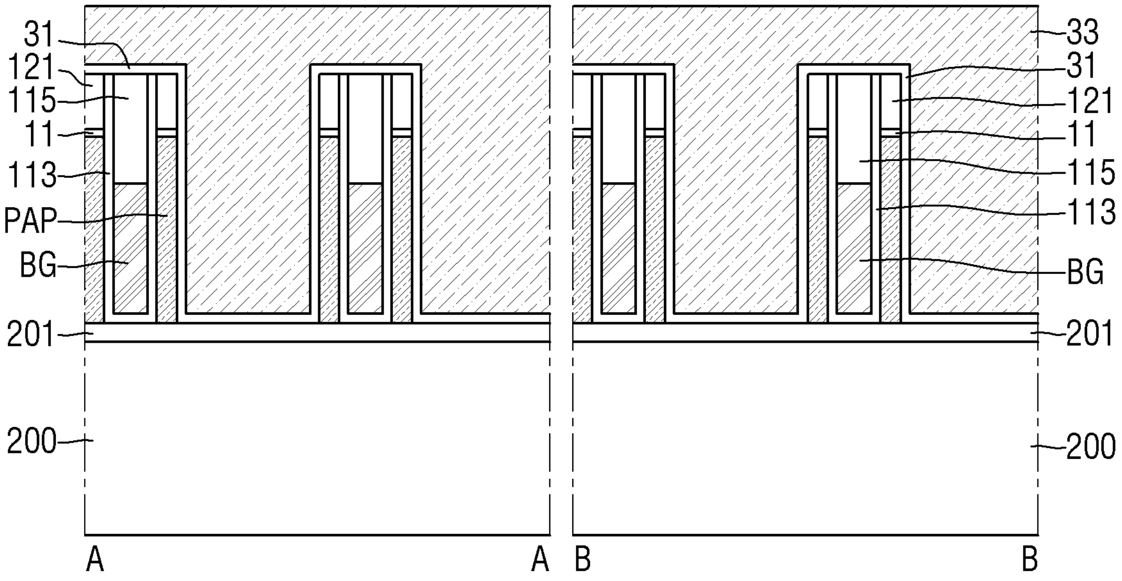
Figure 56:
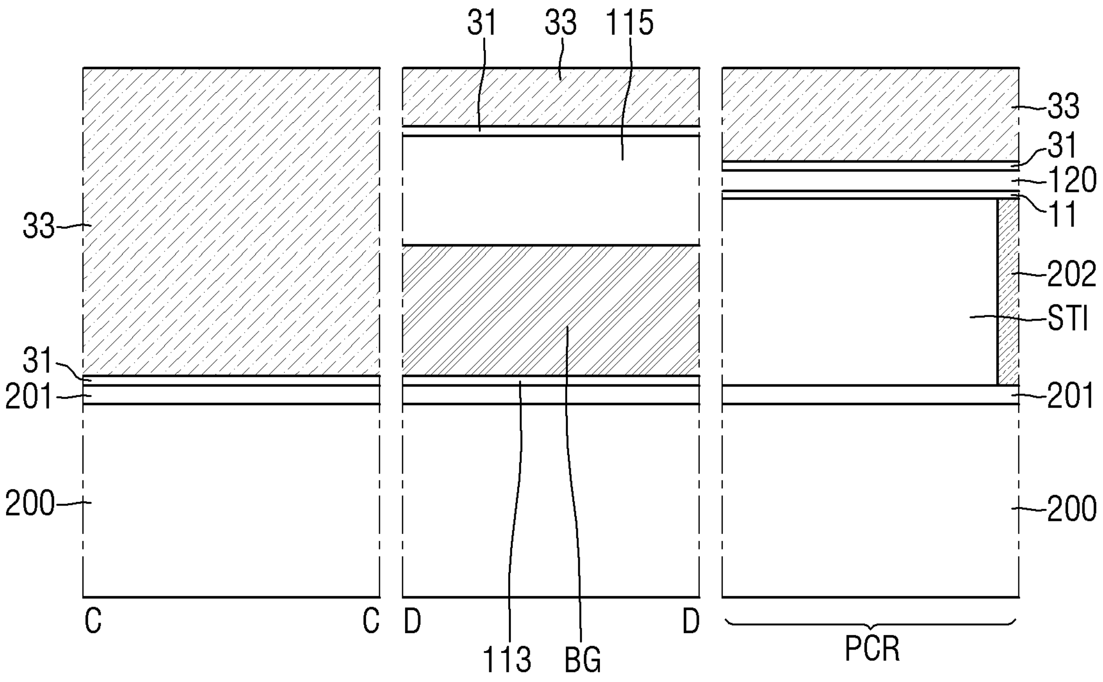

Referring to FIGS. 54 to 56, an etch stop film 31 may be formed along sidewalls and a bottom surface of the word line trench WL_T.

A sacrificial film 33 filling the word line trench WL_T in which the etch stop film 31 is formed may be formed. The sacrificial film 33 may fill the word line trench WL_T. The sacrificial film 33 may have a substantially flat upper surface.

The etch stop film 31 may be formed by depositing an insulating material, e.g., silicon oxide. The sacrificial film 33 may be made of an insulating material having etch selectivity with respect to the etch stop film 31. As an example, the sacrificial film 33 may be one of insulating materials and a silicon oxide film formed using a spin on glass (SOG) technology. The etch stop film 31 and the sacrificial film 33 may be sequentially stacked on the spacer film 120 of the peripheral circuit region PCR.

Figure 57:
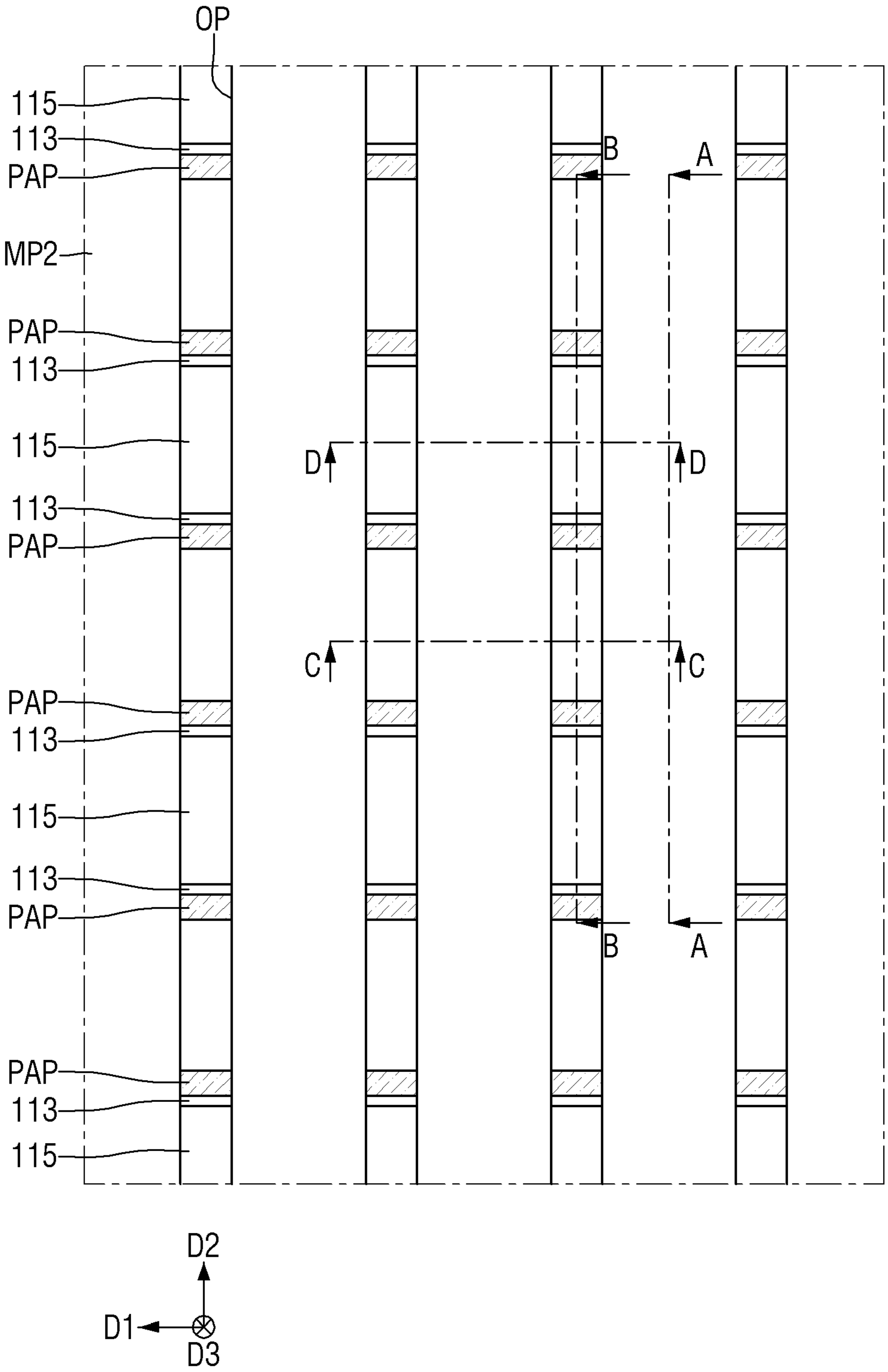
Figure 58:
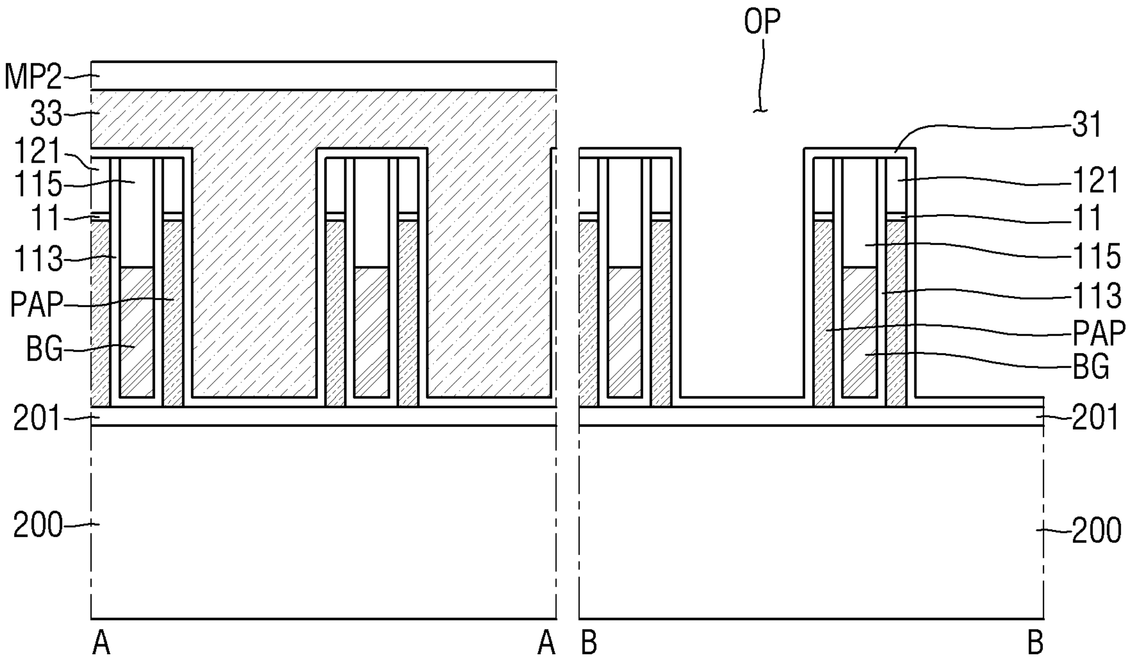
Figure 59:
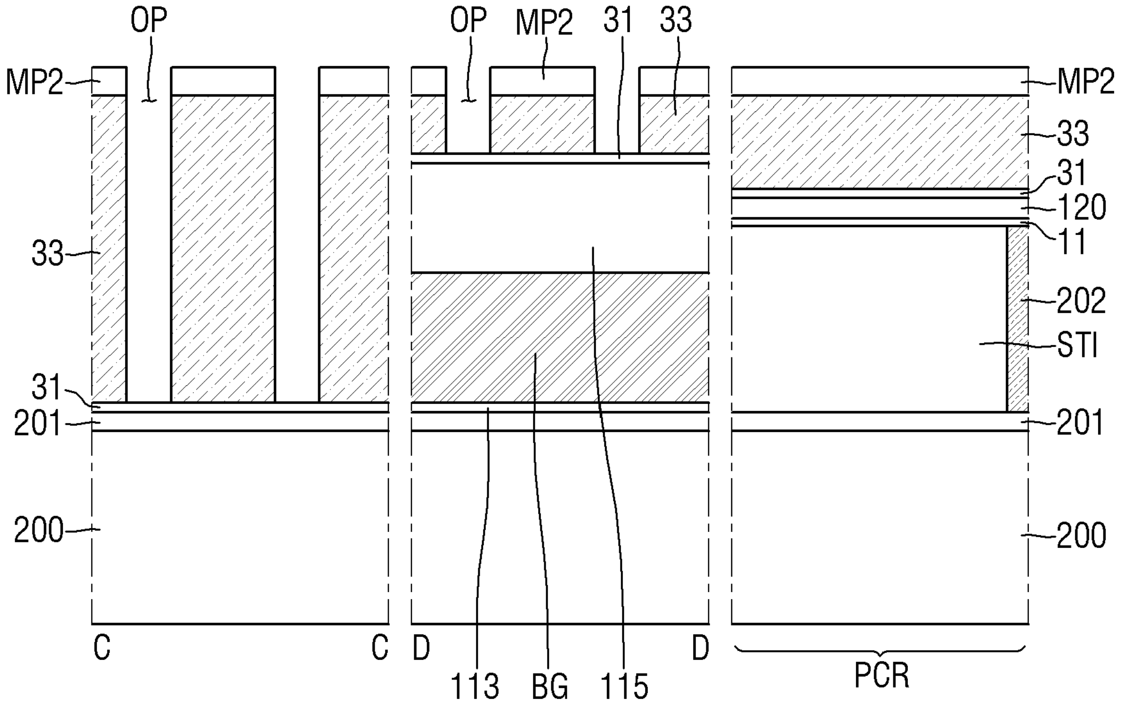

Referring to FIGS. 57 to 59, a second mask pattern MP2 may be formed on the sacrificial film 33. The second mask pattern MP2 may be made of a material having etch selectivity with respect to the sacrificial film 33.

The second mask pattern MP2 may extend in a line shape in the second direction D2. As another example, the second mask pattern MP2 may extend in a line shape in an oblique direction with respect to the first direction D1 and the second direction D2.

Subsequently, openings OP may be formed by etching the sacrificial film 33 using the second mask pattern MP2 as an etch mask. The openings OP may expose the etch stop film 31.

Figure 60:
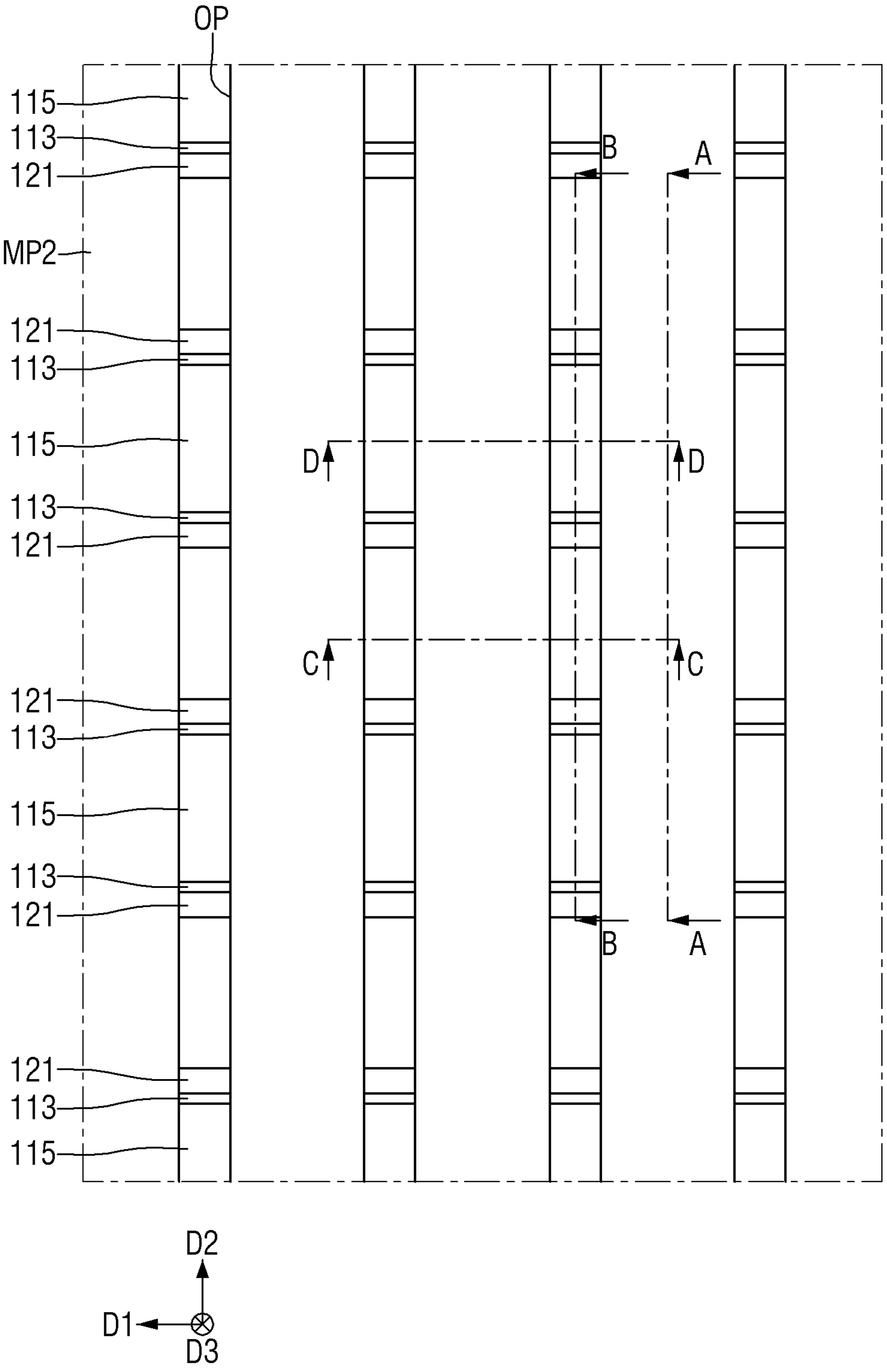
Figure 61:
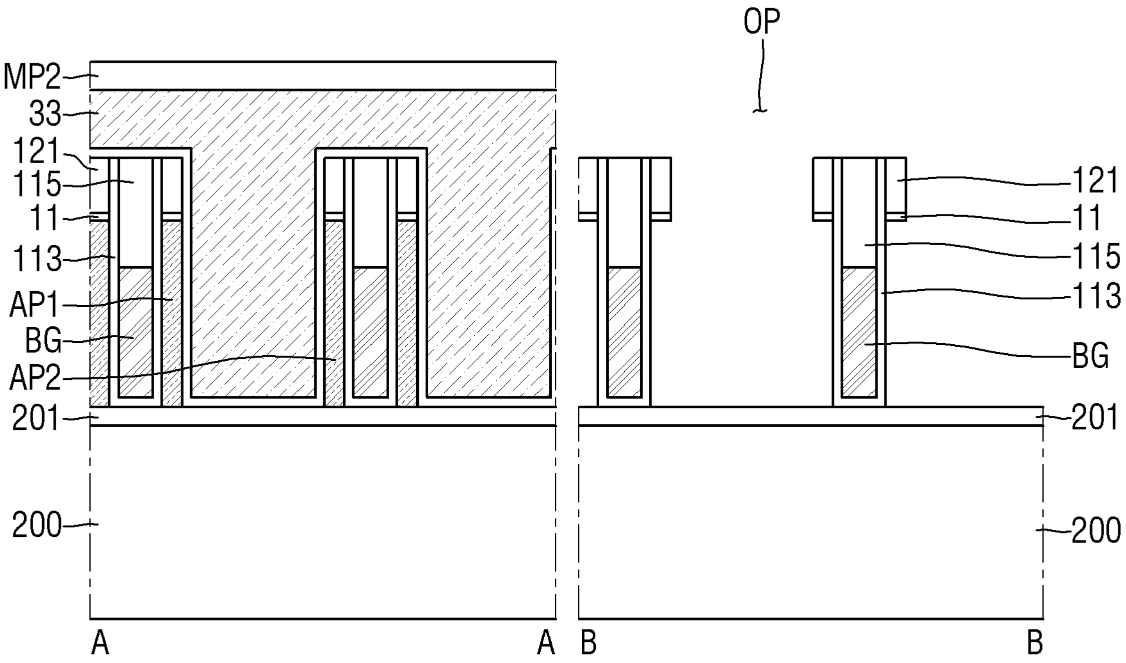
Figure 62:
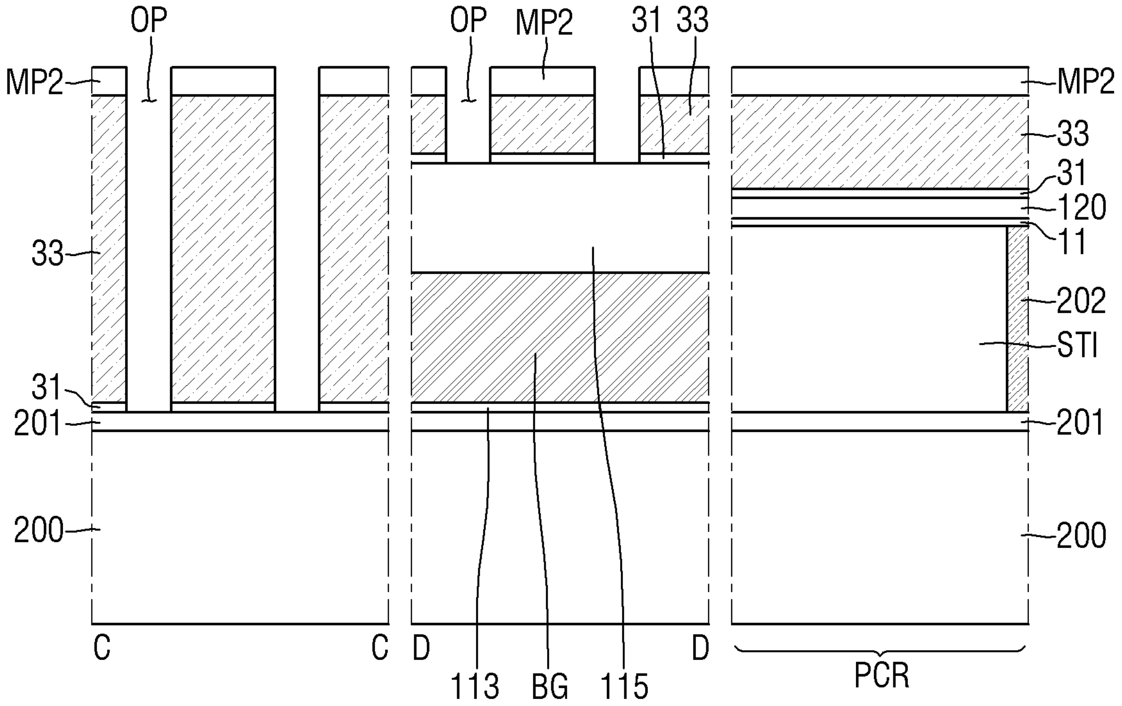

Referring to FIGS. 60 to 62, the etch stop film 31 exposed by the openings OP may be removed. The openings OP may expose an upper surface of the buried insulating layer 201. In addition, the openings OP may expose portions of the pre-active patterns PAP.

Subsequently, the first active pattern AP1 and the second active pattern AP2 may be formed on both sides of the back gate electrode BG, respectively, by etching the pre-active patterns PAP exposed by the openings OP. On a first sidewall of the back gate electrode BG, the first active patterns AP1 may be formed to be spaced apart from each other in the first direction D1. On a second sidewall of the back gate electrode BG, the second active patterns AP2 may be formed to be spaced apart from each other in the first direction D1. In another example, when the second mask pattern MP2 extends in the oblique direction, the first and second active patterns AP1 and AP2 may be disposed to face each other in the oblique direction. The first active pattern AP1 and the second active pattern AP2 are formed, such that the openings OP may expose a portion of the back gate insulating pattern 113.

Figure 63:
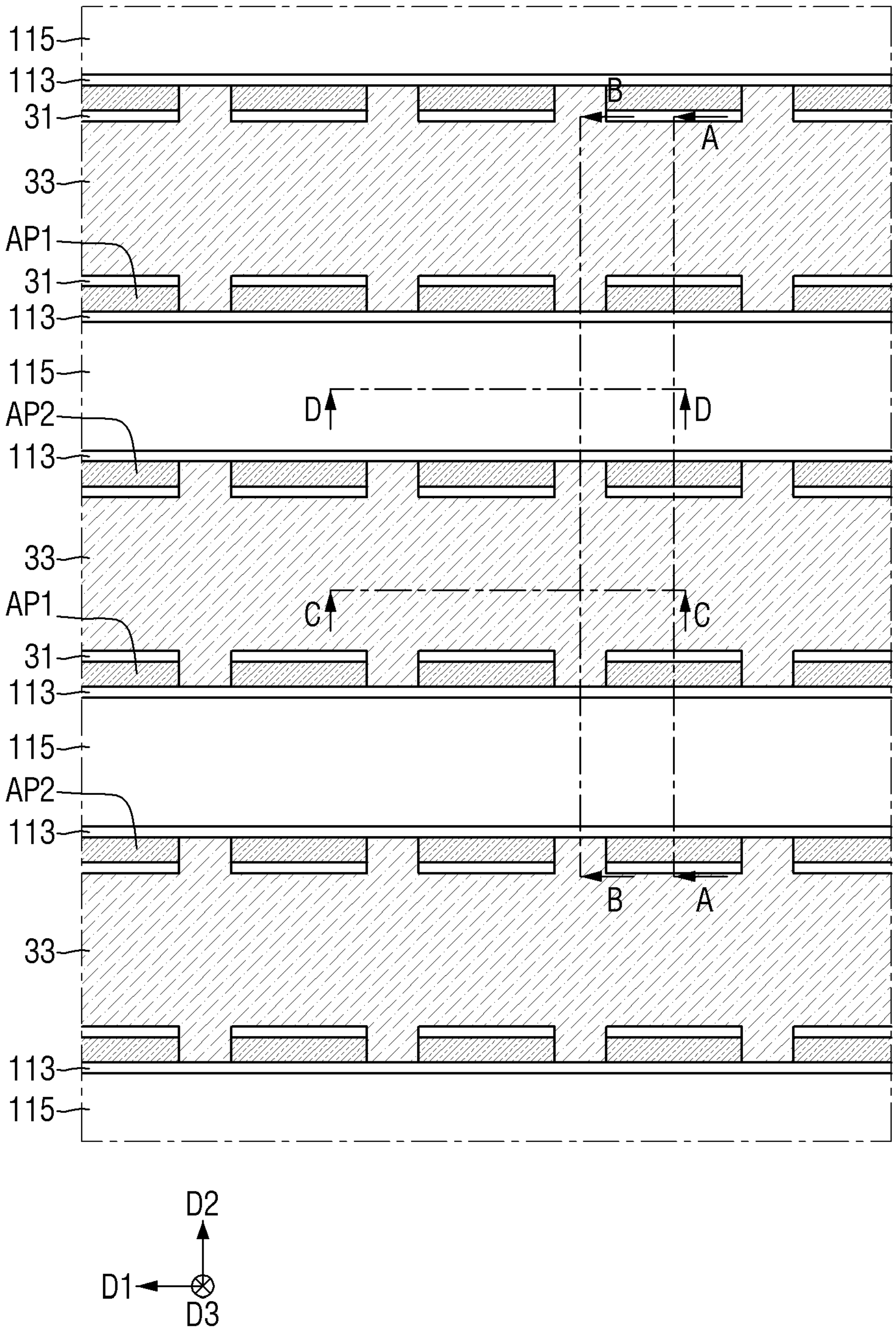
Figure 64:
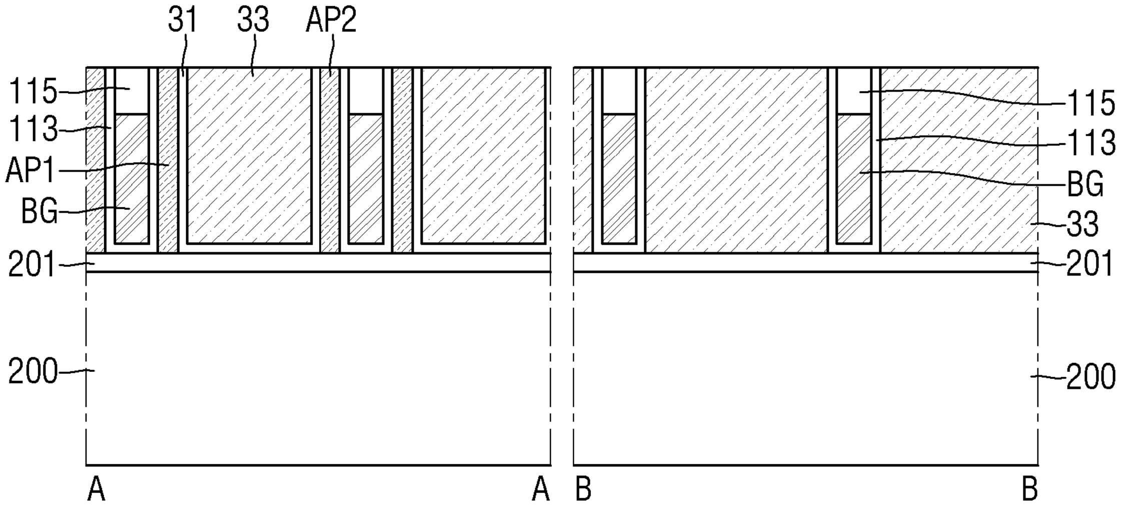
Figure 65:
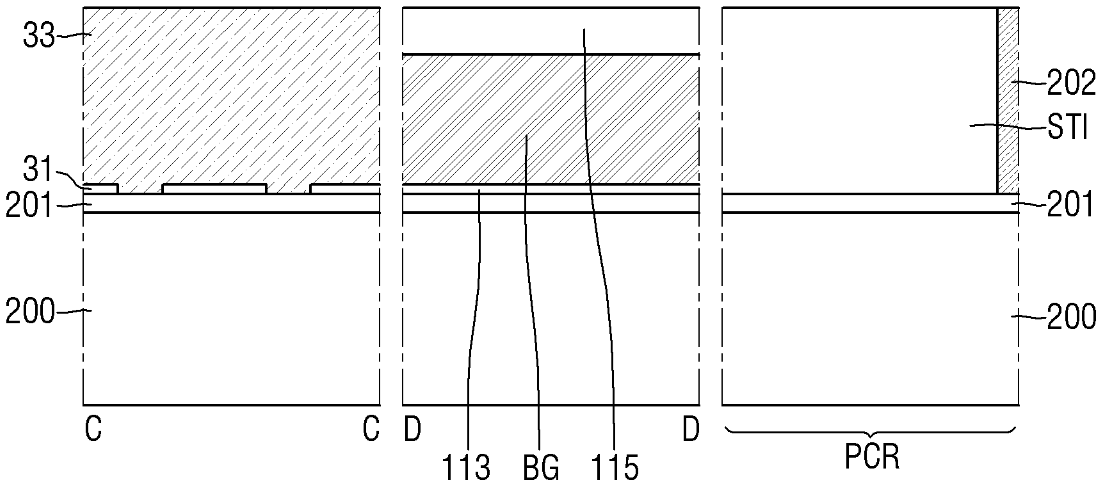

Referring to FIGS. 63 to 65, a sacrificial film 33 may be filled in the openings OP. The sacrificial film 33 filling the openings OP may be made of the same material as the sacrificial film 33 filling the word line trench WL_T (see FIGS. 51 and 52).

After the sacrificial film 33 is filled in the opening OP, the second mask pattern MP2 may be removed. A planarization process may be performed on the sacrificial film 33 and the etch stop film 31 so that the upper surfaces of the back gate capping patterns 115 are exposed. Subsequently, the spacer patterns 121 and the first lower mask film 11 may be removed. As a result, the first active pattern AP1 and the second active pattern AP2 may be exposed. The spacer patterns 121 and the first lower mask film 11 may be removed using a planarization process.

Figure 66:
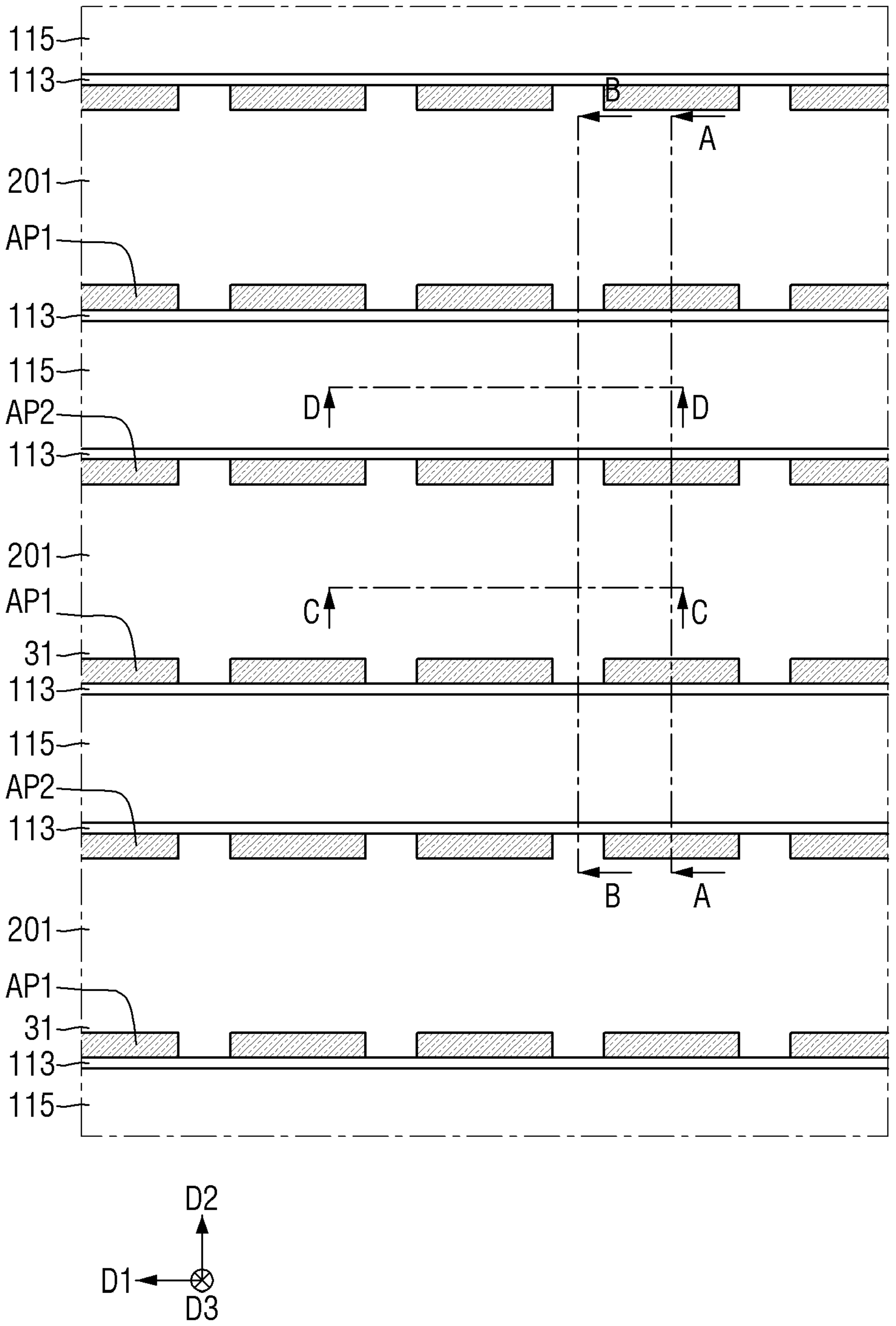
Figure 67:
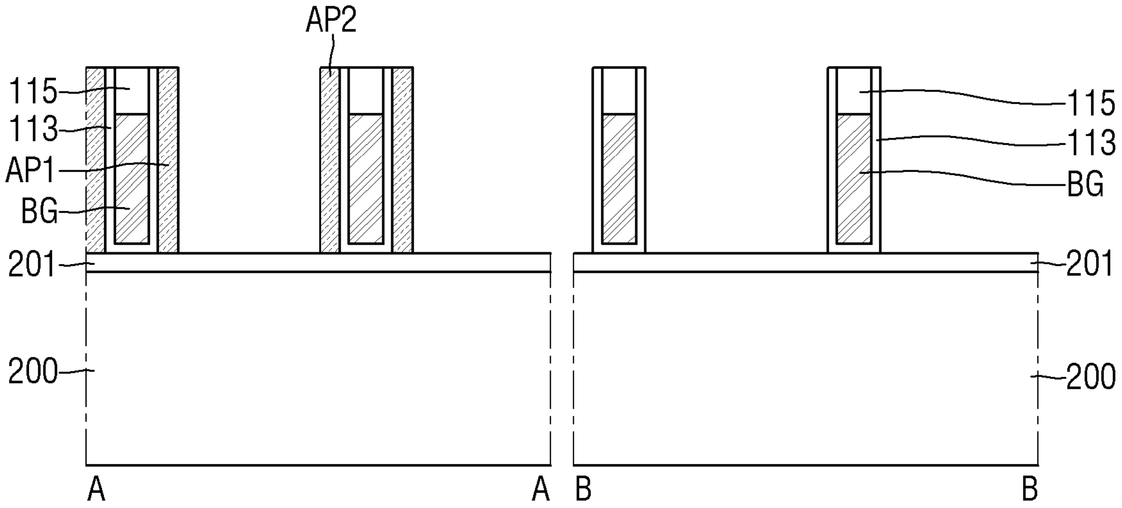
Figure 68:
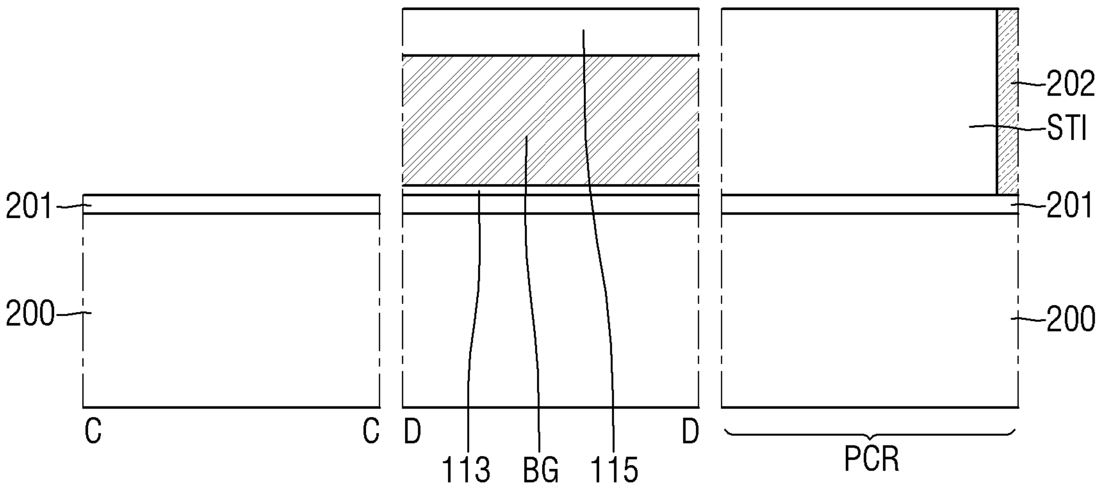

Referring to FIGS. 66 to 68, the sacrificial film 33 and the etch stop film 31 on the buried insulating layer 201 may be removed. As a result, the buried insulating layer 201 may be exposed.

Figure 69:
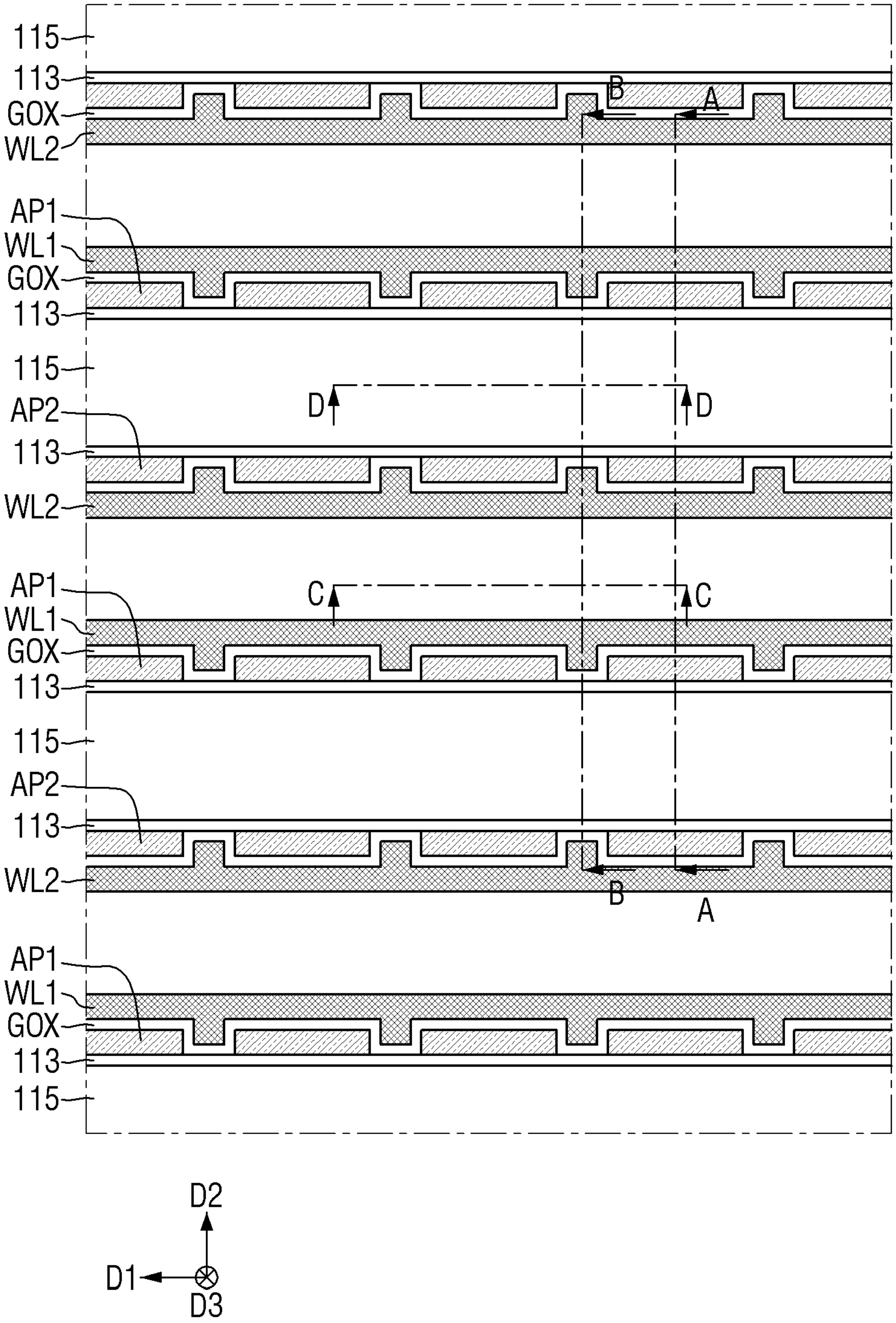
Figure 70:
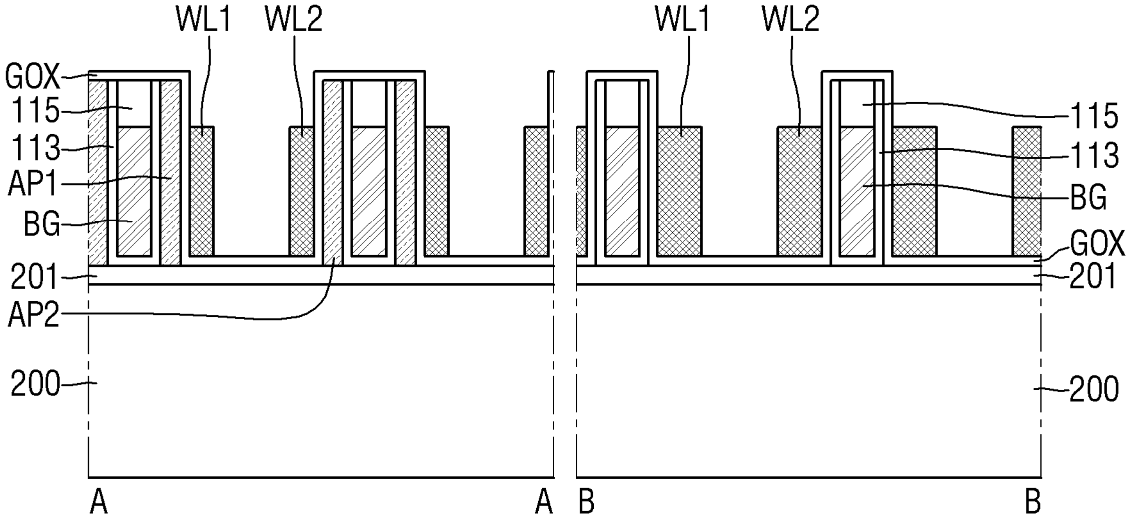
Figure 71:
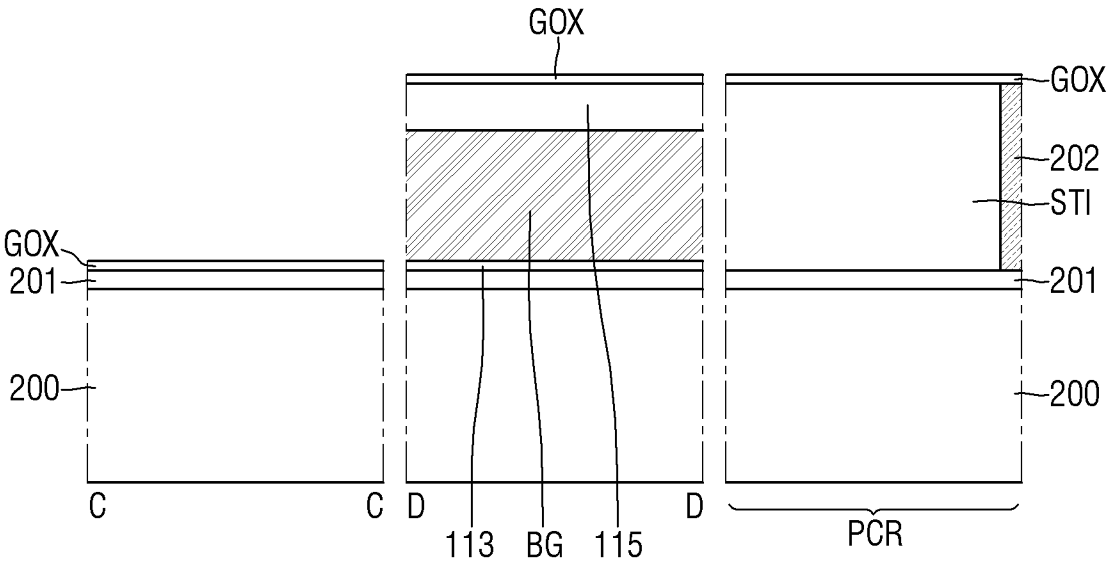

Referring to FIGS. 69 to 71, a gate insulating pattern GOX may be formed along a sidewall of the first active pattern AP1, a sidewall of the second active pattern AP2, the upper surfaces of the back gate capping patterns 115, and the upper surface of the buried insulating layer 201.

The gate insulating pattern GOX may be deposited on the active layer 202 and the element isolation film STI in the peripheral circuit region PCR. The gate insulating pattern GOX may be formed using at least one of, e.g., physical vapor deposition (PVD), thermal chemical vapor deposition (CVD), low pressure chemical vapor deposition (LP-CVD), plasma enhanced chemical vapor deposition (PE-CVD), or atomic layer deposition (ALD) technologies.

Subsequently, the first word line WL1 and the second word line WL2 may be formed on the gate insulating pattern GOX. The first and second word lines WL1 and WL2 may be formed on the sidewalls of the first and second active patterns AP1 and AP2.

The forming of the first and second word lines WL1 and WL2 may include depositing a gate conductive film on the gate insulating pattern GOX and then performing an anisotropic etching process on the gate conductive film. Here, a deposition thickness of the gate conductive film may be smaller than a half of a width of the word line trench WL_T (see FIGS. 51 and 52).

At the time of performing the anisotropic etching process on the gate conductive film, the gate insulating pattern GOX may be used as an etch stop film. Unlike illustrated in the drawing, the gate insulating pattern GOX may be overetched to expose the buried insulating layer 201. According to the anisotropic etching process for the gate conductive film, the first and second word lines WL1 and WL2 may have various shapes.

An upper surface of the first word line WL1 and an upper surface of the second word line WL2 may be positioned at a level lower than that of upper surfaces of the first and second active patterns AP1 and AP2.

As an example, after the first and second word lines WL1 and WL2 are formed, a gas phase doping (GPD) process or a plasma assisted doping (PLAD) process may be performed. As a result, the first and second active patterns AP1 and AP2 may be doped with impurities through the gate insulating pattern GOX exposed by the first and second word lines WL1 and WL2.

Figure 72:
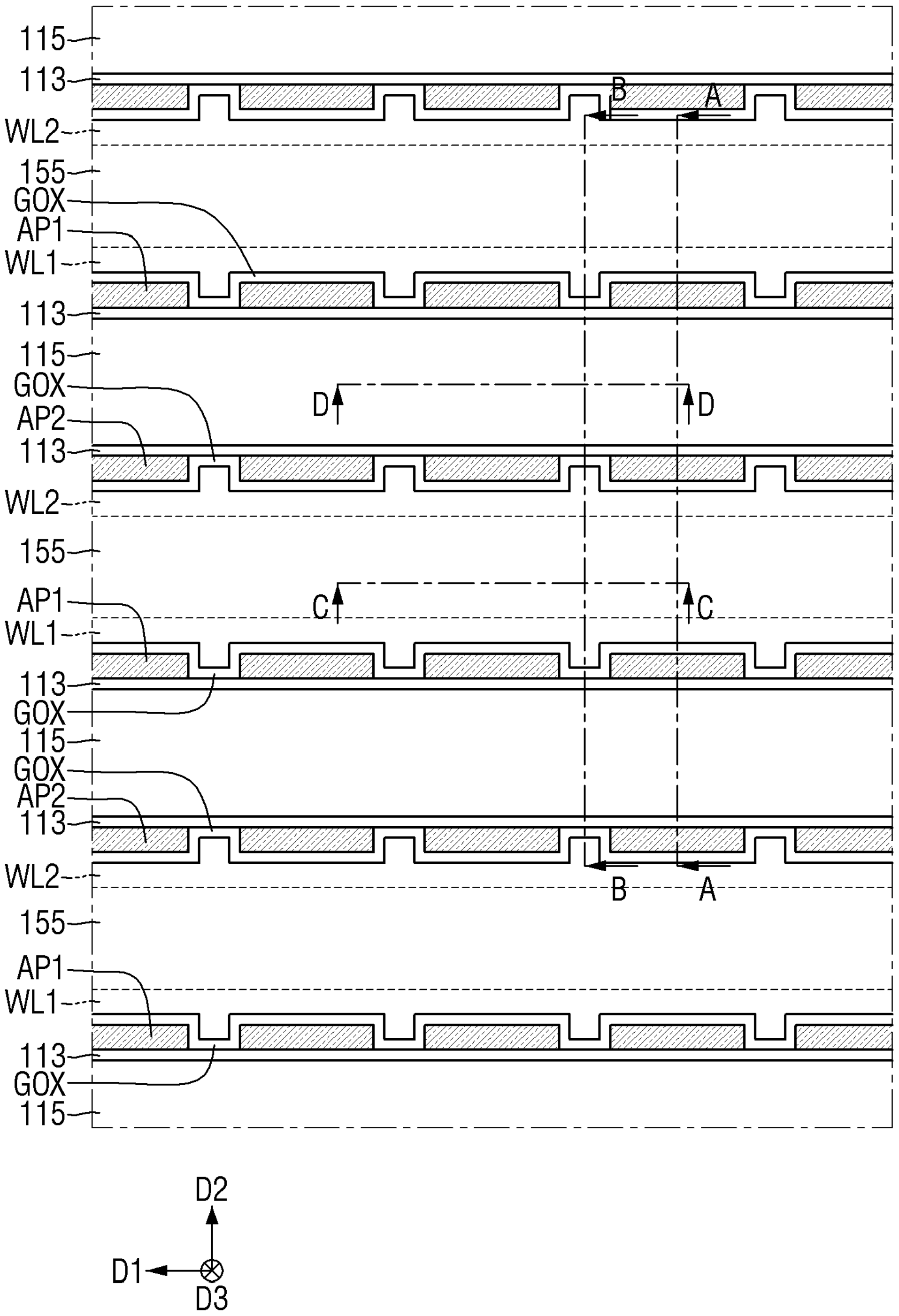
Figure 73:
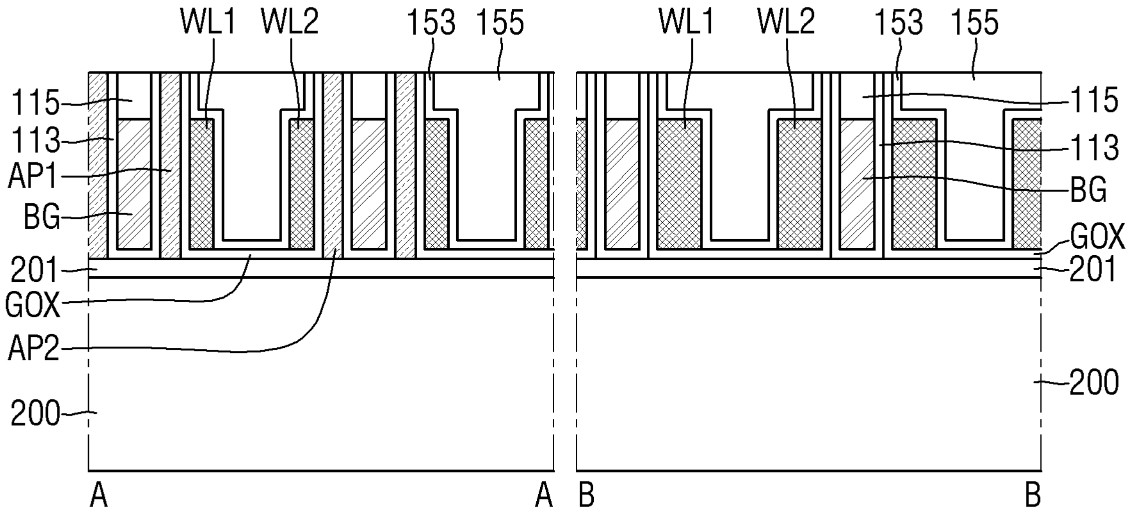
Figure 74:
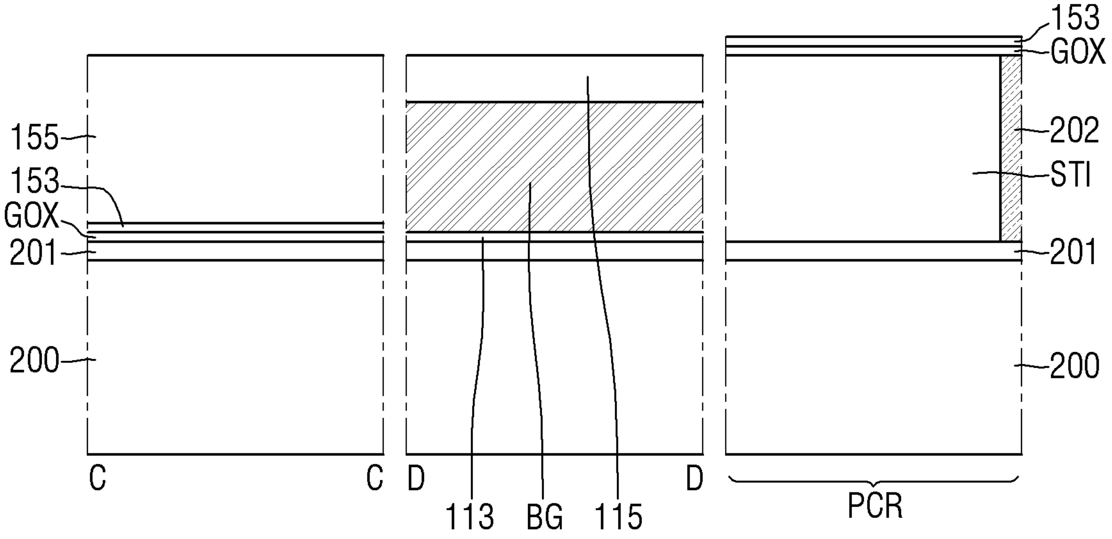

Referring to FIGS. 72 to 74, the gate isolation liner 153 and the gate isolation filling film 155 may be formed on the first and second word lines WL1 and WL2. More specifically, the gate isolation liner 153 may be formed on the sub-substrate 200.

The gate isolation liner 153 may include, e.g., a silicon nitride (SiN), a silicon oxynitride (SiON), a silicon carbide (SiC), a silicon carbonitride (SiCN), and combinations thereof. The gate isolation liner 153 may cover surfaces of the word lines WL1 and WL2.

Subsequently, the gate isolation filling film 155 may be formed to fill the word line trench WL_T (see FIGS. 51 and 52) in which the gate isolation liner 153 is formed. Here, the gate isolation filling film 155 may be made of an insulating material different from that of the gate isolation liner 153. Thereafter, a planarization process may be performed on the gate isolation liner 153 and the gate isolation filling film 155 so that the upper surfaces of the back gate capping patterns 115 are exposed.

Meanwhile, before the gate isolation filling film 155 is formed, a mask pattern exposing the cell array region CAR may be formed on the gate isolation liner 153 of the peripheral circuit region PCR. In this case, the gate isolation filling film 155 may not be formed in the peripheral circuit region PCR.

Figure 75:
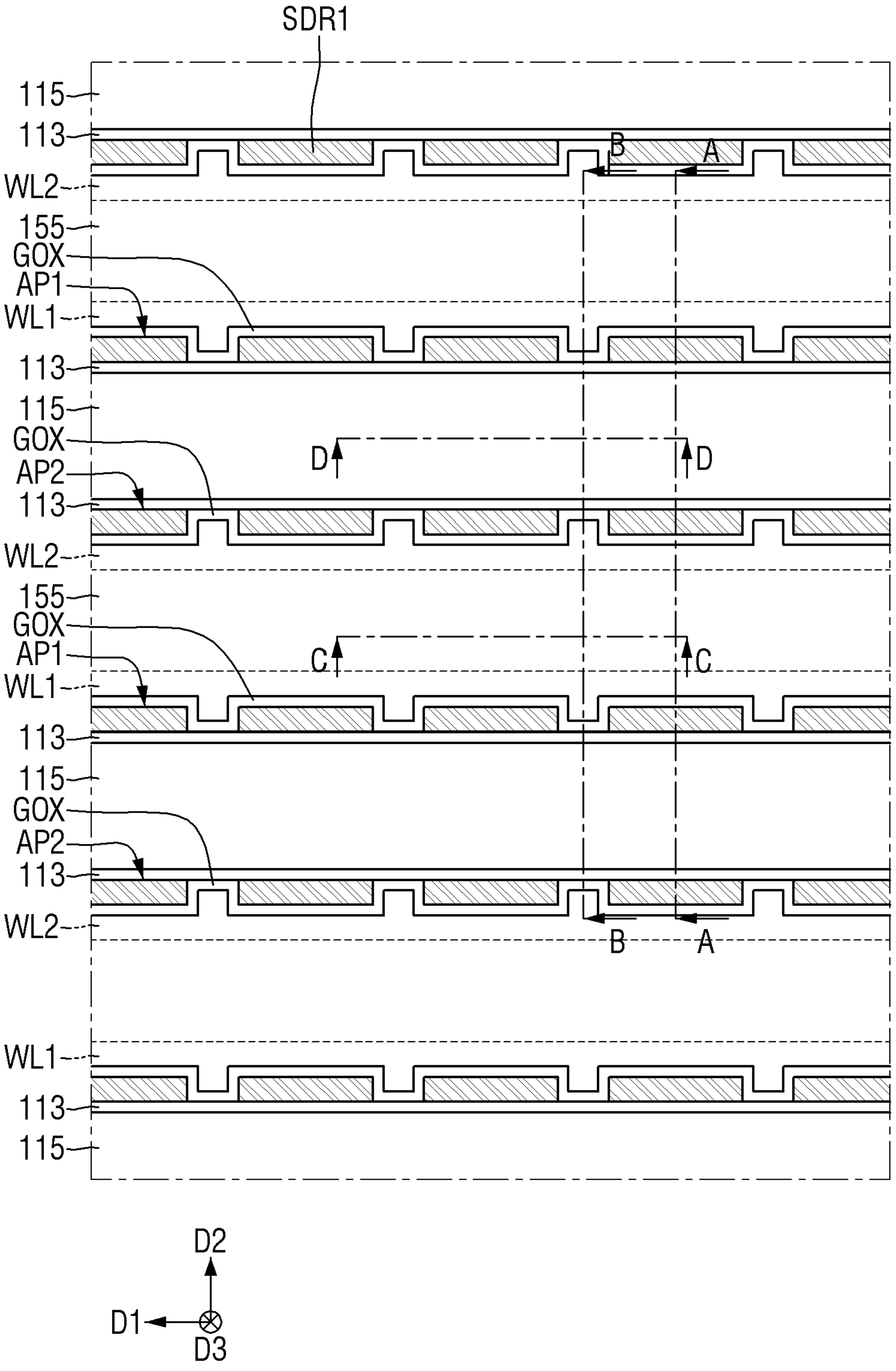
Figure 76:
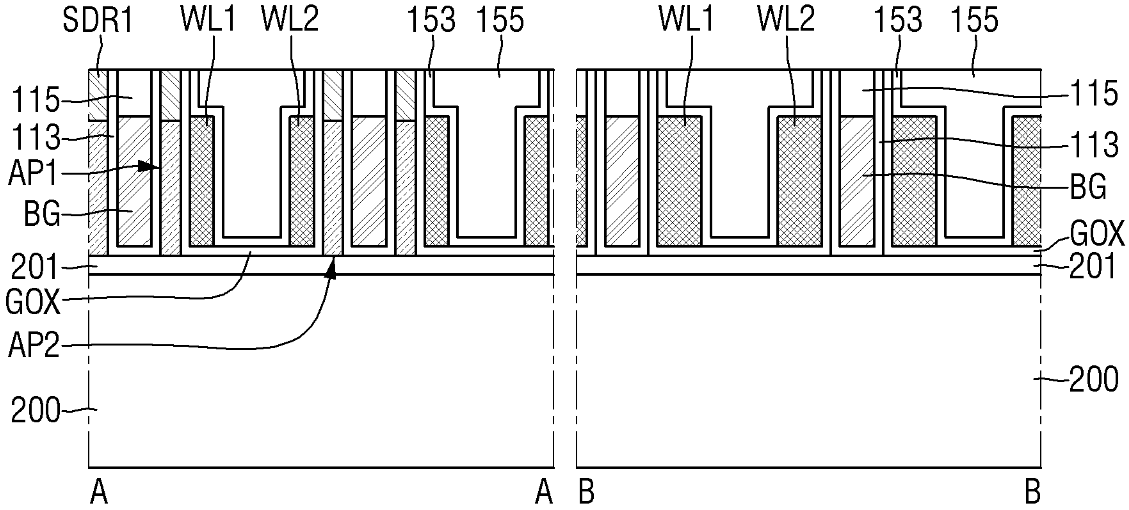

Referring to FIGS. 75 and 76, the first dopant regions SDR1 may be formed in the first and second active patterns AP1 and AP2. The first dopant regions SDR1 may be formed by doping a portion of the first active pattern AP1 and a portion of the second active pattern AP2 with impurities.

A process of forming the first dopant regions SDR1 may be optional. A subsequent fabricating method will be described using a case where the first dopant regions SDR1 are not formed.

Figure 77:
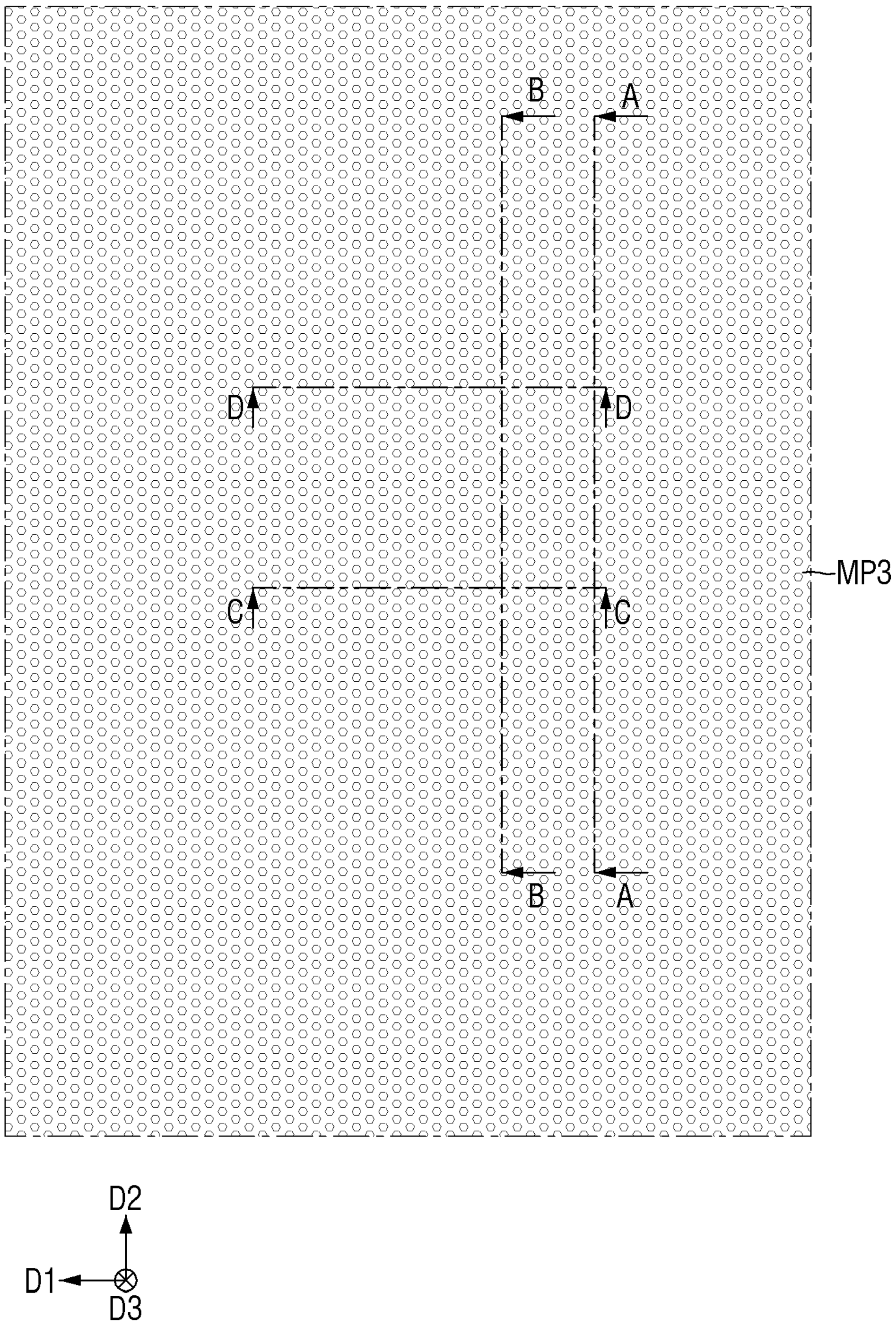
Figure 78:
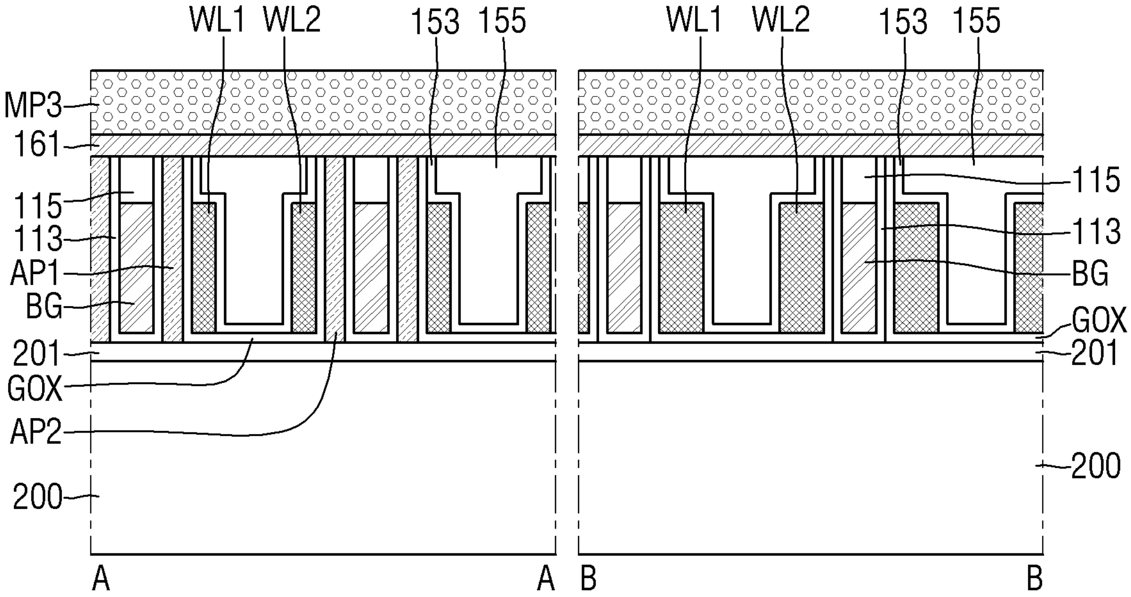
Figure 79:
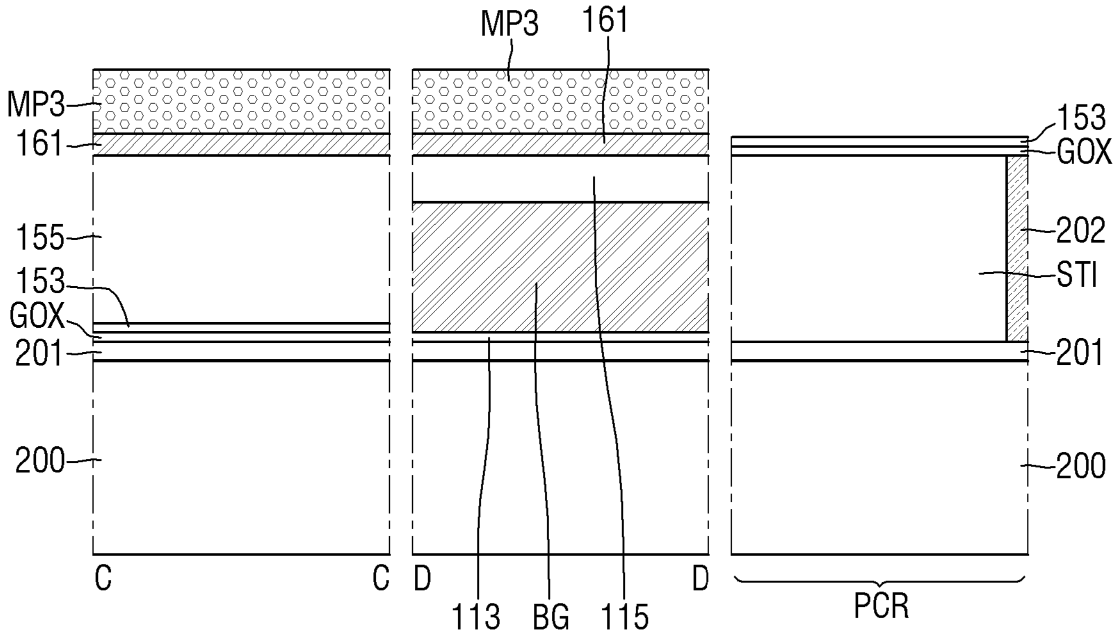

Referring to FIGS. 77 to 79, the polysilicon pattern 161 may be formed on the entire surface of the sub-substrate 200. The polysilicon pattern 161 may be in contact with the first and second active patterns AP1 and AP2 in the cell array region CAR. The polysilicon pattern 161 may be formed on the gate isolation liner 153 in the peripheral circuit region PCR.

Subsequently, a third mask pattern MP3 exposing the peripheral circuit region PCR may be formed on the polysilicon pattern 161. The polysilicon pattern 161 on the peripheral circuit region PCR may be removed using the third mask pattern MP3 as an etch mask. The gate isolation liner 153 may be exposed in the peripheral circuit region PCR.

Figure 80:
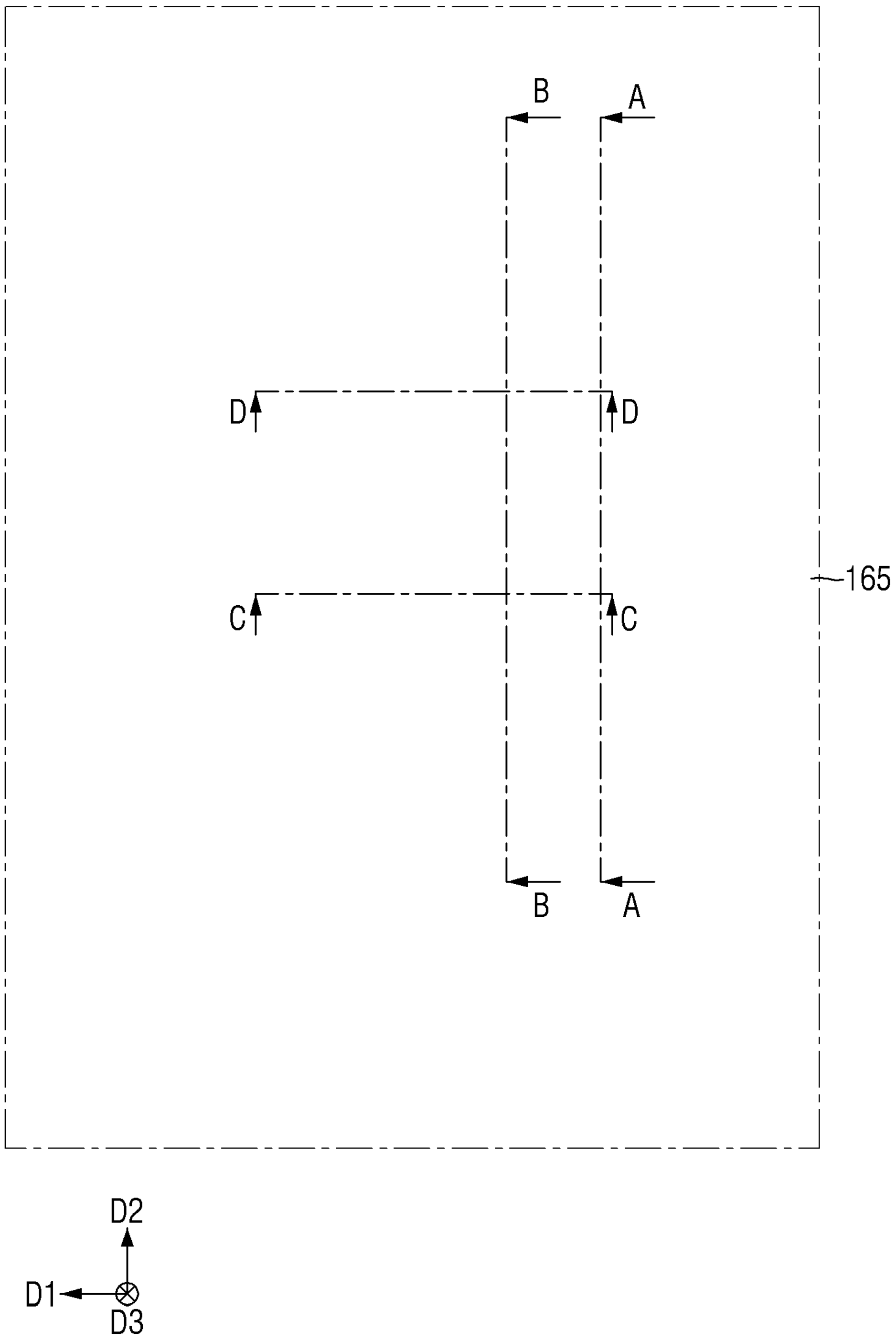
Figure 81:
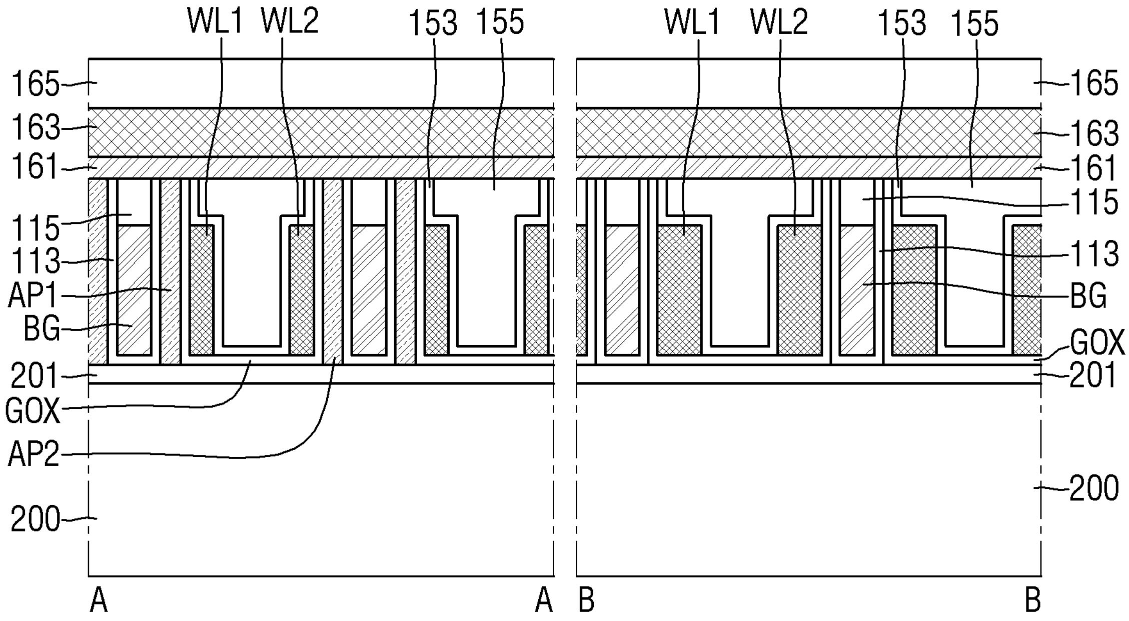
Figure 82:
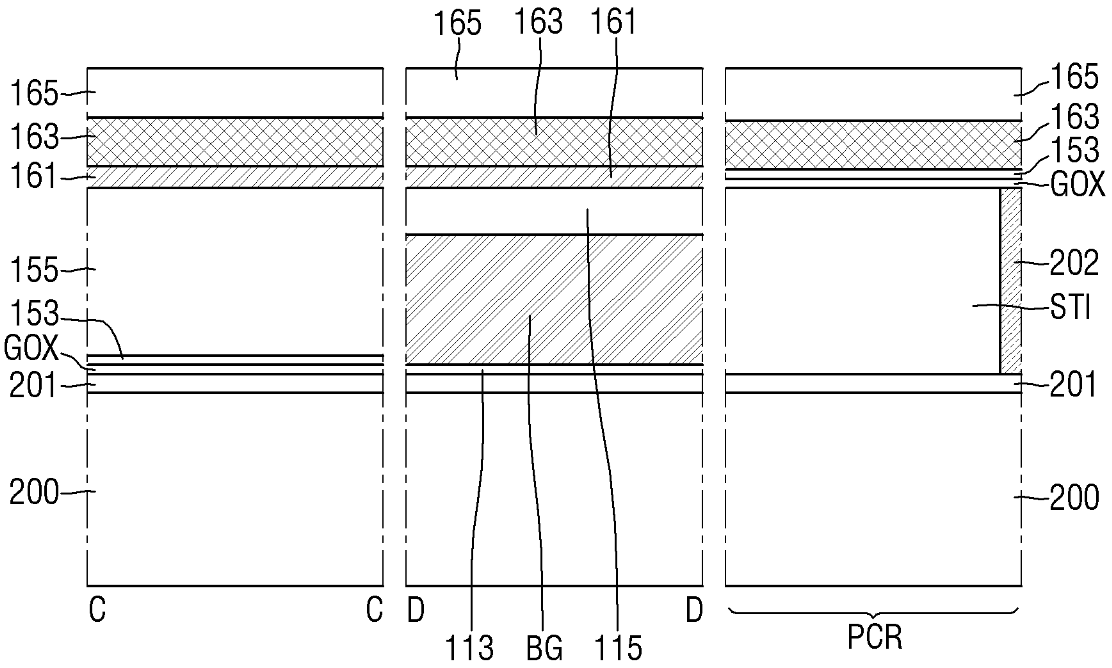

Referring to FIGS. 80 to 82, the metal pattern 163 and the bit line mask pattern 165 may be formed on the polysilicon pattern 161 of the cell array region CAR. The metal pattern 163 and the bit line mask pattern 165 may be formed on the gate isolation liner 153 of the peripheral circuit region PCR.

Figure 83:
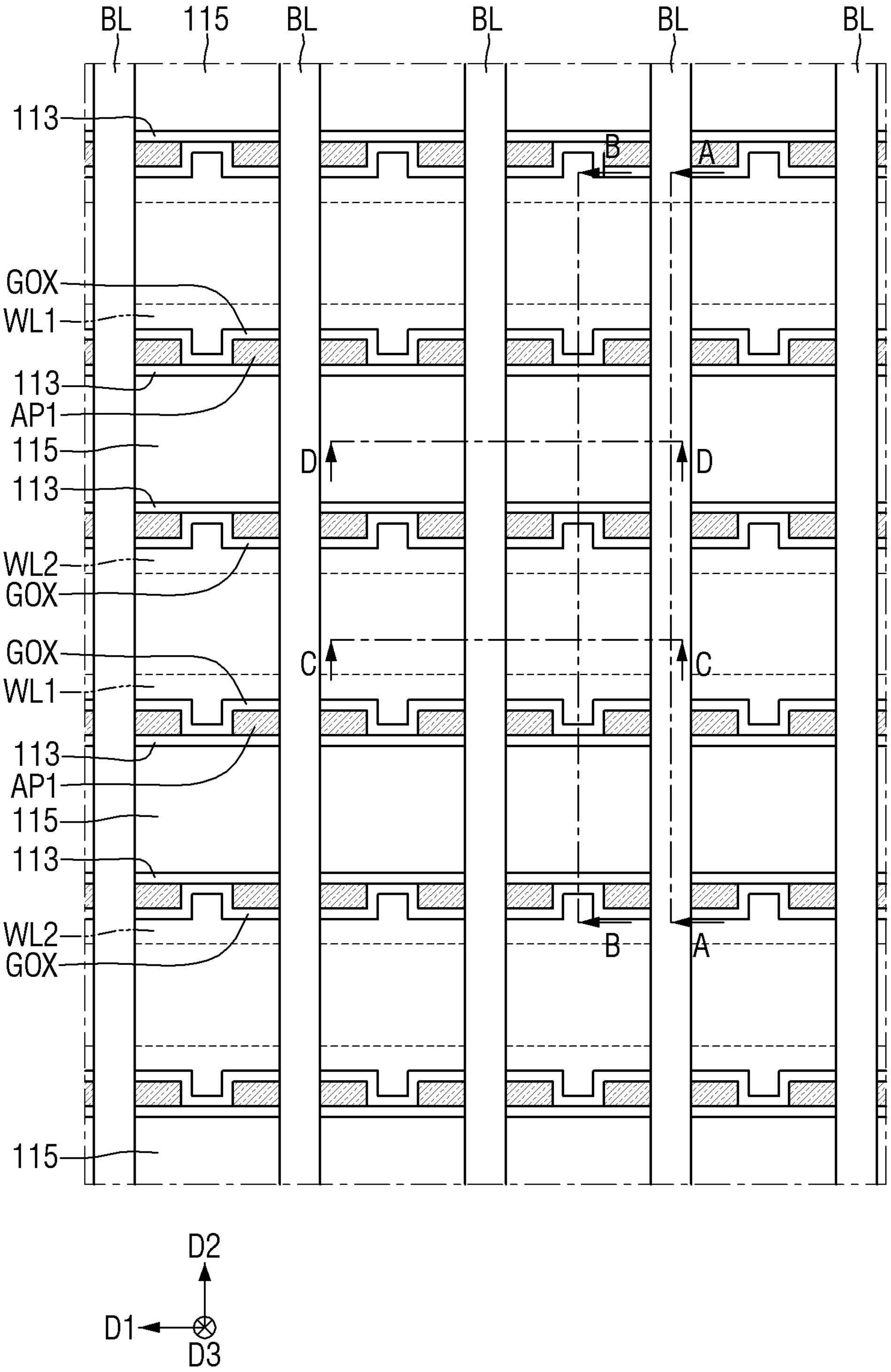
Figure 84:
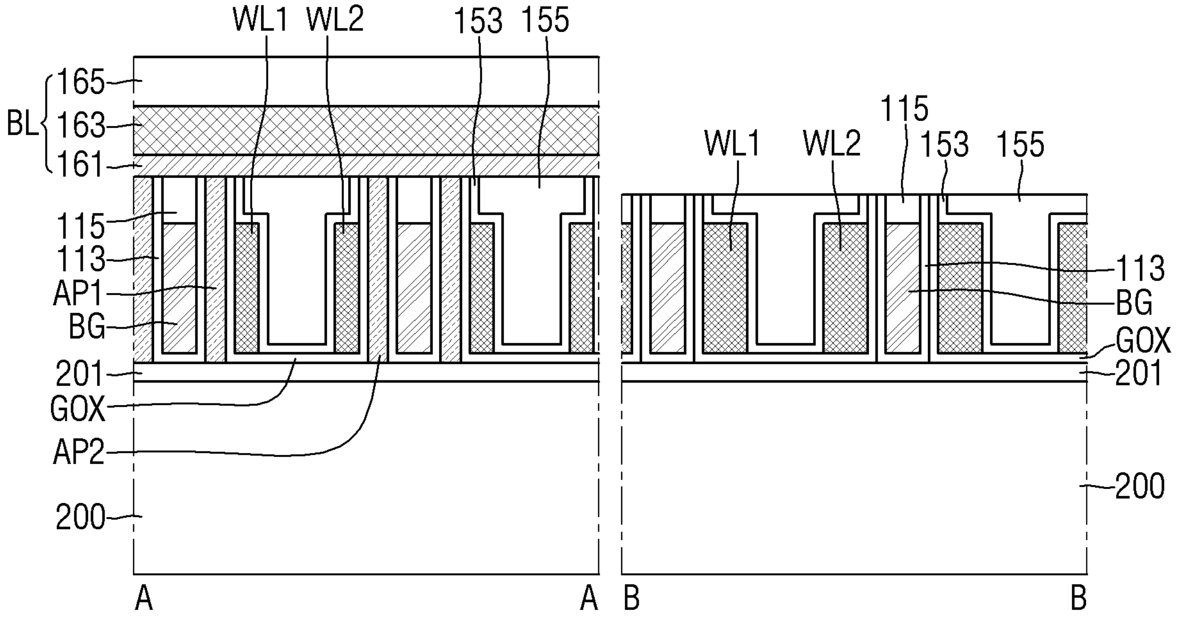
Figure 85:
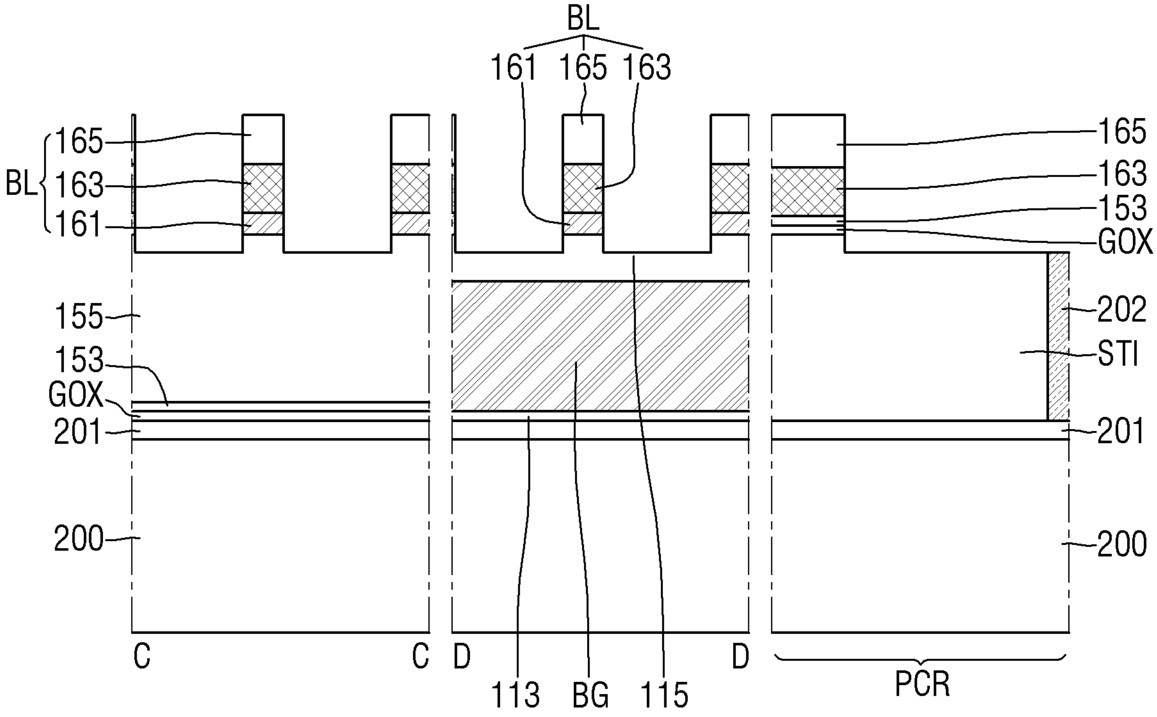

Referring to FIGS. 83 to 85, the bit lines BL extending in the second direction D2 may be formed by patterning the bit line mask pattern 165, the metal pattern 163, and the polysilicon pattern 161.

Portions of the back gate capping patterns 115 may be etched while the bit lines BL are formed. In addition, the bit line mask pattern 165, the metal pattern 163, the gate isolation liner 153, and the gate insulating pattern GOX of the peripheral circuit region PCR may be etched while the bit lines BL are formed. As a result, a portion of the element isolation film STI and the active layer 202 may be exposed.

Figure 86:
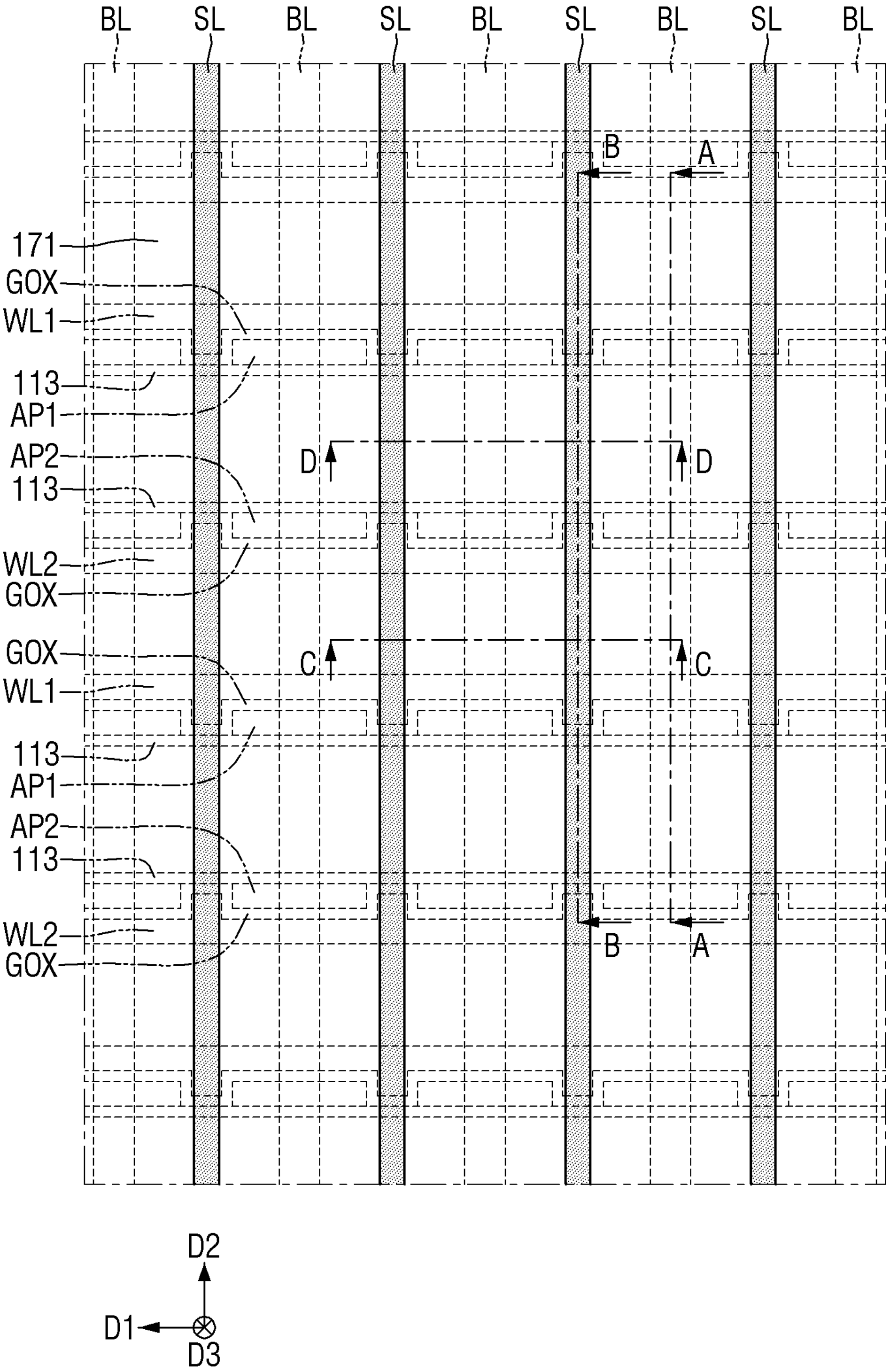
Figure 87:
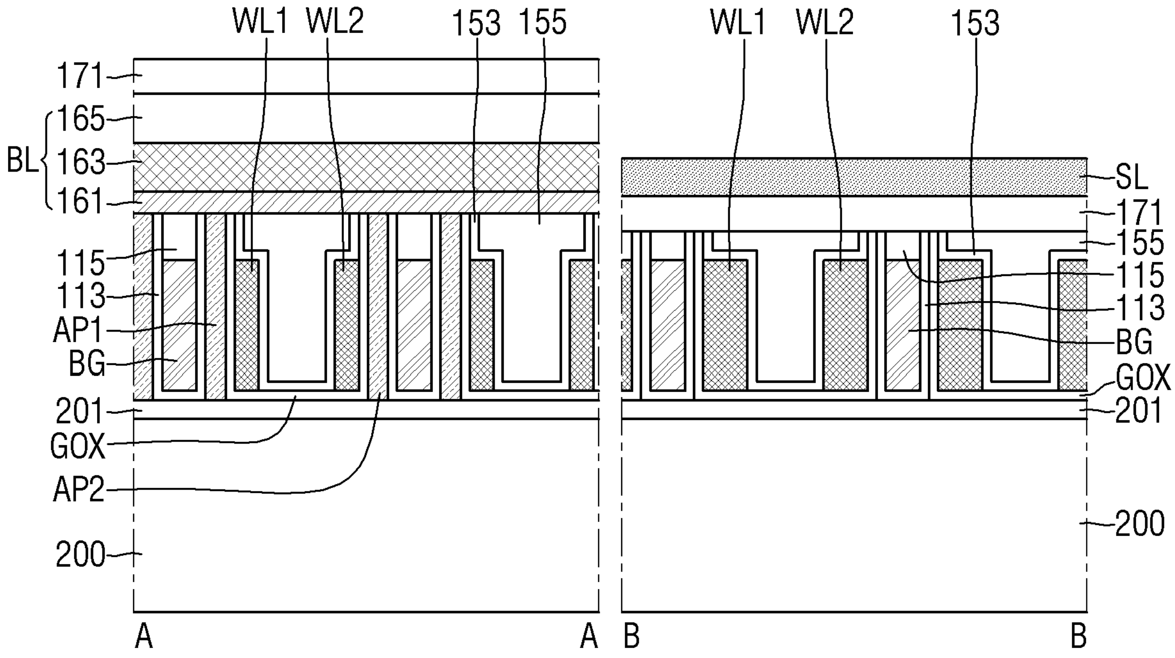
Figure 88:
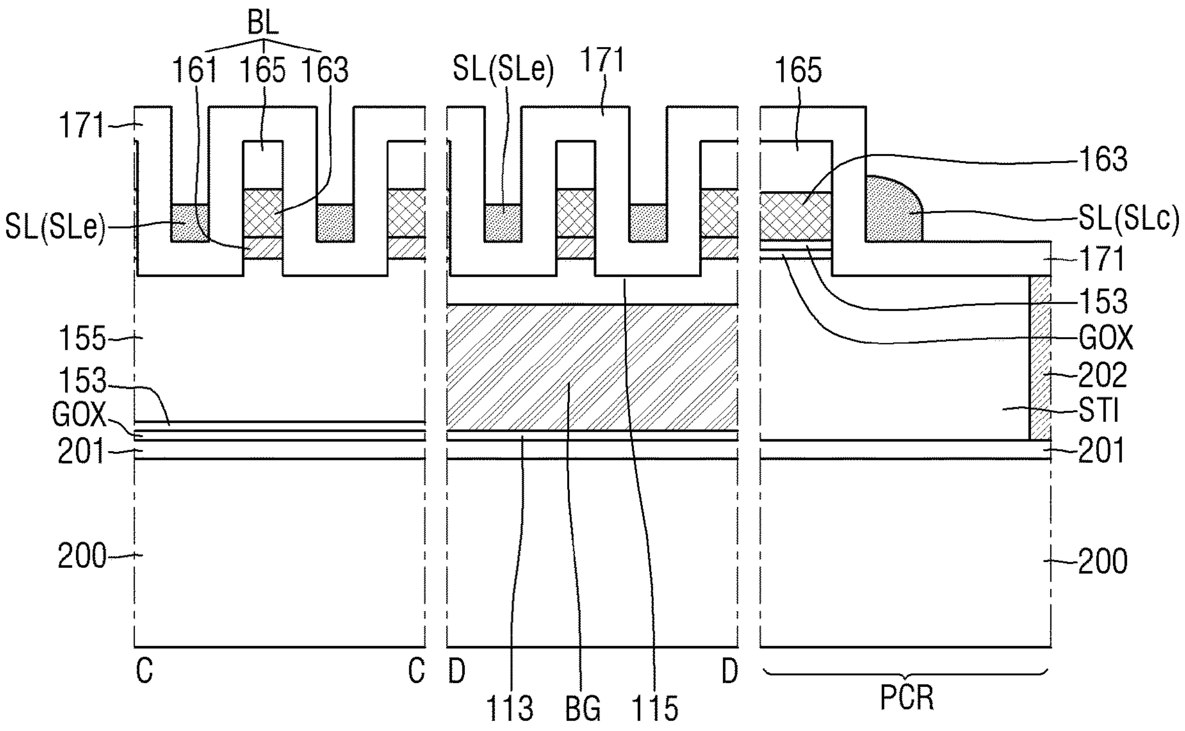

Referring to FIGS. 86 to 88, the shielding insulating liner 171 may define a shielding region between the bit lines BL. The shielding insulating liner 171 may have a substantially uniform thickness. The shielding insulating liner 171 may be formed on the entire surface of the sub-substrate 200.

A deposition thickness of the shielding insulating liner 171 may be smaller than a half of a distance between the bit lines BL spaced apart from each other. As the shielding insulating liner 171 is formed, the shielding region may be defined between the bit lines BL by the shielding insulating liner 171. The shielding region may extend in the second direction D2 in parallel with the bit lines BL.

After the shielding insulating liner 171 is formed, the shielding conductive pattern SL may be formed in the shielding region of the shielding insulating liner 171. The shielding conductive patterns SL may be formed between the bit lines BL, respectively. As an example, the forming of the shielding conductive pattern SL may include forming a shielding conductive film on the shielding insulating liner 171 so as to fill the shielding region and recessing an upper surface of the shielding conductive film. In some example embodiments, the connection portion SLc of the shielding conductive pattern may be positioned in the peripheral circuit region PCR while the shielding conductive pattern SL is formed.

Figure 89:
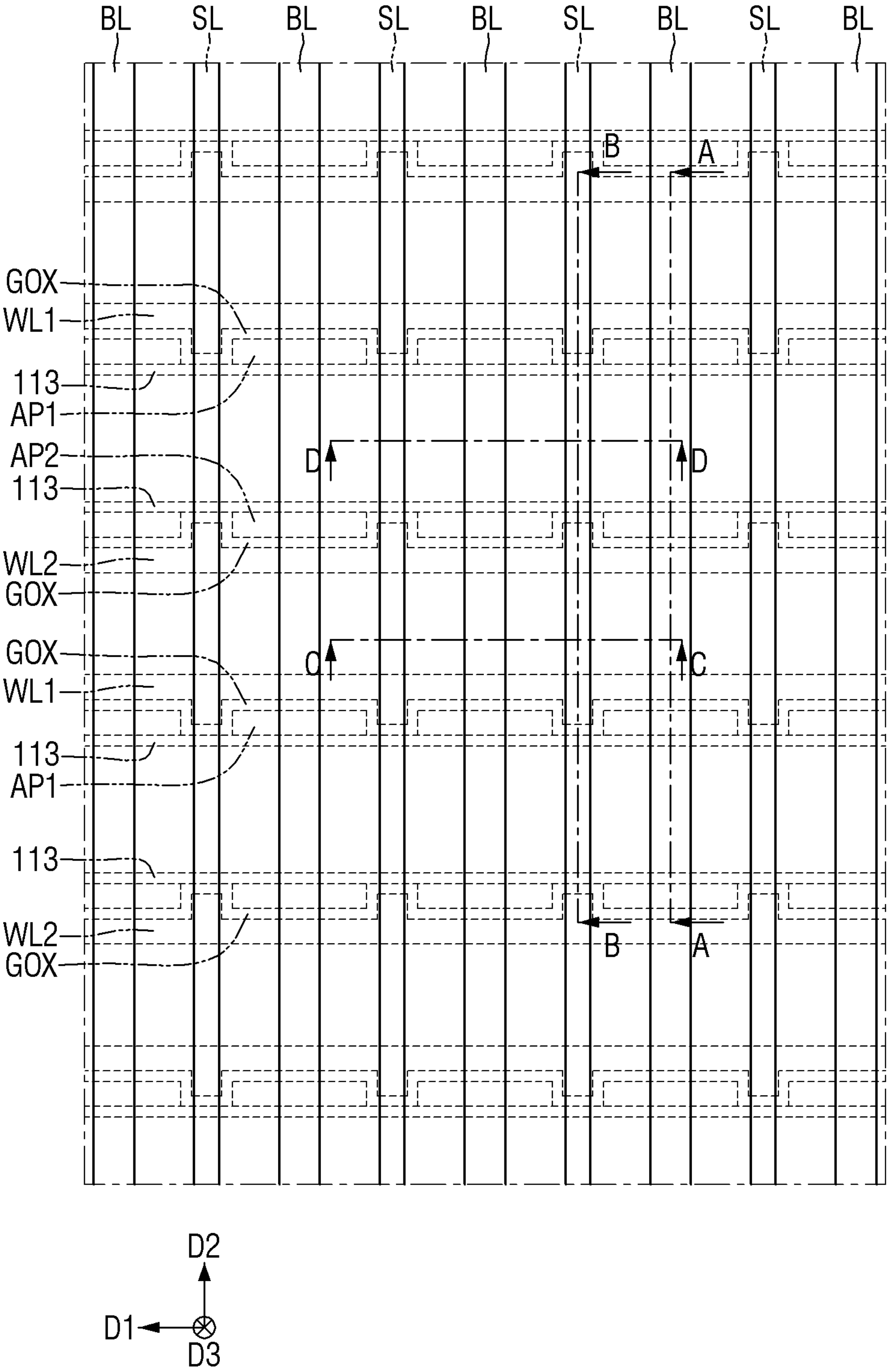
Figure 90:
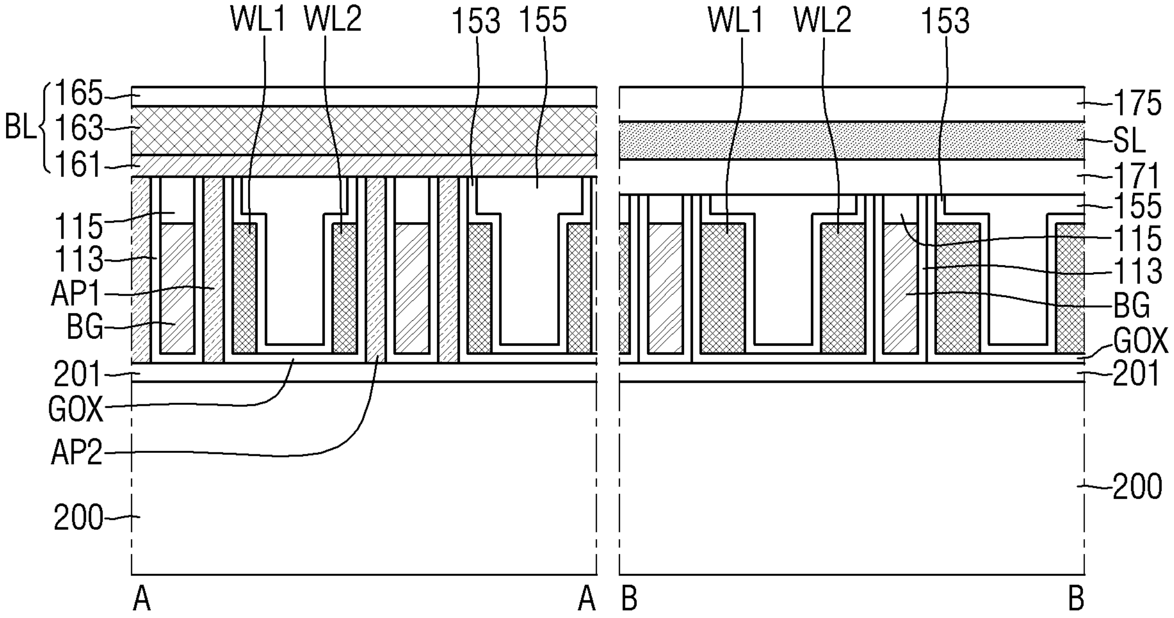

Referring to FIGS. 89 to 91, the shielding insulating capping film 175 may be formed on the shielding conductive pattern SL. In addition, the shielding insulating capping film 175 may cover the connection portion SLc of the shielding conductive pattern in the peripheral circuit region PCR.

The forming of the shielding insulating capping film 175 may include forming a shielding capping insulating film filling the shielding region in which the shielding conductive pattern SL is formed. In addition, the forming of the shielding insulating capping film 175 may include performing a planarization process on the shielding capping insulating film and the shielding insulating liner 171 so that an upper surface of the bit lines BL, that is, an upper surface of the bit line mask patterns 165 is exposed.

Although not illustrated in the drawings, the bonding insulating film 263 (see FIGS. 33 to 35) may be further formed on the shielding insulating capping film 175, the shielding insulating liner 171, and the bit line BL.

Figure 92:
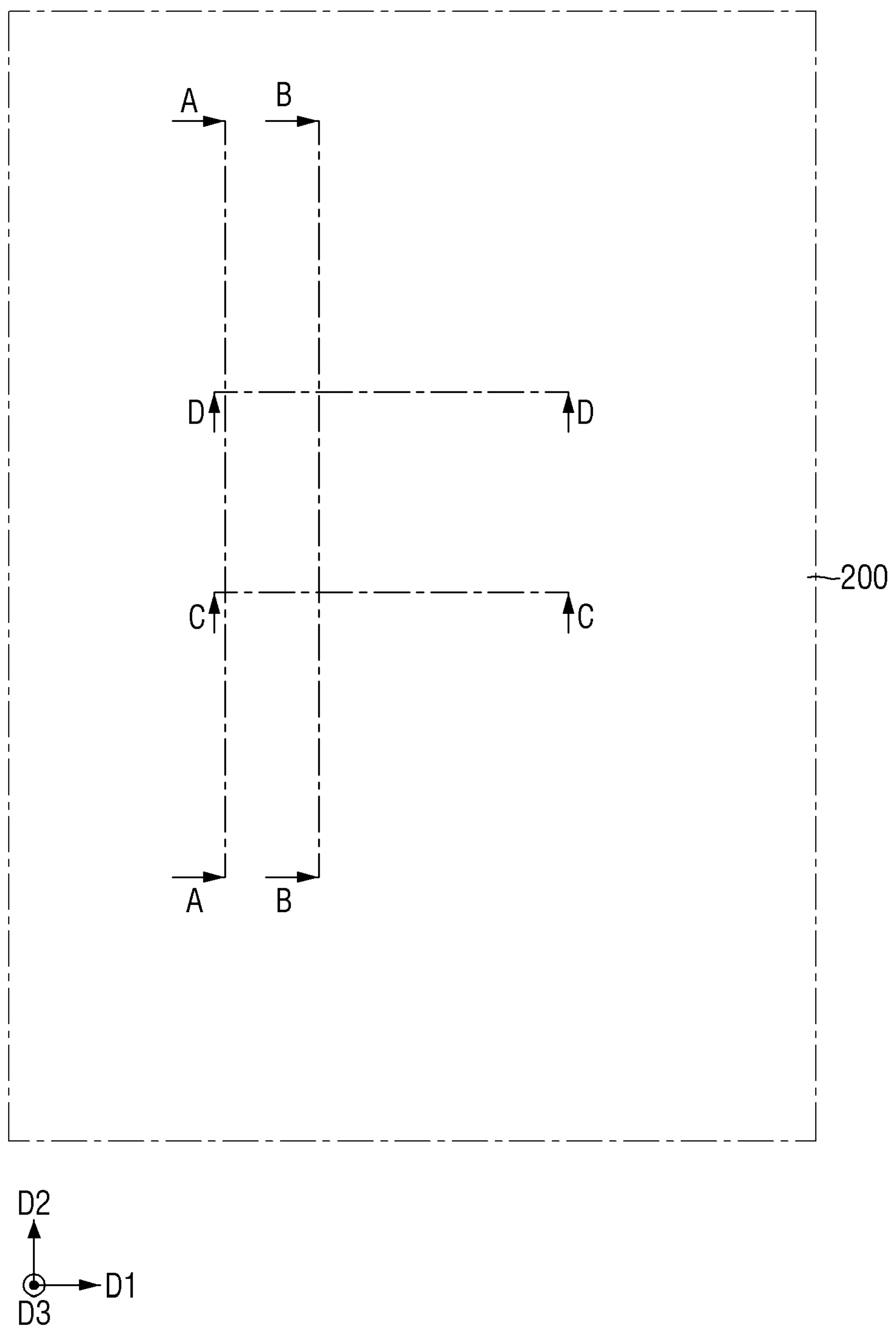
Figure 93:
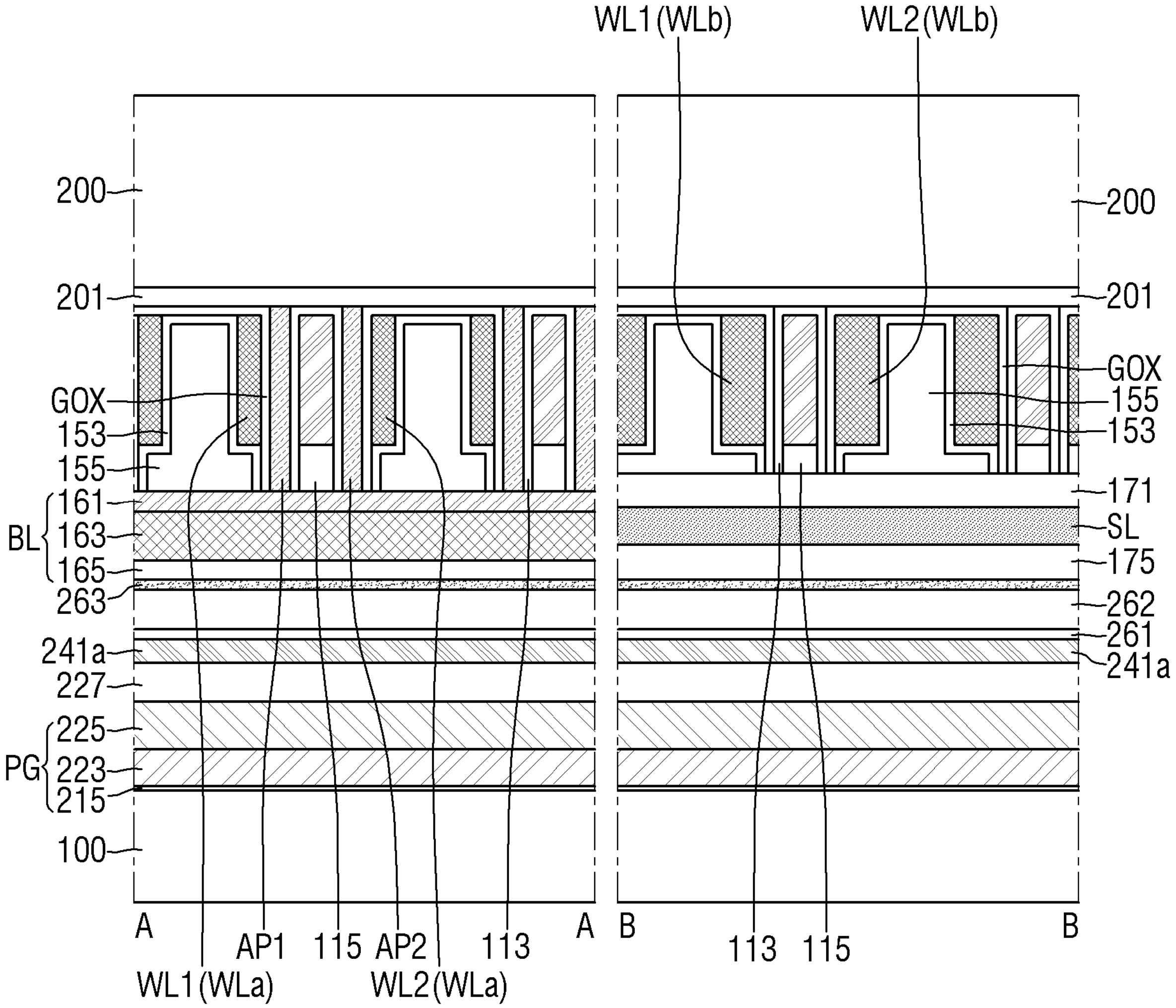
Figure 94:
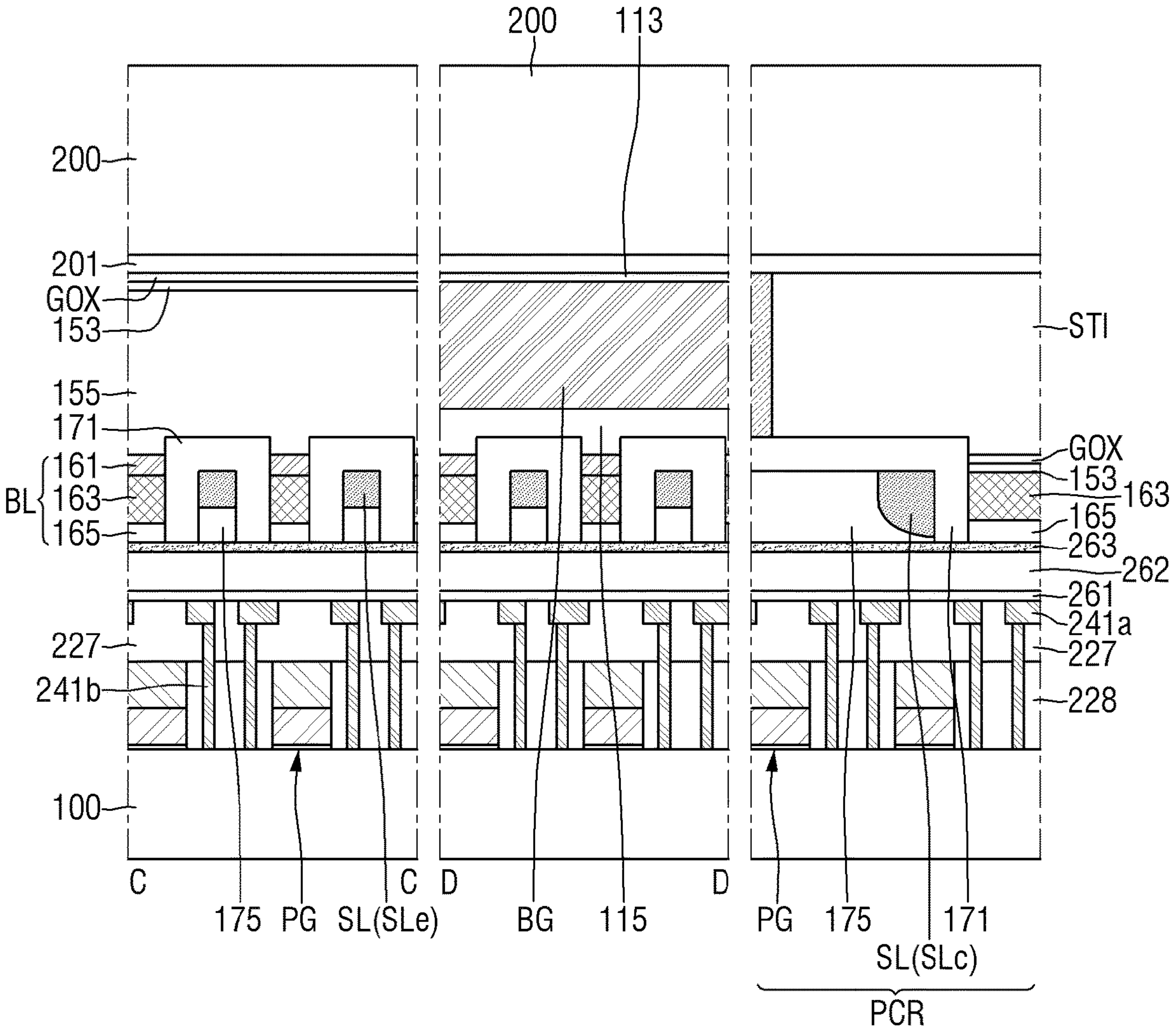

Referring to FIGS. 92 to 94, the sub-substrate 200 on which the back gate electrodes BG, the word lines WL1 and WL2, the active patterns AP1 and AP2, the bit lines BL, and the shielding conductive pattern SL are formed may be bonded to the substrate 100 on which the peripheral gate structure PG is formed. The substrate 100 and the sub-substrate 200 may be bonded to each other using the bonding insulating film 263.

Figure 95:
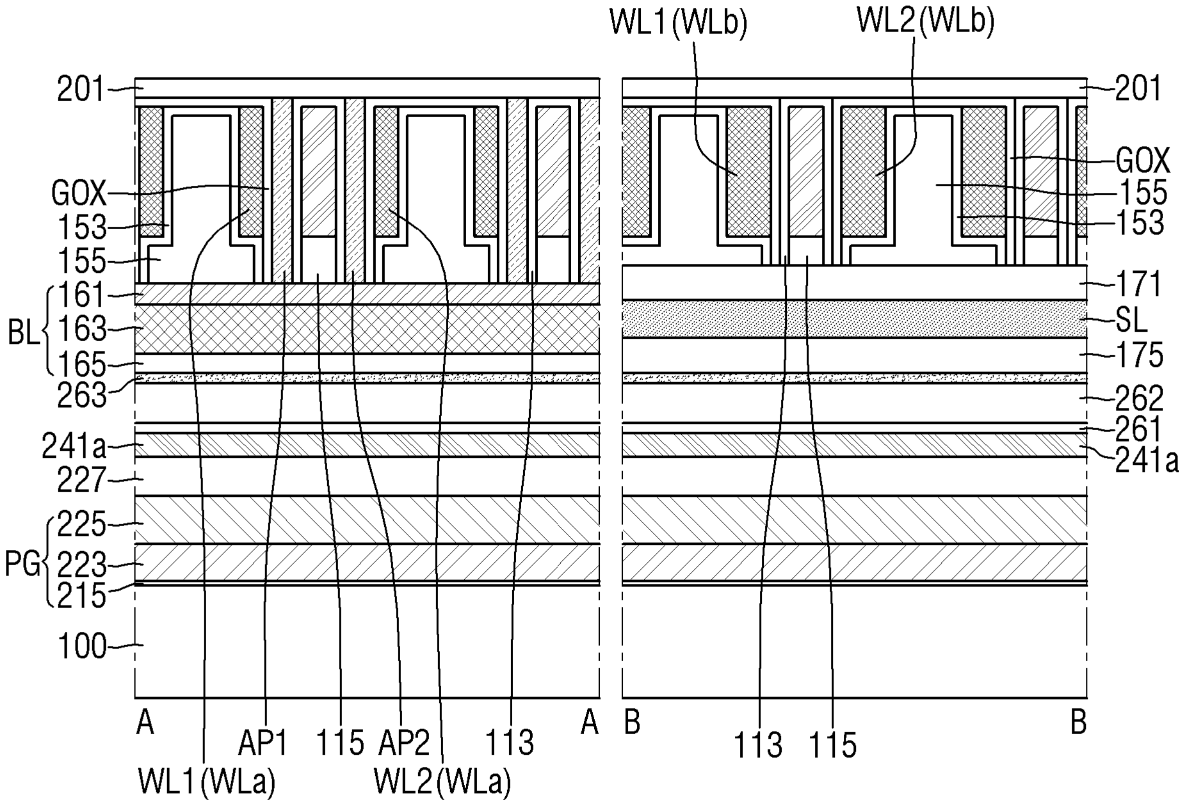
Figure 96:
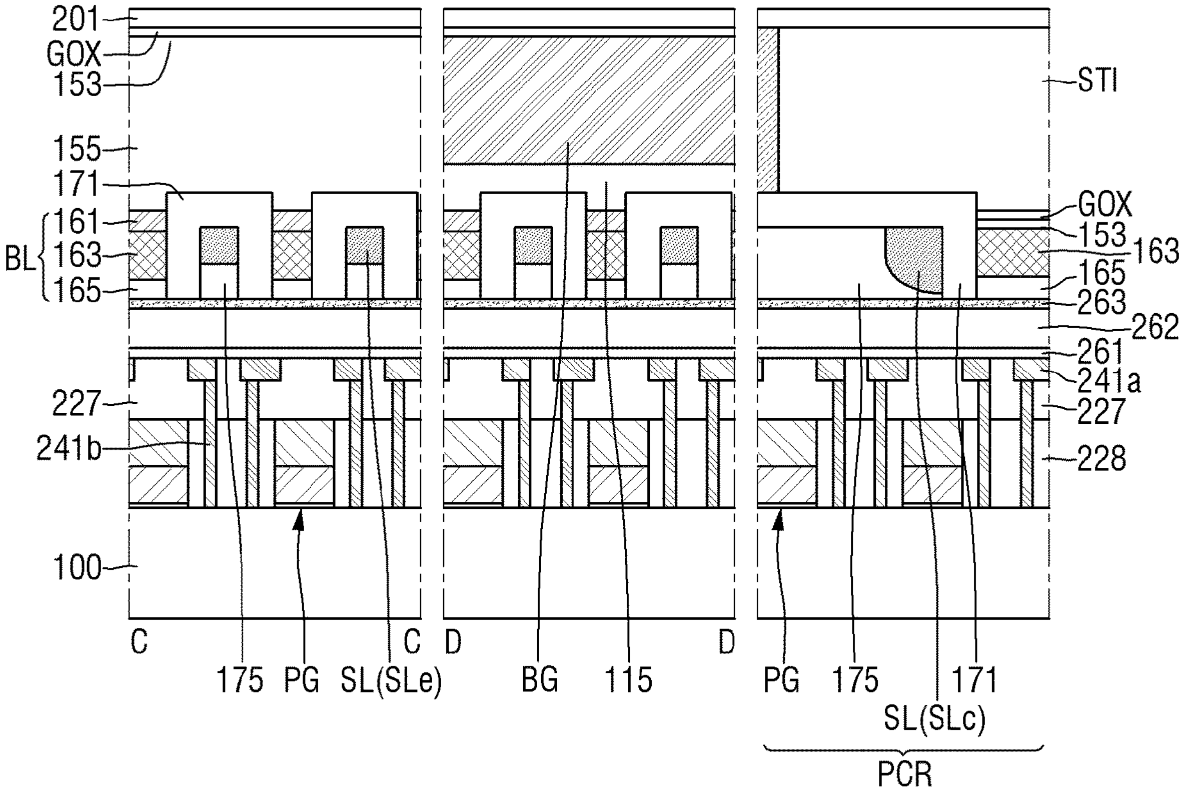

Referring to FIGS. 95 and 96, after the substrate 100 and the sub-substrate 200 are bonded to each other, a rear surface lapping process of removing the sub-substrate 200 may be performed. The removing of the sub-substrate 200 may include exposing the buried insulating layer 201 by sequentially performing a grinding process and a wet etching process.

Figure 97:
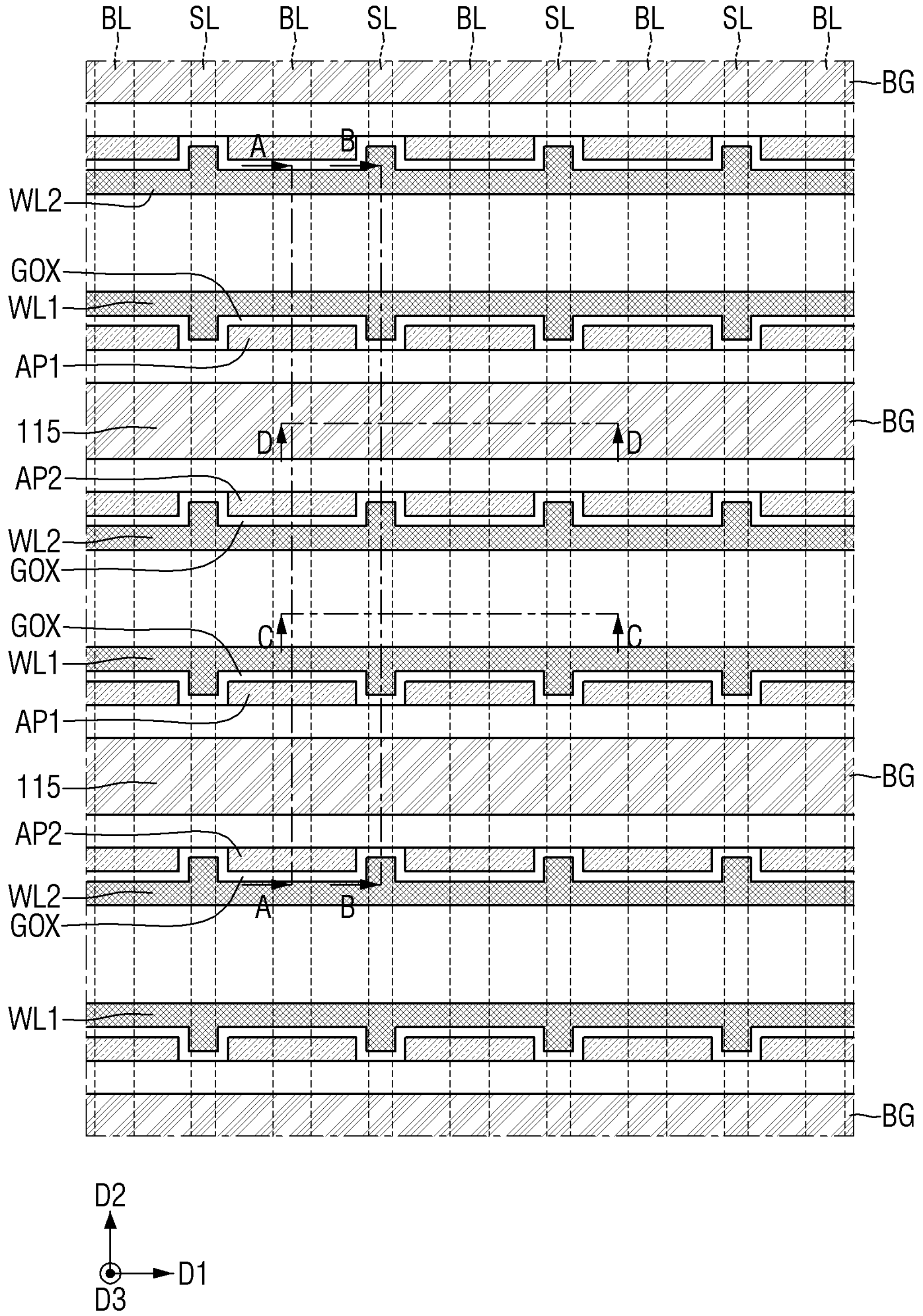
Figure 98:
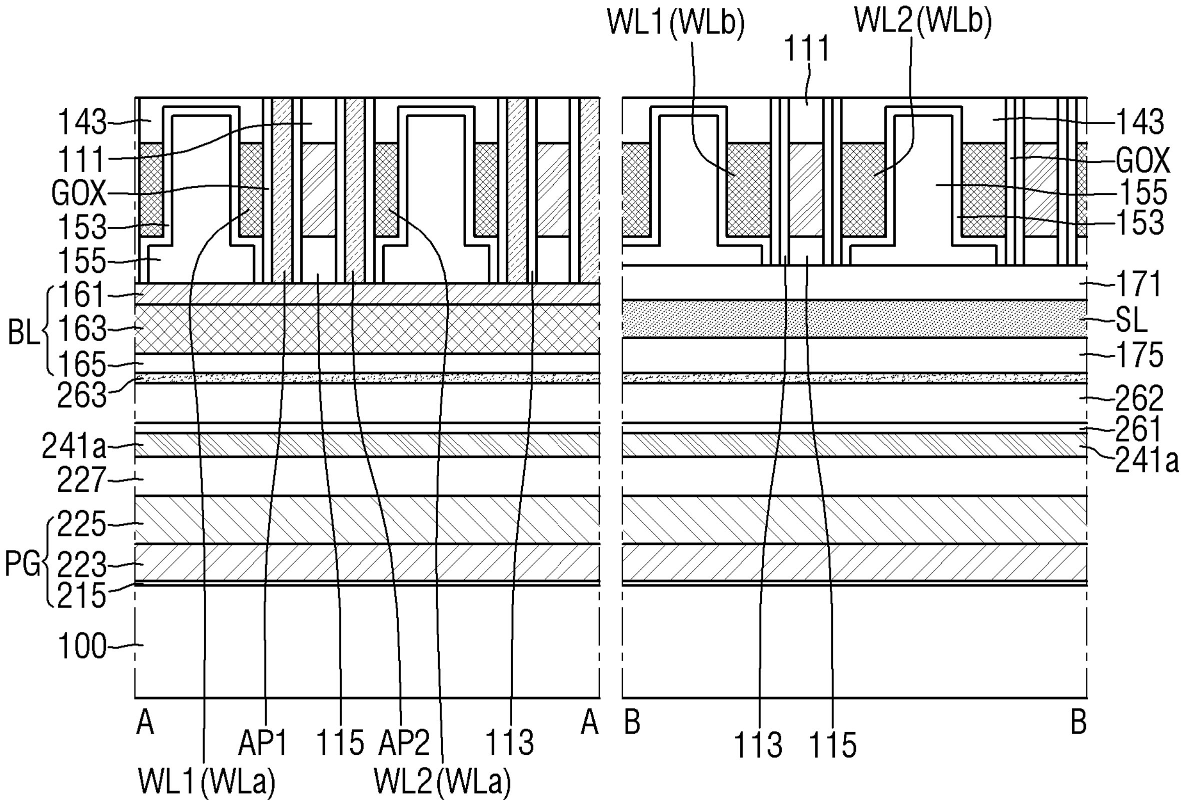
Figure 99:
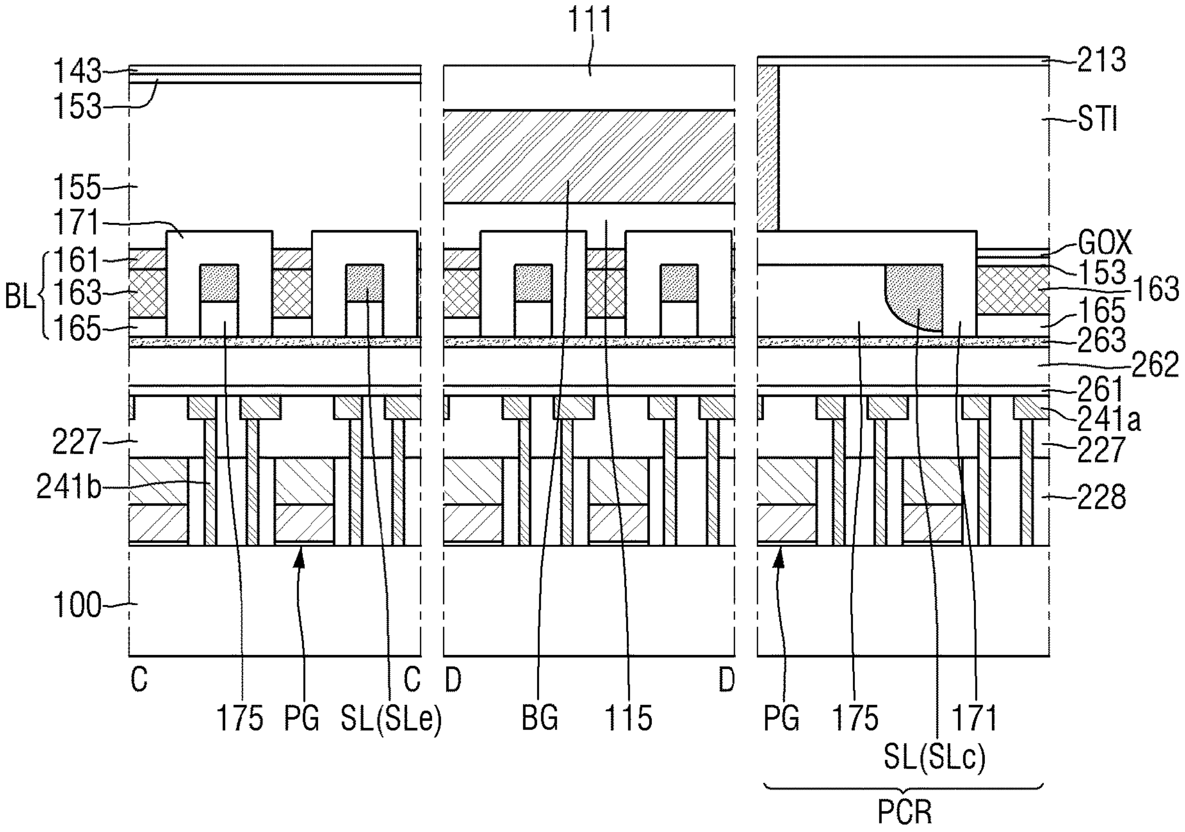

Referring to FIGS. 97 to 99, the first active pattern AP1 and the second active pattern AP2 may be exposed by removing the buried insulating layer 201. The buried insulating layer 201 is removed, such that a portion of the gate insulating pattern GOX and a portion of the back gate insulating pattern 113 may be exposed.

Subsequently, the exposed gate insulating pattern GOX and the exposed back gate insulating pattern 113 may be removed. As a result, the back gate electrode BG, the first word line WL1, and the second word line WL2 may be exposed.

Subsequently, a portion of the back gate electrode BG, a portion of the first word line WL1, and a portion of the second word line WL2 may be removed by performing an etch-back process.

Subsequently, the back gate isolation pattern 111 may be formed on the recessed back gate electrode BG. In addition, the gate capping pattern 143 may be formed on the recessed first and second word lines WL1 and WL2. The back gate isolation pattern 111 and the gate capping pattern 143 may be simultaneously formed.

In the peripheral circuit region PCR, an insertion insulating film 213 may be formed on the element isolation film STI and the active layer 202. As an example, the insertion insulating film 213 may be a portion remaining after removing the buried insulating layer 201. As another example, after the back gate isolation pattern 111 and the gate capping pattern 143 are formed, insertion insulating film 213 exposing the cell array region CAR may be formed.

Figure 100:
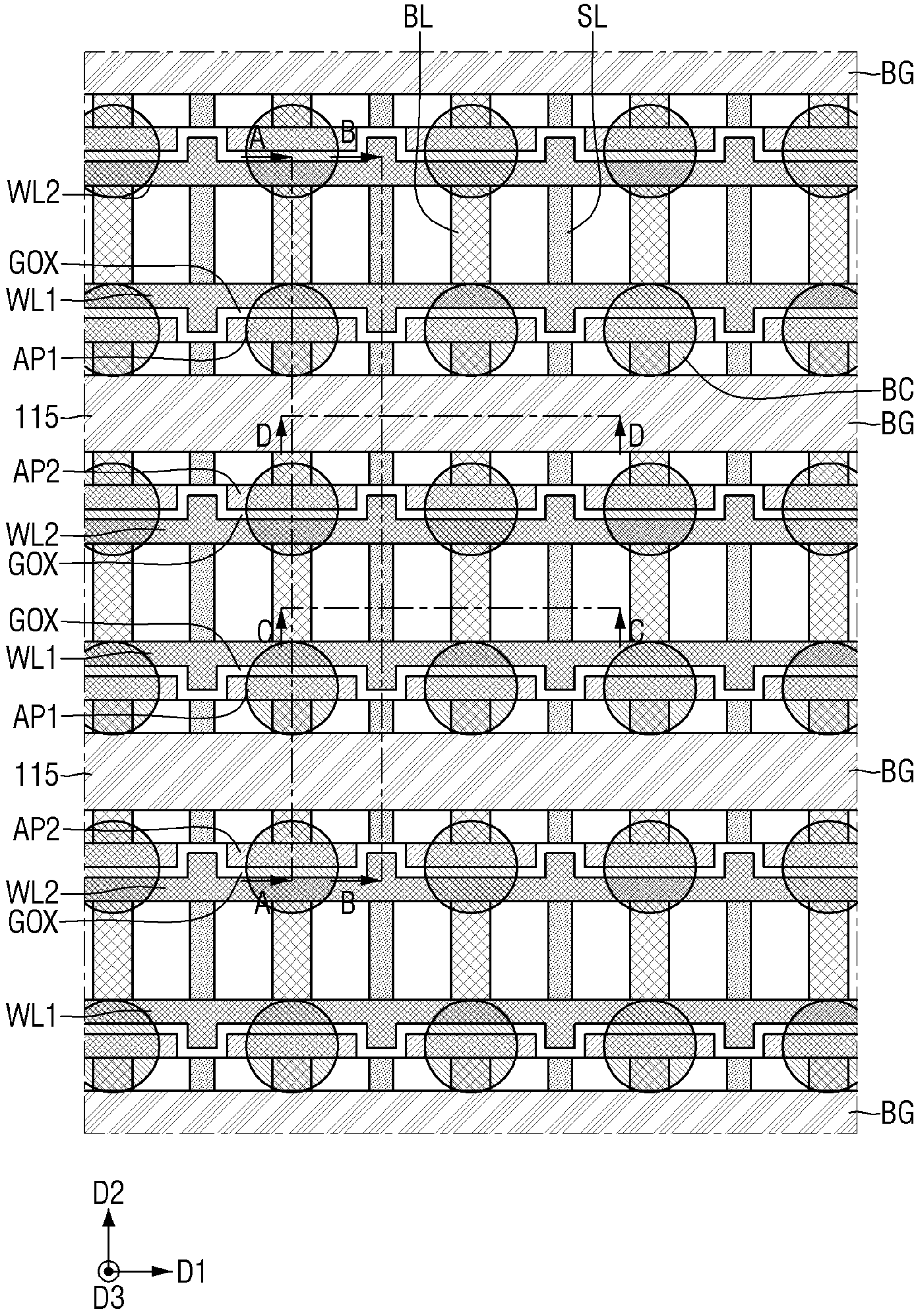
Figure 101:
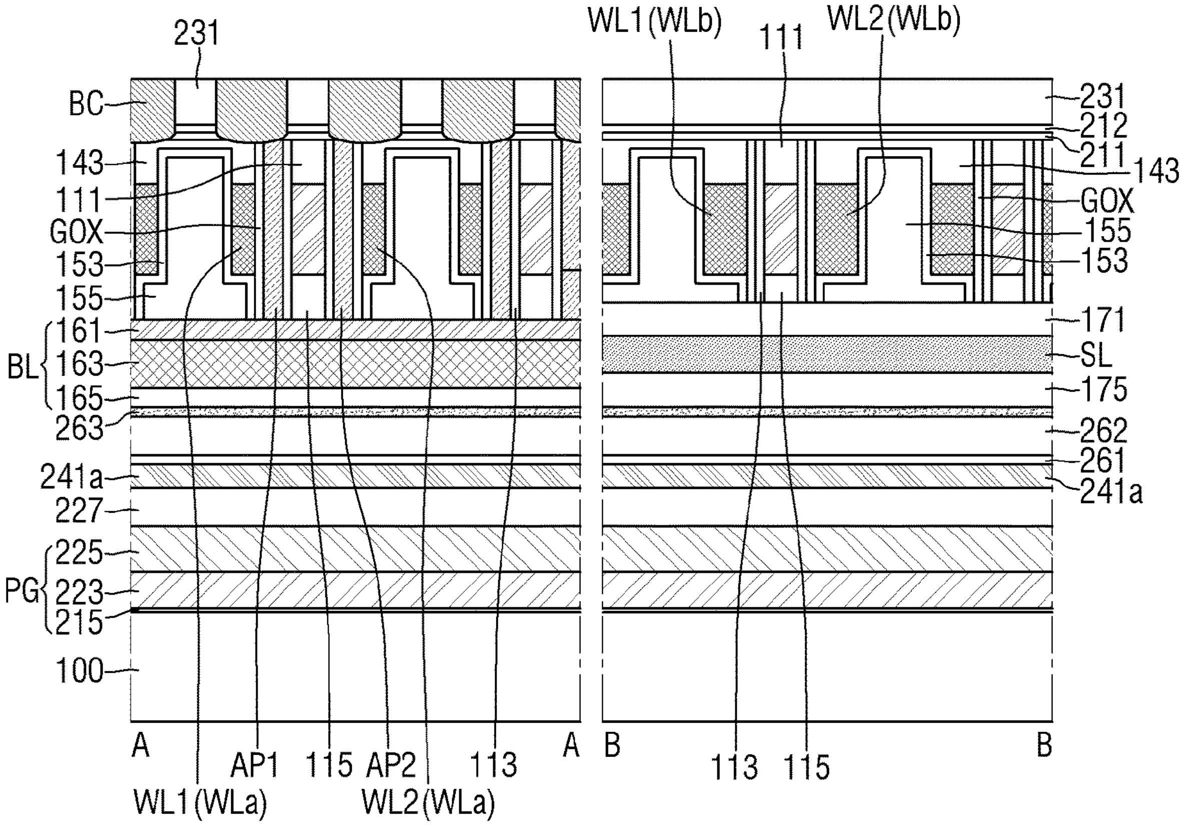
Figure 102:
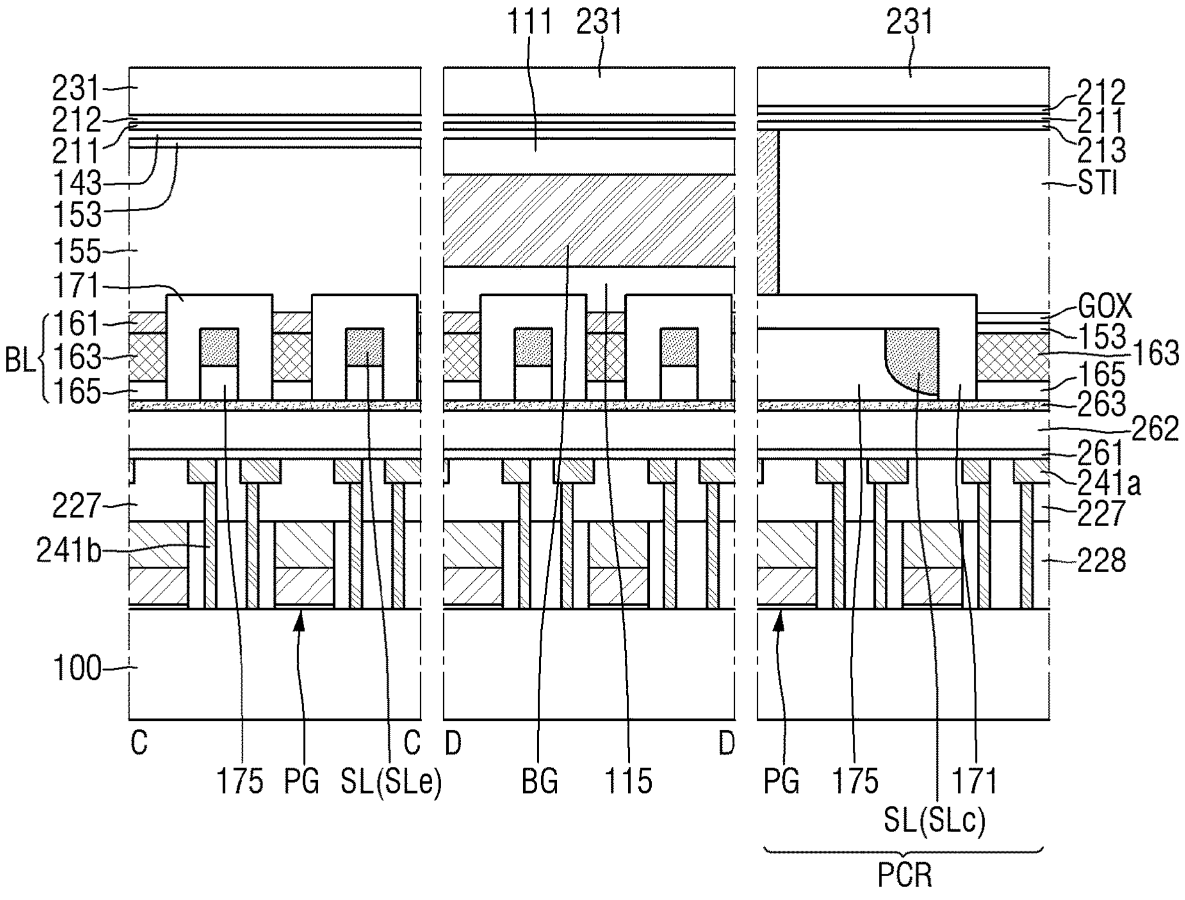

Referring to FIGS. 100 to 102, the lower contact etch stop film 211, the upper contact etch stop film 212, and the contact interlayer insulating film 231 may be sequentially formed on the entire surface of the substrate 100.

Subsequently, contact holes exposing the first active pattern AP1 and the second active pattern AP2 may be formed in the lower contact etch stop film 211, the upper contact etch stop film 212, and the contact interlayer insulating film 231. The contact patterns BC may be formed in the contact holes. The contact patterns BC may be formed on the first active pattern AP1 and the second active pattern AP2. The contact patterns BC may be connected to the first active pattern AP1 and the second active pattern AP2.

Unlike illustrated in the drawings, a contact film in contact with the first active pattern AP1 and the second active pattern AP2 may be formed on the entire surface of the substrate 100. Subsequently, the contact patterns BC may be formed by patterning the contact film. The contact isolation pattern 232 (see FIG. 15) may be formed between the contact patterns BC spaced apart from each other.

Referring to FIG. 103, lower peripheral contact plug holes may be formed in the peripheral circuit region PCR. The lower peripheral contact plug holes may expose the metal pattern 163 disposed at the end of the bit line BL, the connection portion SLc of the shielding conductive pattern, and the peripheral wiring line 241*a*. The lower peripheral contact plug holes may be formed to penetrate through the element isolation film STI. Subsequently, in FIGS. 3 and 4, the lower peripheral contact plugs LPLGa, LPLGb, and LPLGc may be formed in the lower peripheral contact plug holes. Subsequently, the data storage patterns DSP may be formed on the contact patterns BC.

By way of summation and review, aspects of the present disclosure provide a semiconductor memory device of which a degree of integration and electrical characteristics are improved. Aspects of the present disclosure also provide a method for fabricating a semiconductor memory device of which a degree of integration and electrical characteristics are improved. That is, the semiconductor memory device according to embodiments has a structure in which one word line is disposed on one channel pattern, and a single crystal silicon pattern is used as a channel region.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:

a peripheral gate structure on a substrate;

a bit line on the peripheral gate structure and extending in a first direction;

a shielding structure adjacent to the bit line on the peripheral gate structure and extending in the first direction;

a first word line on the bit line and the shielding structure and extending in a second direction;

a second word line on the bit line and the shielding structure, extending in the second direction, and spaced apart from the first word line in the first direction;

first and second active patterns on the bit line, the first and second active patterns being between the first and second word lines; and contact patterns connected to the first and second active patterns.

2. The semiconductor memory device as claimed in claim 1, wherein the first word line includes first portions and second portions alternately disposed in the second direction, a width of each of the first portions of the first word line in the first direction being smaller than a width of each of the second portions of the first word line in the first direction.

3. The semiconductor memory device as claimed in claim 2, wherein:

the first active pattern is more adjacent to the first word line than to the second word line, and the first active pattern is between adjacent ones of the second portions of the first word line in the second direction.

4. The semiconductor memory device as claimed in claim 1, further comprising a back gate electrode on the bit line and the shielding structure and extending in the second direction between the first and second active patterns.

5. The semiconductor memory device as claimed in claim 4, wherein:

the back gate electrode includes a first surface and a second surface opposite to each other in a third direction, the first surface of the back gate electrode is closer to the bit line than the second surface of the back gate electrode is, and the first surface of the back gate electrode has a concave curved surface or is a flat surface.

6. The semiconductor memory device as claimed in claim 1, wherein the shielding structure includes a shielding conductive pattern and a shielding insulating film surrounding the shielding conductive pattern.

7. The semiconductor memory device as claimed in claim 6, wherein:

the bit line includes a long sidewall extending in the first direction and a short sidewall extending in the second direction, the shielding conductive pattern includes an extension portion extending along the long sidewall of the bit line and a connection portion extending along the short sidewall of the bit line, and the extension portion of the shielding conductive pattern is directly connected to the connection portion of the shielding conductive pattern.

8. The semiconductor memory device as claimed in claim 6, wherein the bit line includes a conductive bit line, a height of the shielding conductive pattern in a third direction being different from a height of the conductive bit line in the third direction.

9. The semiconductor memory device as claimed in claim 1, wherein the first and second active patterns are made of a single crystal semiconductor material.

10. The semiconductor memory device as claimed in claim 1, wherein a width of the bit line in the second direction is smaller than a length of each of the first and second active patterns in the second direction.

11. The semiconductor memory device as claimed in claim 1, further comprising insertion semiconductor patterns between the bit line and each of the first and second active patterns, the insertion semiconductor patterns including a semiconductor material different from that of the first and second active patterns.

12. A semiconductor memory device, comprising:

a peripheral gate structure on a substrate;

a bit line on the peripheral gate structure and extending in a first direction;

a shielding conductive pattern adjacent to the bit line on the peripheral gate structure and extending in the first direction;

an active pattern on the bit line and including a first sidewall and a second sidewall opposite to each other in the first direction, and a first surface and a second surface opposite to each other in a vertical direction, the first surface of the active pattern being connected to the bit line;

a word line on the first sidewall of the active pattern and extending in a second direction; and a contact pattern on the active pattern and connected to the second surface of the active pattern, wherein:

the bit line includes a long sidewall extending in the first direction and a short sidewall extending in the second direction, the shielding conductive pattern includes an extension portion extending along the long sidewall of the bit line and a connection portion extending along the short sidewall of the bit line, and in at least a portion of the connection portion of the shielding conductive pattern, a width of the shielding conductive pattern in the first direction increases as the shielding conductive pattern becomes distant from the substrate.

13. The semiconductor memory device as claimed in claim 12, wherein the word line includes first and second portions alternately disposed in the second direction, a width of the first portion of the word line in the first direction being smaller than a width of the second portion of the word line in the first direction.

14. The semiconductor memory device as claimed in claim 13, wherein the active pattern is between adjacent ones of the second portions of the word line.

15. The semiconductor memory device as claimed in claim 12, further comprising a back gate electrode on the second sidewall of the active pattern and extending in the second direction, the active pattern being between the back gate electrode and the word line.

16. The semiconductor memory device as claimed in claim 12, further comprising a gate isolation pattern on the bit line, wherein:

the word line is between the gate isolation pattern and the active pattern, the gate isolation pattern includes a horizontal part and a protrusion part protruding from the horizontal part in the vertical direction, a width of the horizontal part of the gate isolation pattern in the first direction is greater than a width of the protrusion part of the gate isolation pattern in the first direction, and the horizontal part of the gate isolation pattern is closer to the bit line than the protrusion part of the gate isolation pattern is.

17. The semiconductor memory device as claimed in claim 16, wherein the word line is on the horizontal part of the gate isolation pattern.

18. A semiconductor memory device, comprising:

a peripheral gate structure on a substrate, the substrate including a cell array region and a peripheral circuit region, and a portion of the peripheral gate structure being on the cell array region of the substrate;

bit lines on the peripheral gate structure and extending in a first direction;

a shielding conductive pattern between the bit lines adjacent to each other in a second direction on the peripheral gate structure;

first and second active patterns alternately disposed along the first direction on the bit lines;

back gate electrodes on the bit lines and the shielding conductive pattern and extending in the second direction between the first and second active patterns adjacent to each other;

first word lines adjacent to the first active patterns, respectively, and extending in the second direction;

second word lines adjacent to the second active patterns, respectively, and extending in the second direction;

contact patterns connected to the first and second active patterns, respectively; and data storage patterns connected to the contact patterns.

19. The semiconductor memory device as claimed in claim 18, wherein:

each of the bit lines includes a long sidewall extending in the first direction and a short sidewall extending in the second direction, the shielding conductive pattern includes an extension portion extending along the long sidewall of each of the bit lines and a connection portion extending along the short sidewall of each of the bit lines, and the extension portion of the shielding conductive pattern is directly connected to the connection portion of the shielding conductive pattern.

20. The semiconductor memory device as claimed in claim 18, further comprising a gate isolation pattern on the bit lines and between the first and second word lines adjacent to each other in the first direction, wherein:

the gate isolation pattern includes a horizontal part and a protrusion part protruding from the horizontal part in a vertical direction, a width of the horizontal part of the gate isolation pattern in the first direction is greater than a width of the protrusion part of the gate isolation pattern in the first direction, the horizontal part of the gate isolation pattern is closer to the bit lines than the protrusion part of the gate isolation pattern is, and the first and second word lines are disposed on the horizontal part of the gate isolation pattern.

* * * * *